(12) United States Patent
Titus et al.

(10) Patent No.: US 11,515,250 B2
(45) Date of Patent: Nov. 29, 2022

(54) THREE DIMENSIONAL SEMICONDUCTOR DEVICE CONTAINING COMPOSITE CONTACT VIA STRUCTURES AND METHODS OF MAKING THE SAME

(71) Applicant: SANDISK TECHNOLOGIES LLC, Addison, TX (US)

(72) Inventors: Monica Titus, Santa Clara, CA (US); Ramy Nashed Bassely Said, San Jose, CA (US); Rahul Sharangpani, Fremont, CA (US); Senaka Kanakamedala, San Jose, CA (US); Raghuveer S. Makala, Campbell, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 122 days.

(21) Appl. No.: 17/166,393

(22) Filed: Feb. 3, 2021

(65) Prior Publication Data
US 2022/0246517 A1 Aug. 4, 2022

(51) Int. Cl.
*H01L 23/522* (2006.01)
*H01L 23/528* (2006.01)
(Continued)

(52) U.S. Cl.
CPC .... *H01L 23/5226* (2013.01); *H01L 21/76802* (2013.01); *H01L 21/76877* (2013.01);
(Continued)

(58) Field of Classification Search
CPC .......... H01L 23/5226; H01L 21/76802; H01L 21/76877; H01L 21/76889; H01L 23/5283;
(Continued)

(56) References Cited

U.S. PATENT DOCUMENTS 5,915,167 A 6/1999 Leedy
9,397,046 B1 7/2016 Sharangpani et al.
(Continued)

OTHER PUBLICATIONS

"Common bond energies," http://www.wiredchemist.com/chemistry/data/bond_energies_lengths.html Visited Feb. 3, 2021.
(Continued)

*Primary Examiner* — Karen Kusumakar
(74) *Attorney, Agent, or Firm* — The Marbury Law Group PLLC

(57) ABSTRACT

A semiconductor structure includes at least one first semiconductor device located on a substrate, lower-level dielectric material layers embedding lower-level metal interconnect structures, at least one second semiconductor device and a dielectric material portion that overlie the lower-level dielectric material layers, at least one upper-level dielectric material layer, and an interconnection via structure vertically extending from the at least one upper-level dielectric material layer to a conductive structure that can be a node of the at least one first semiconductor device or one of lower-level metal interconnect structures. The interconnection via structure includes a transition metal layer and a fluorine-doped filler material portion in contact with the transition metal layer, composed primarily of a filler material selected from a silicide of the transition metal element or aluminum oxide, and including fluorine atoms.

20 Claims, 51 Drawing Sheets

(51) Int. Cl.
  *H01L 23/532* (2006.01)
  *H01L 21/768* (2006.01)
  *H01L 27/11582* (2017.01)
  *H01L 27/11556* (2017.01)

(52) U.S. Cl.
  CPC .... *H01L 21/76889* (2013.01); *H01L 23/5283* (2013.01); *H01L 23/53257* (2013.01); *H01L 27/11556* (2013.01); *H01L 27/11582* (2013.01)

(58) Field of Classification Search
  CPC ......... H01L 23/53257; H01L 27/11556; H01L 27/11582
  See application file for complete search history.

(56) References Cited

U.S. PATENT DOCUMENTS

| | | |
|---|---|---|
| 9,698,152 B2 | 7/2017 | Peri et al. |
| 9,748,174 B1 | 8/2017 | Amano |
| 9,793,139 B2 | 10/2017 | Sharangpani et al. |
| 9,799,671 B2 | 10/2017 | Pachamuthu et al. |
| 10,229,931 B1 | 3/2019 | Hinoue et al. |
| 10,290,652 B1 | 5/2019 | Sharangpani et al. |
| 10,319,635 B2 | 6/2019 | Nosho et al. |
| 10,361,213 B2 | 7/2019 | Sharangpani et al. |
| 10,529,620 B2 | 1/2020 | Sharangpani et al. |
| 10,707,233 B1 | 7/2020 | Cui et al. |
| 10,818,542 B2 | 10/2020 | Cui et al. |
| 2002/0028541 A1 | 3/2002 | Lee et al. |
| 2003/0111670 A1 | 6/2003 | Misra et al. |
| 2004/0043550 A1 | 3/2004 | Chakihara et al. |
| 2004/0164326 A1 | 8/2004 | Atwood et al. |
| 2005/0062097 A1 | 3/2005 | Misra et al. |
| 2005/0245024 A1 | 11/2005 | Von Schwerin |
| 2007/0158736 A1 | 7/2007 | Arai et al. |
| 2012/0161094 A1 | 6/2012 | Huo et al. |
| 2014/0239244 A1 | 8/2014 | Pellizzer et al. |
| 2015/0303202 A1 | 10/2015 | Sun et al. |
| 2016/0268209 A1 | 9/2016 | Pachamuthu et al. |
| 2016/0300848 A1 | 10/2016 | Pachamuthu et al. |
| 2016/0358933 A1 | 12/2016 | Rabkin et al. |
| 2017/0125538 A1 | 5/2017 | Sharangpani et al. |
| 2017/0179154 A1* | 6/2017 | Furihata ............ H01L 27/11575 |
| 2017/0373079 A1 | 12/2017 | Sharangpani et al. |
| 2018/0090373 A1 | 3/2018 | Sharangpani et al. |
| 2018/0151497 A1 | 5/2018 | Makala et al. |
| 2018/0151588 A1 | 5/2018 | Tsutsumi et al. |
| 2018/0315769 A1 | 11/2018 | Huo et al. |
| 2018/0331118 A1 | 11/2018 | Amano |
| 2018/0342455 A1 | 11/2018 | Nosho et al. |
| 2019/0287916 A1 | 9/2019 | Sharangpani et al. |
| 2019/0287982 A1 | 9/2019 | Hinoue et al. |
| 2020/0006131 A1 | 1/2020 | Shimabukuro et al. |
| 2020/0058672 A1 | 2/2020 | Nishikawa et al. |
| 2020/0098930 A1 | 3/2020 | Le et al. |
| 2020/0098932 A1 | 3/2020 | Lajoie et al. |
| 2020/0105892 A1 | 4/2020 | Haratipour et al. |
| 2021/0118902 A1* | 4/2021 | Kanamori ......... H01L 27/11582 |
| 2022/0028882 A1* | 1/2022 | Lee .................. H01L 27/11565 |

OTHER PUBLICATIONS

"Common Types of Water Filters and Haow they Work," https://healthykitchen101.com/types-of-water-filters/, Visited Feb. 3, 2021.

Endoh et al., "Novel Ultra High Density Memory with a Stacked-Surrounding Gate Transistor (S-SGT) Structured Cell," IEDM Proc. (2001) 33-36.

Liang, X., et al. "Ultra-thin microporous-mesoporous metal oxide films prepared by molecular layer deposition (MLD)." *Chemical communications* 46 (2009): 7140-7142.

National Fluoridation Information Service, "Household Water Treatment Systems for Fluoride Removal," National Fluoridation Information Service Advisory, May 2012.

U.S. Appl. No. 16/838,283, filed Apr. 2, 2020, SanDisk Technologies LLC.

U.S. Appl. No. 16/838,320, filed Apr. 2, 2020, SanDisk Technologies LLC.

U.S. Appl. No. 16/987,717, filed Aug. 7, 2020, SanDisk Technologies LLC.

U.S. Appl. No. 17/085,735, filed Oct. 30, 2020, SanDisk Technologies LLC.

* cited by examiner

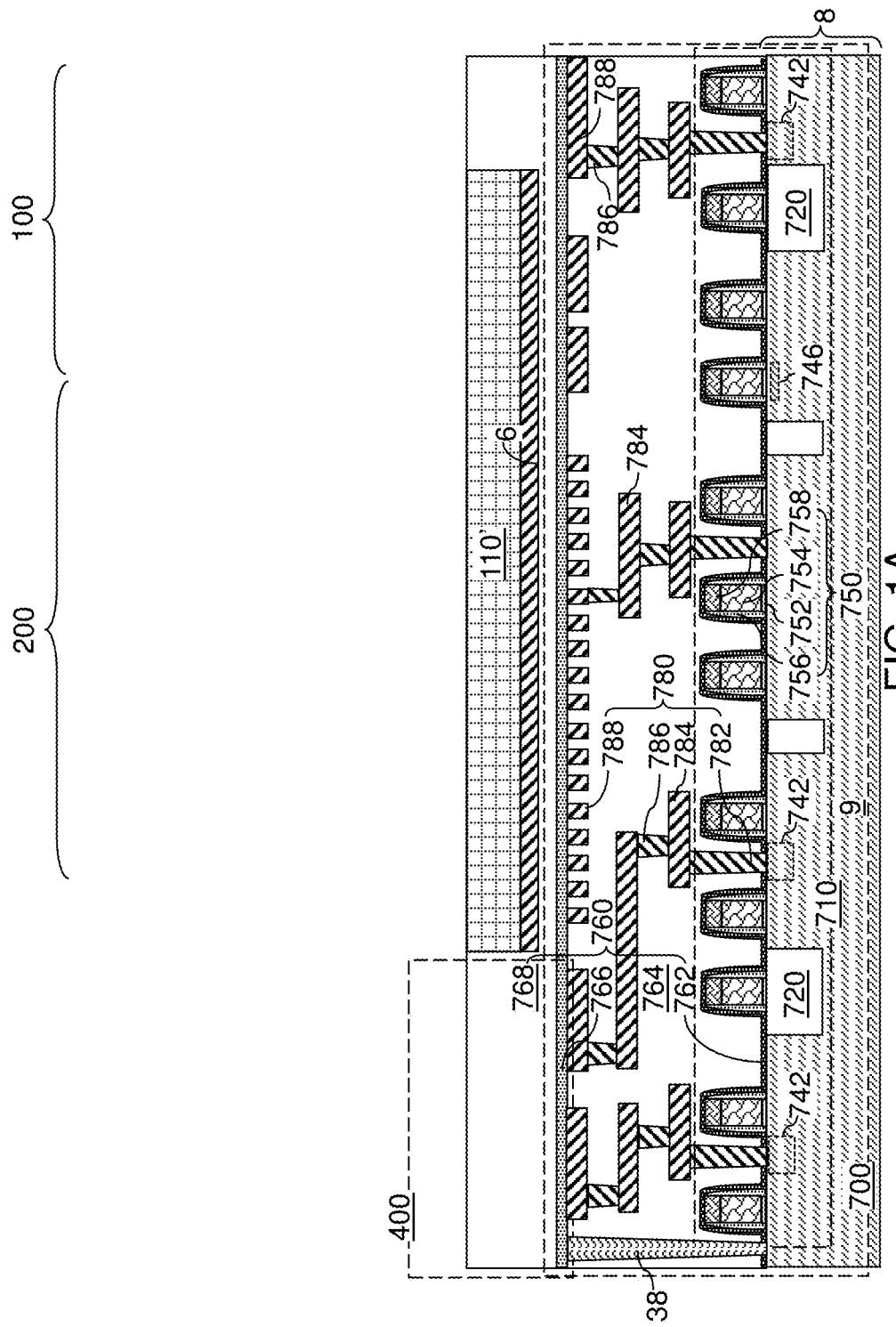

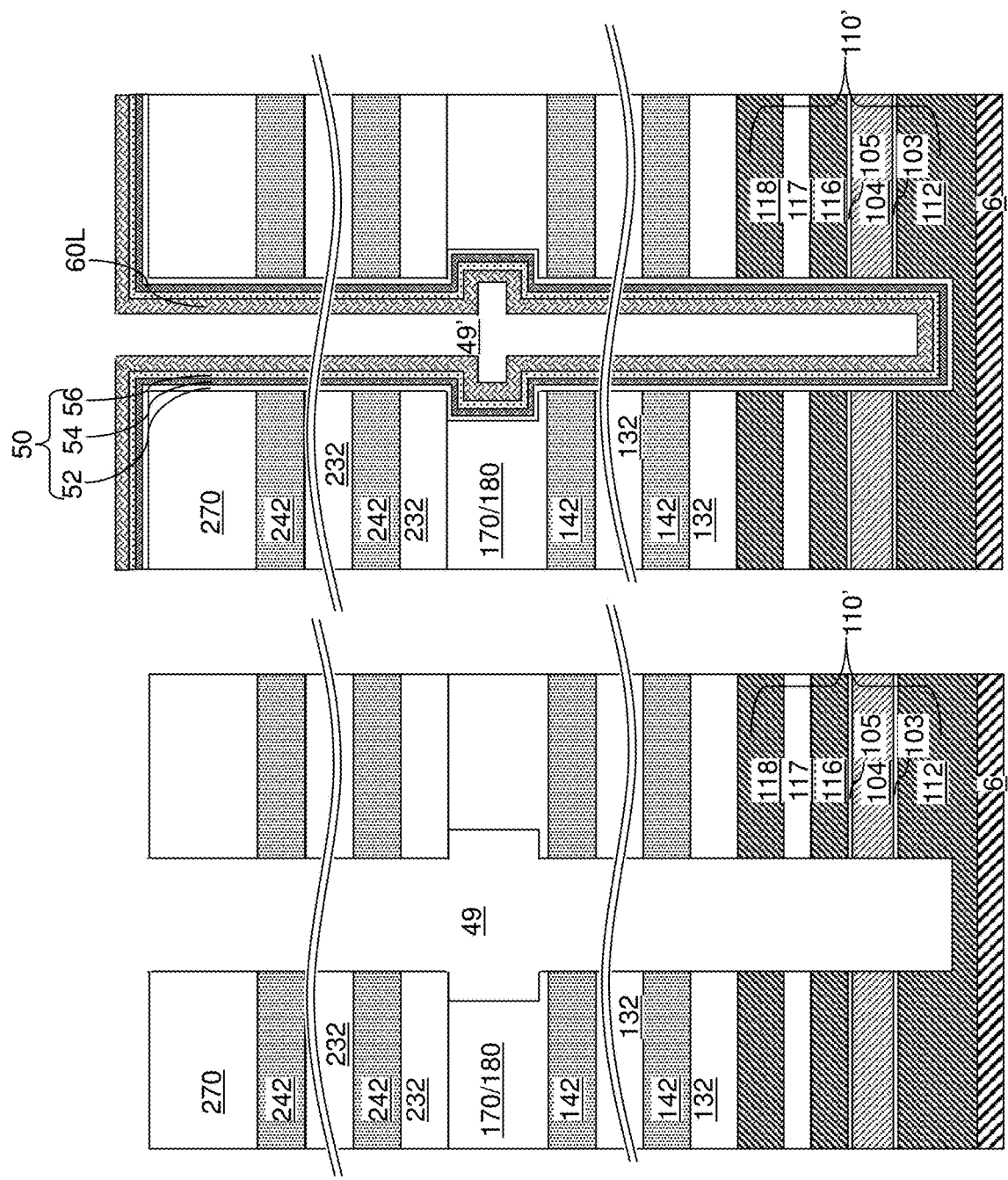

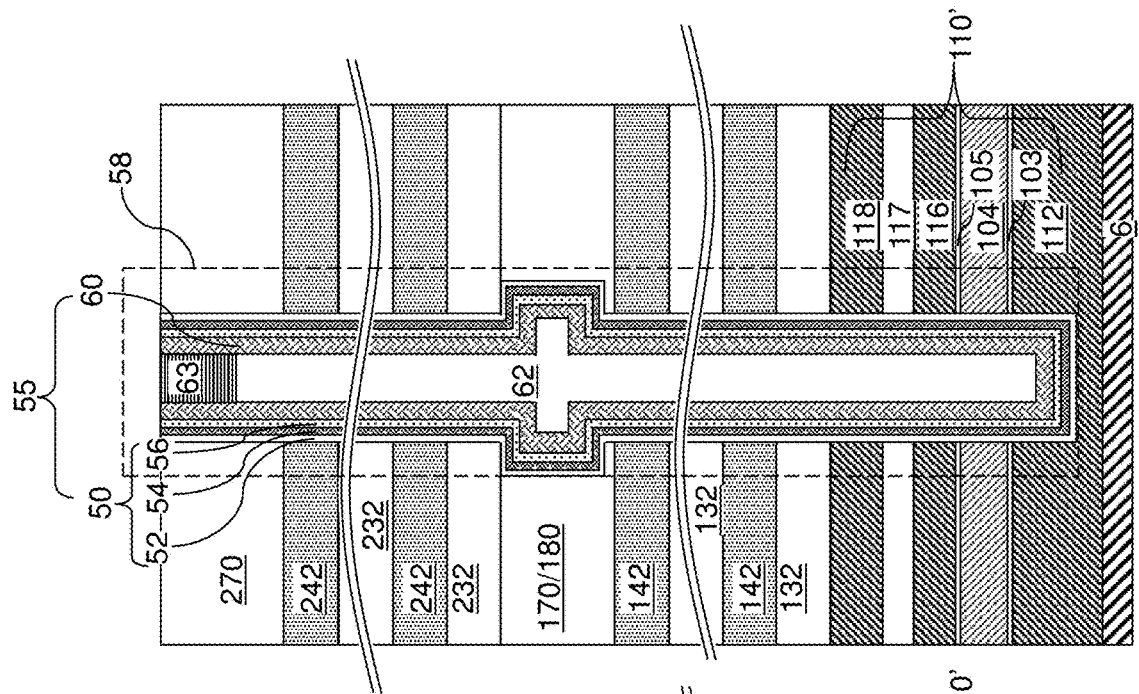
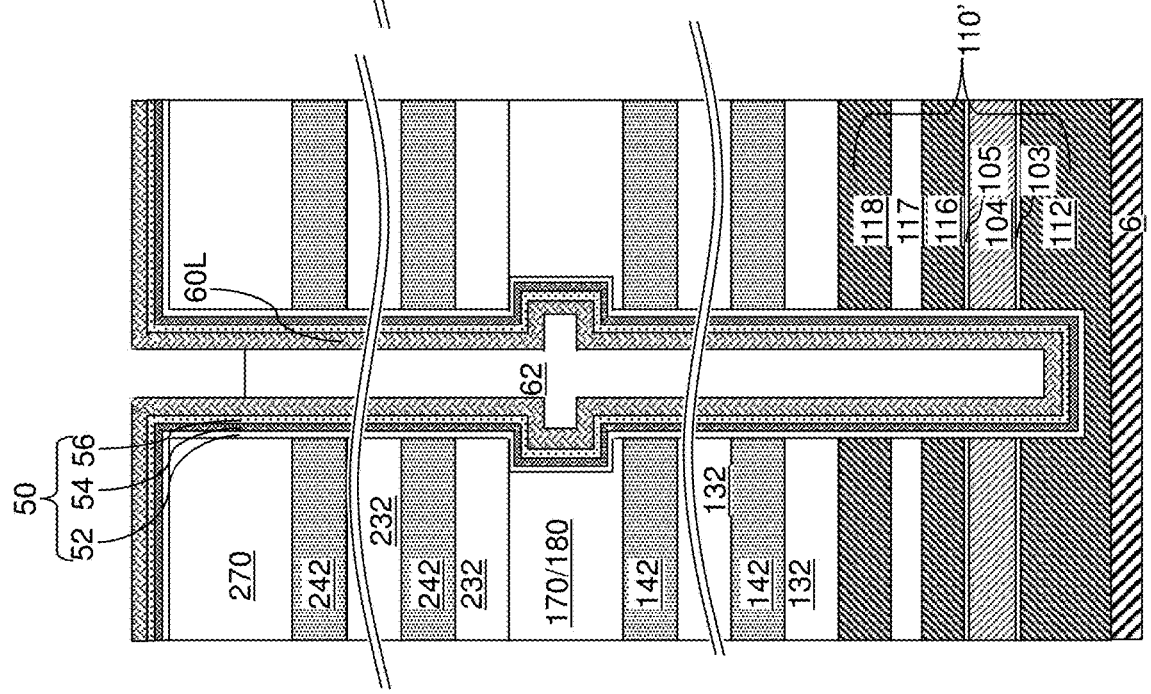

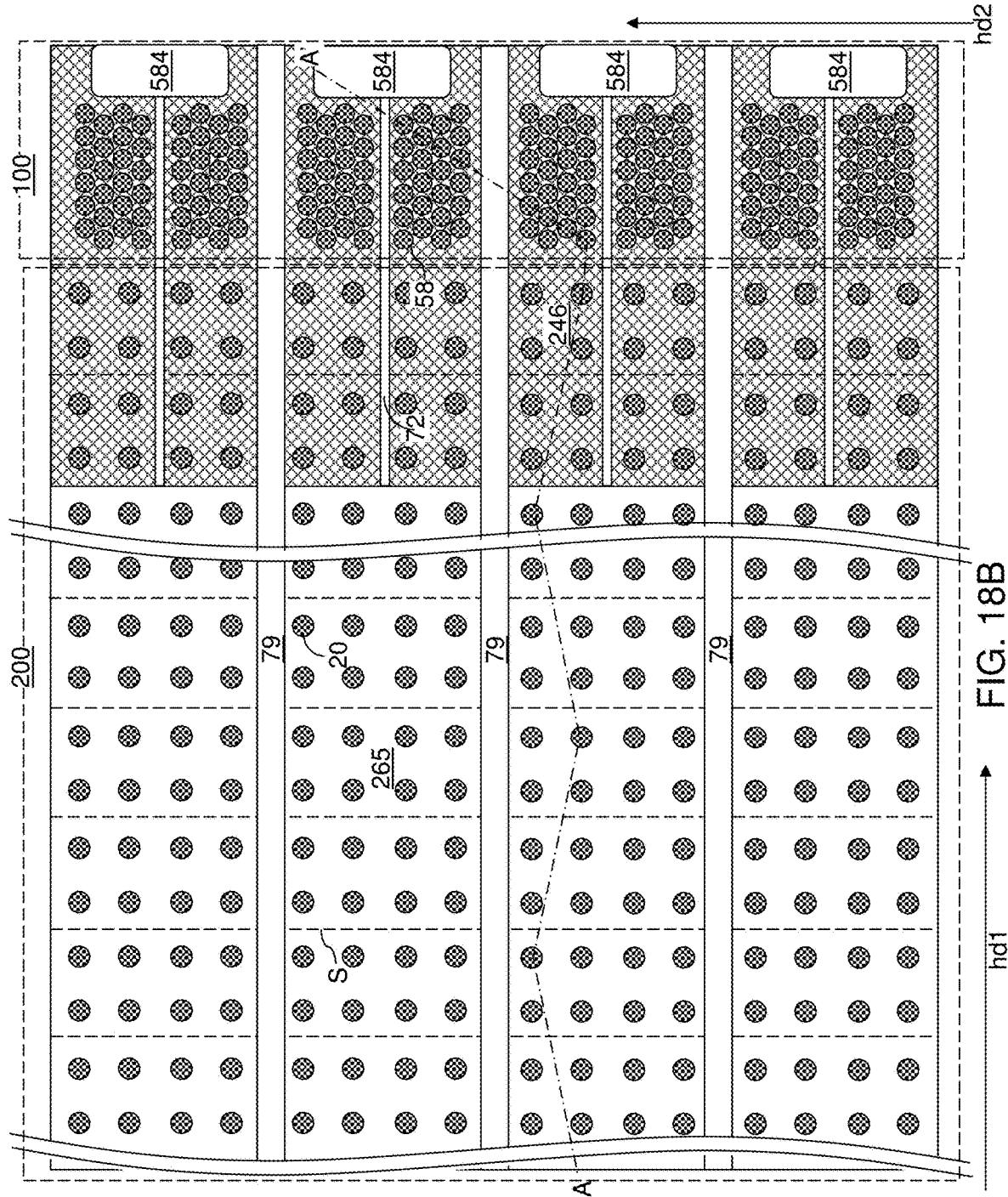

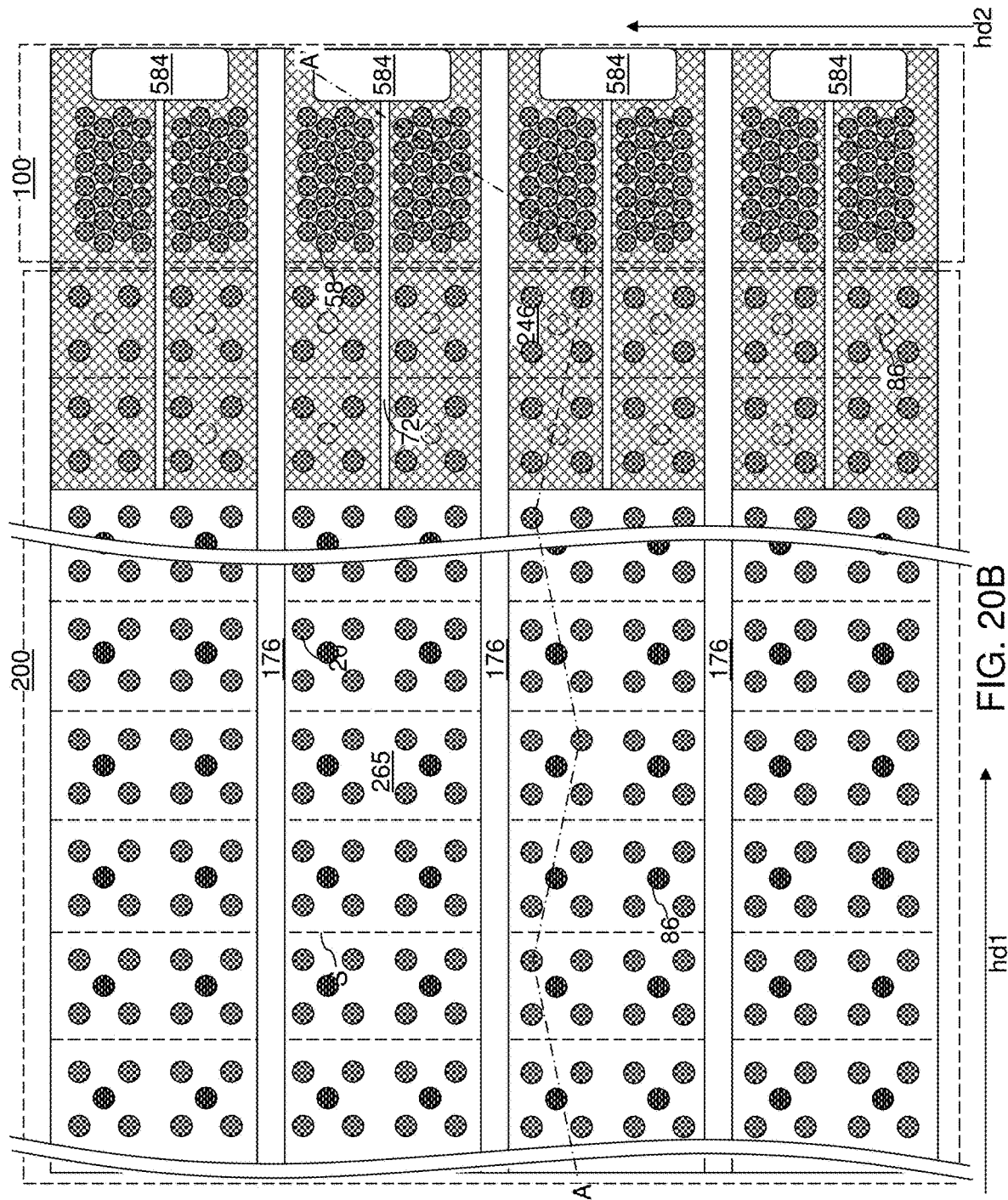

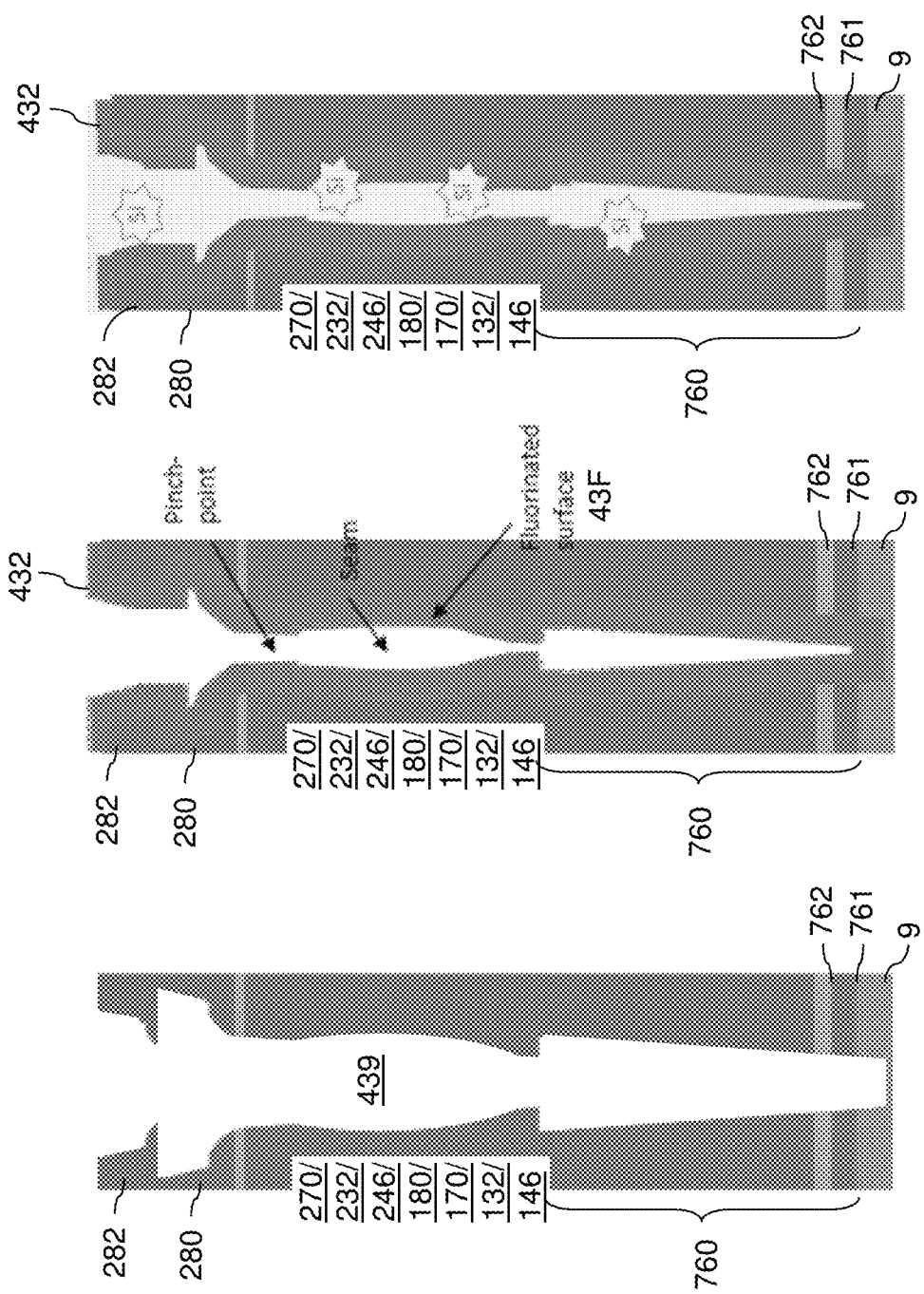

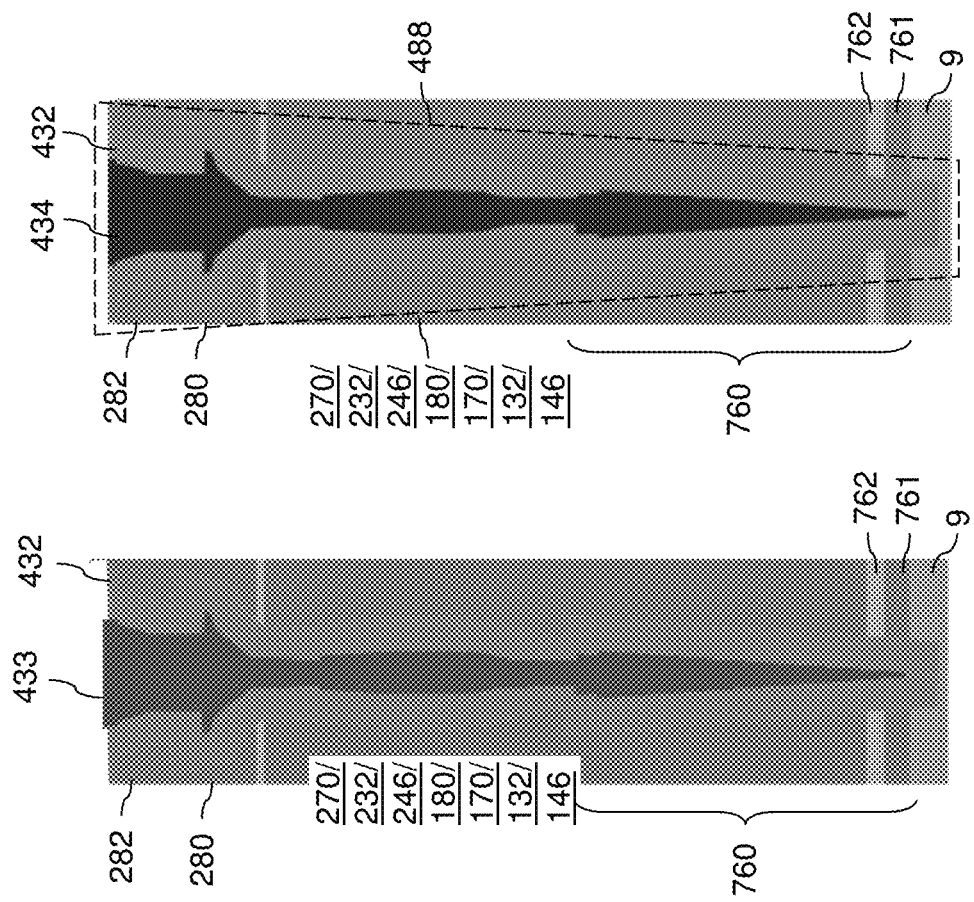

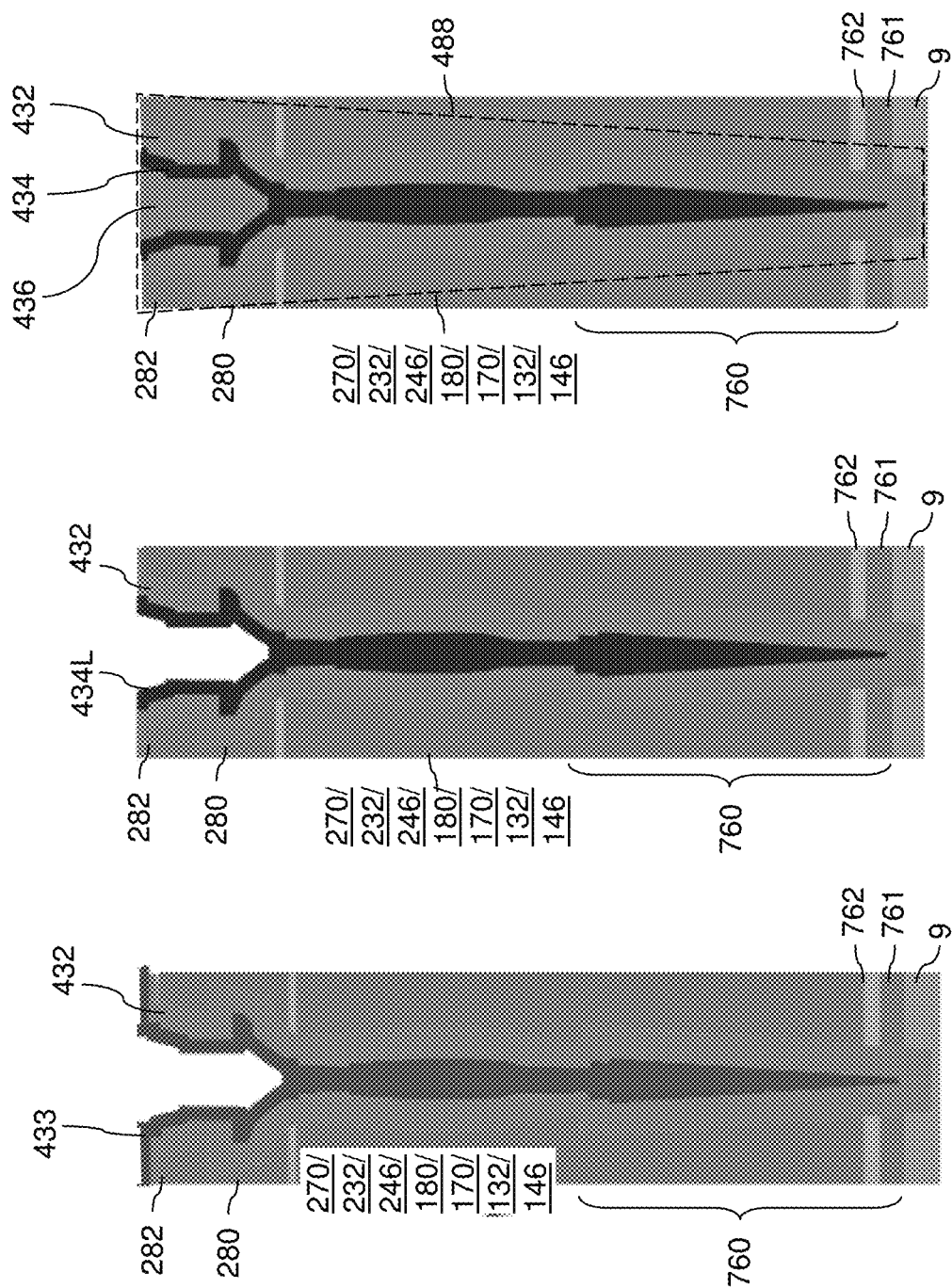

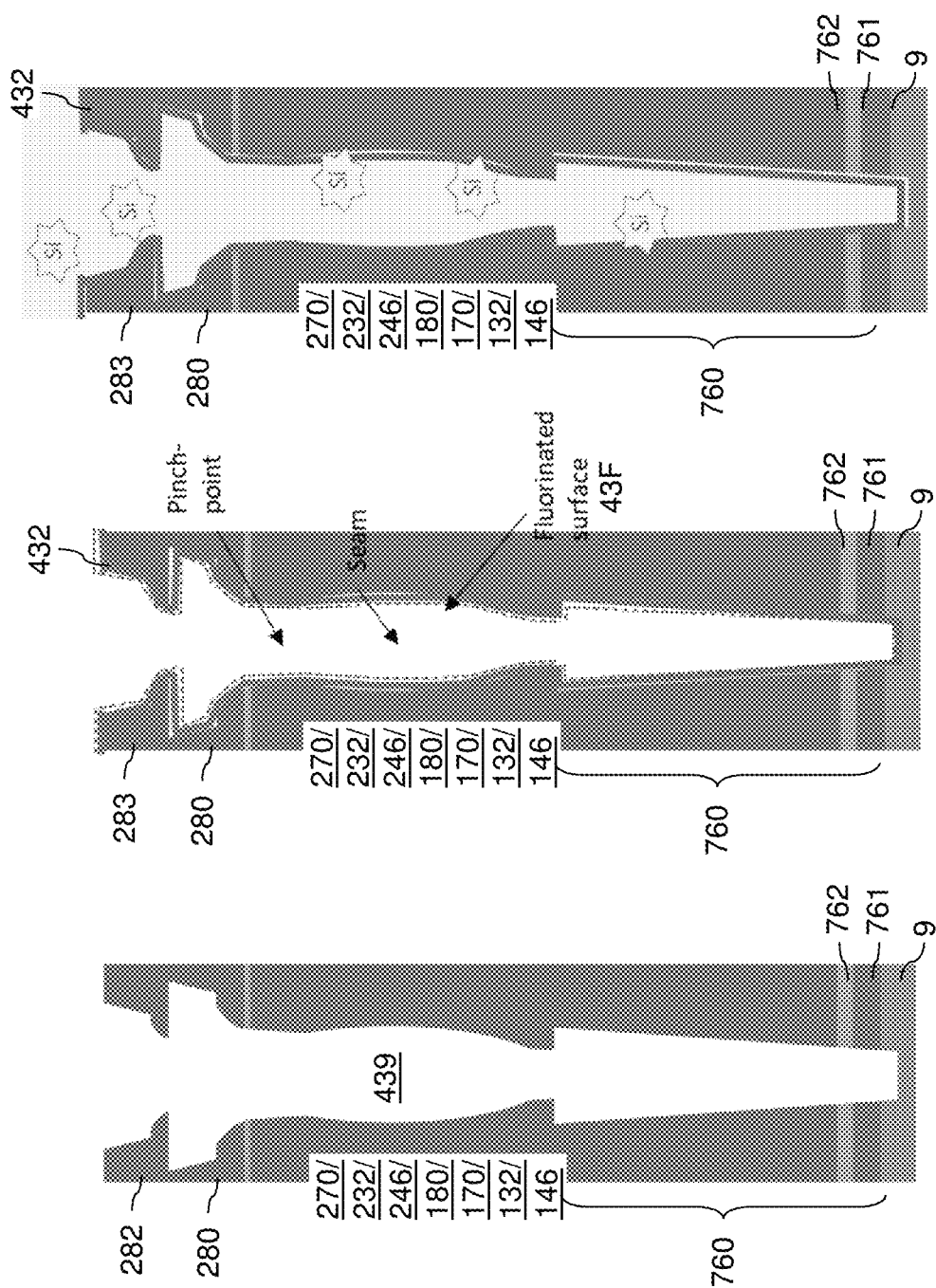

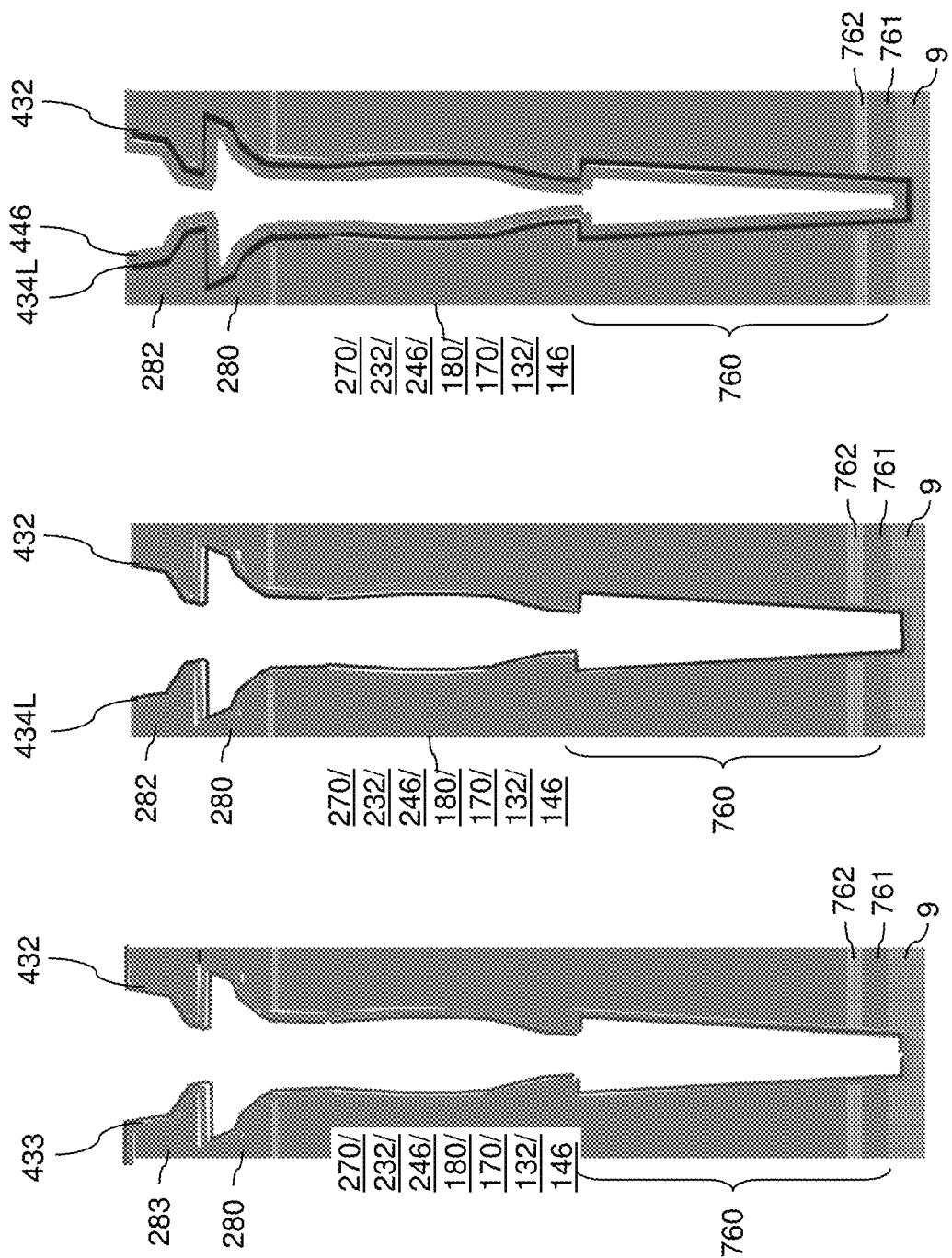

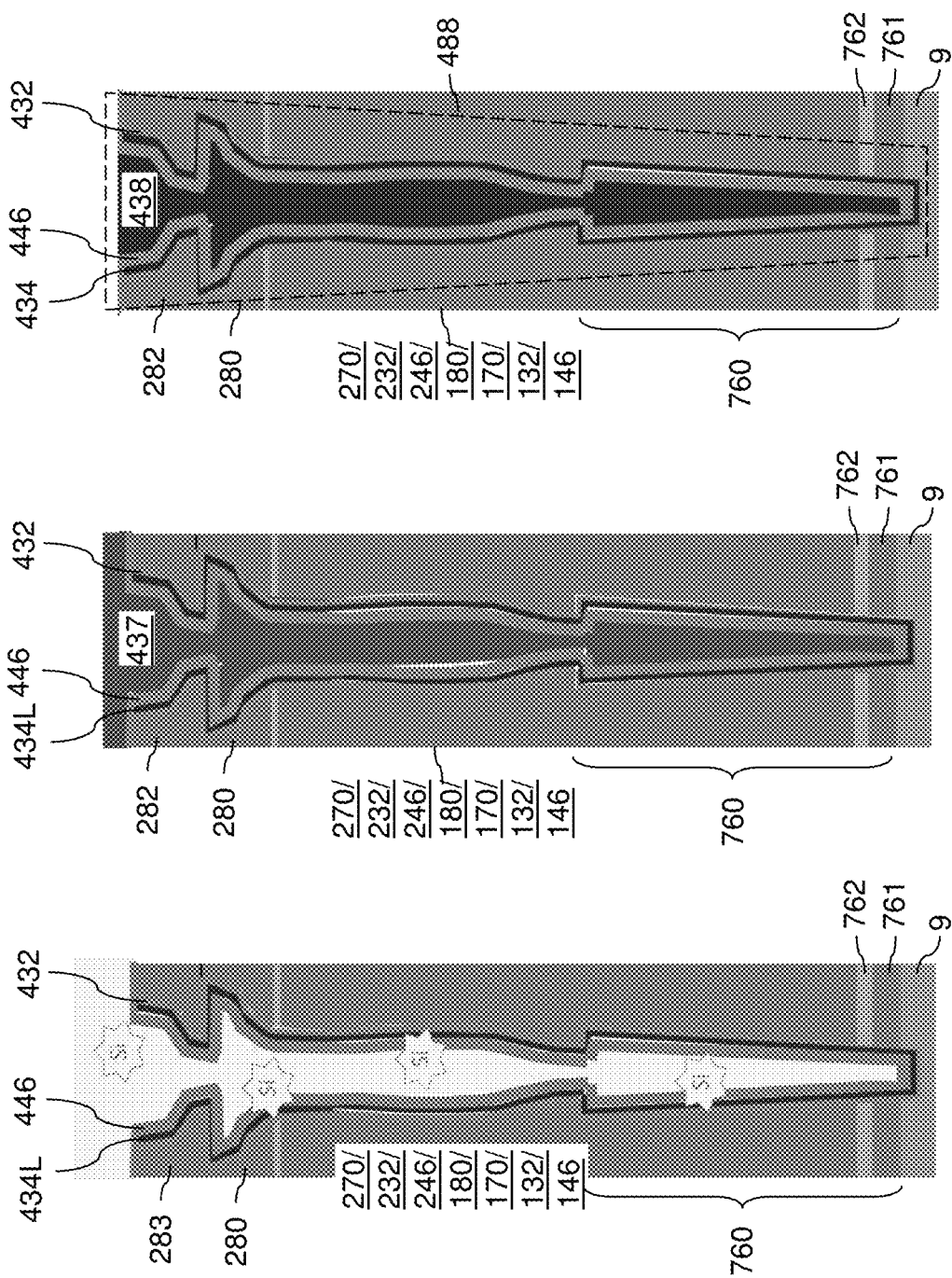

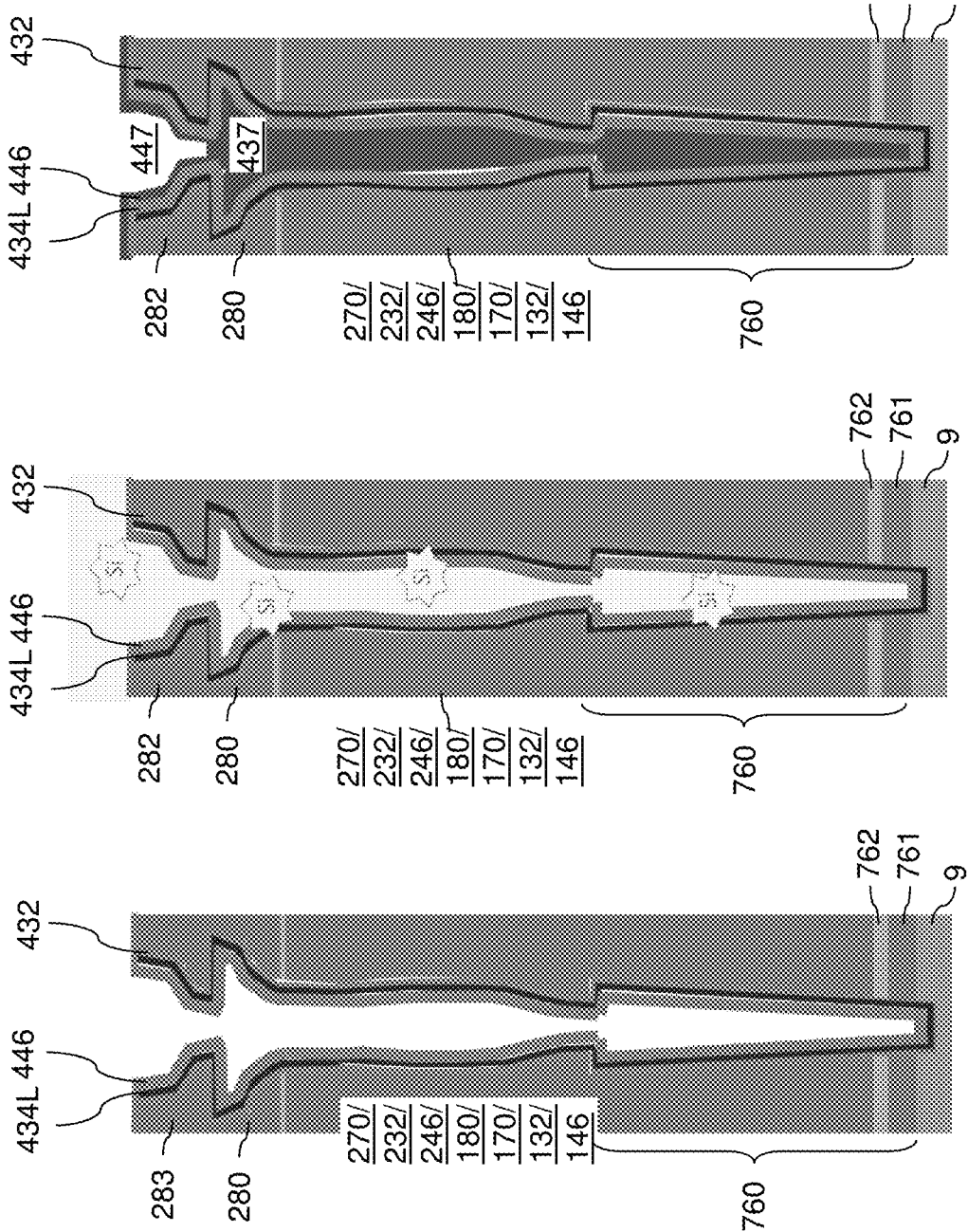

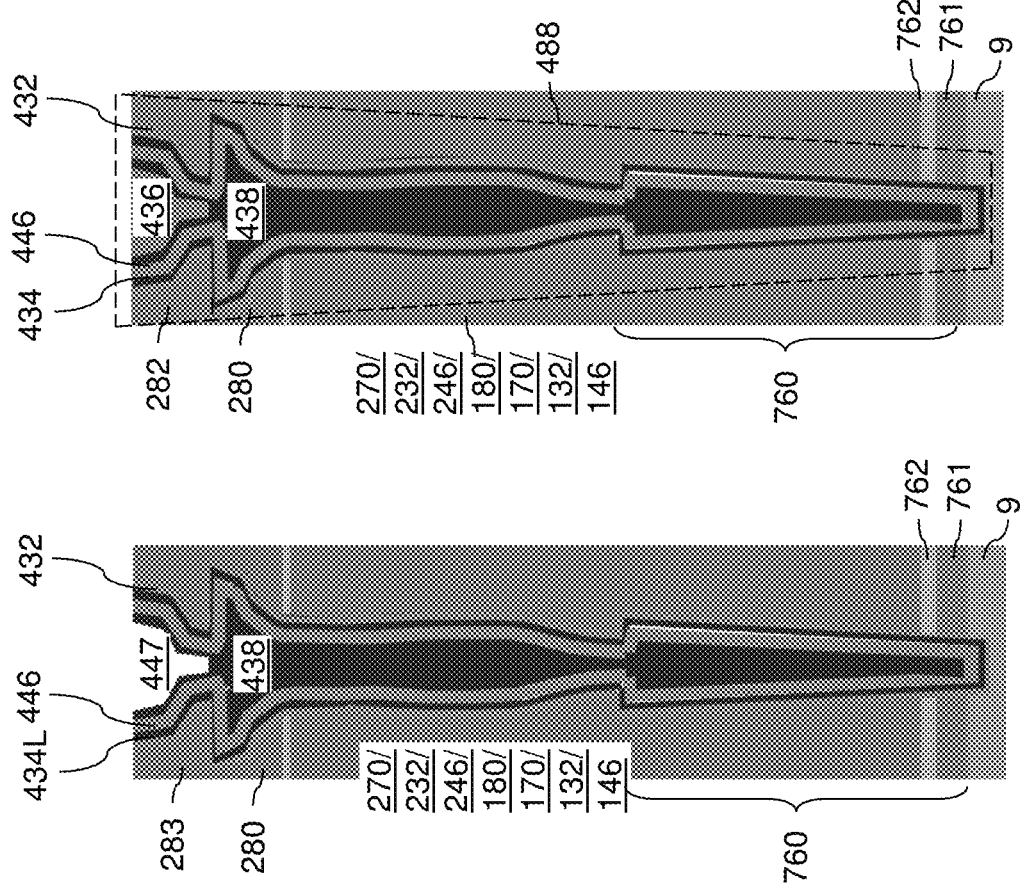

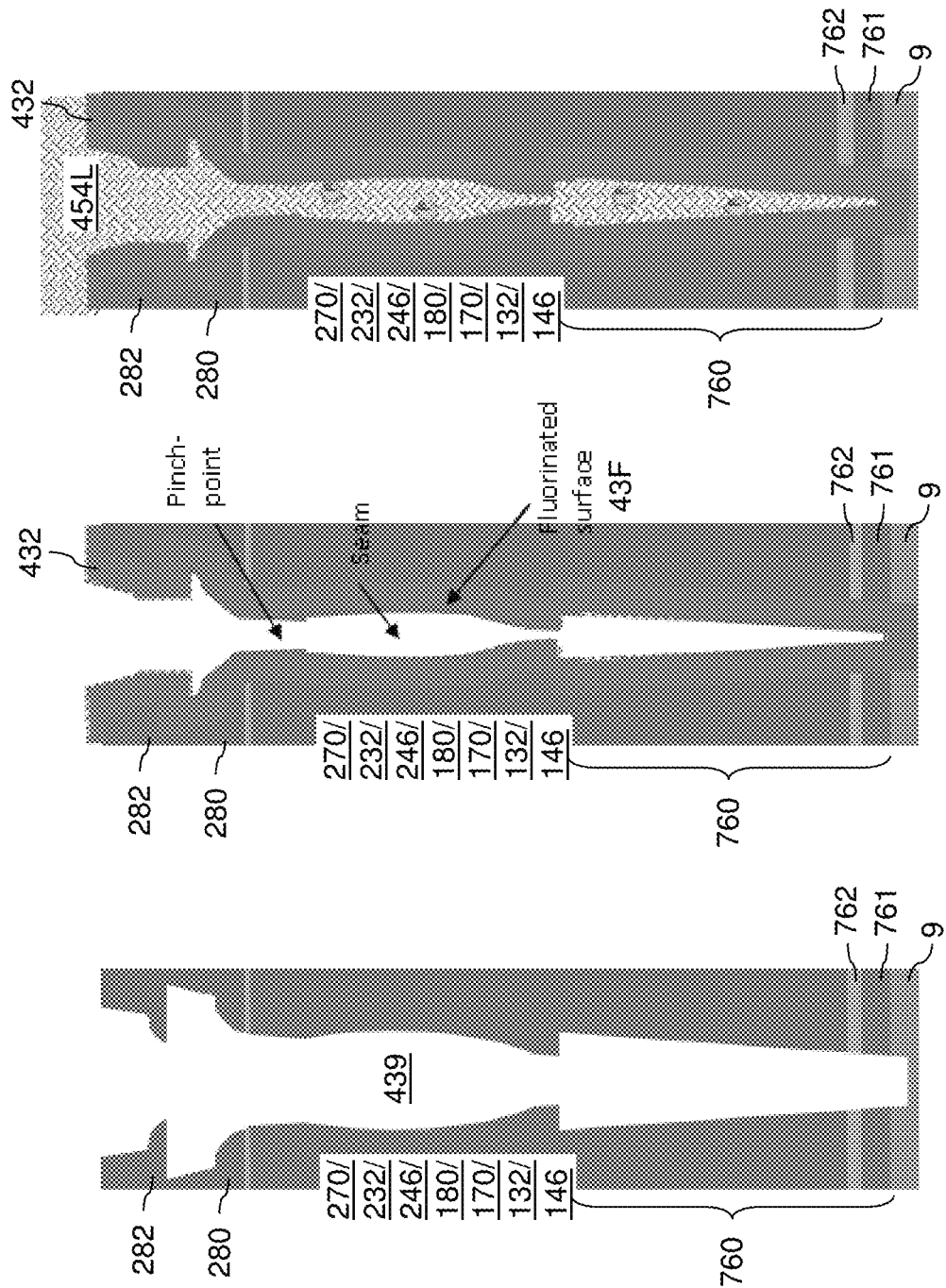

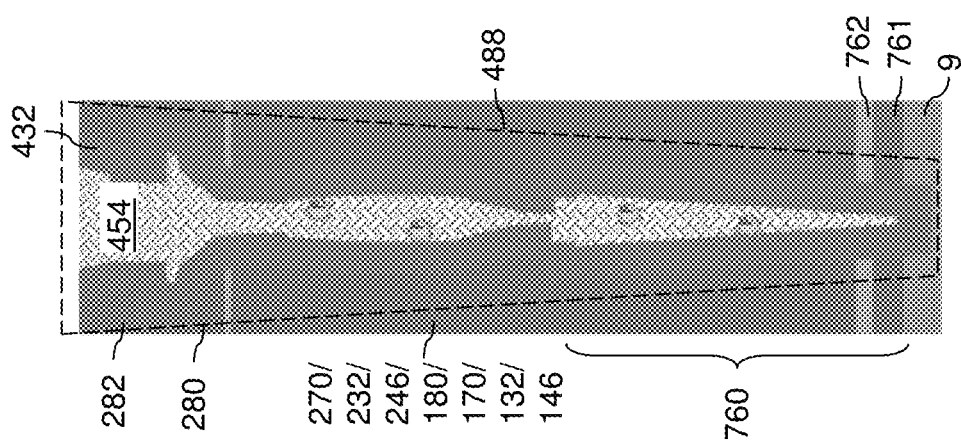

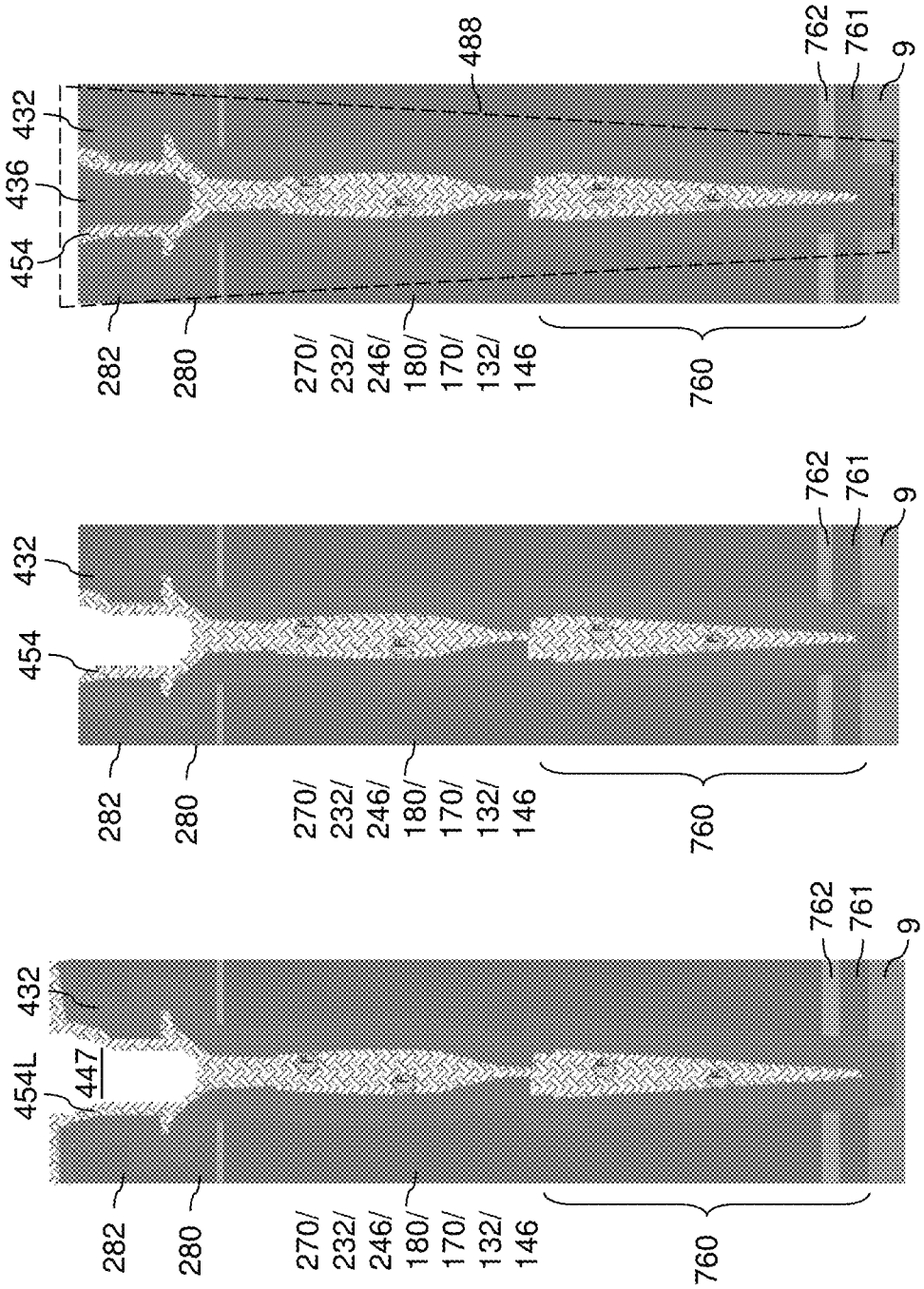

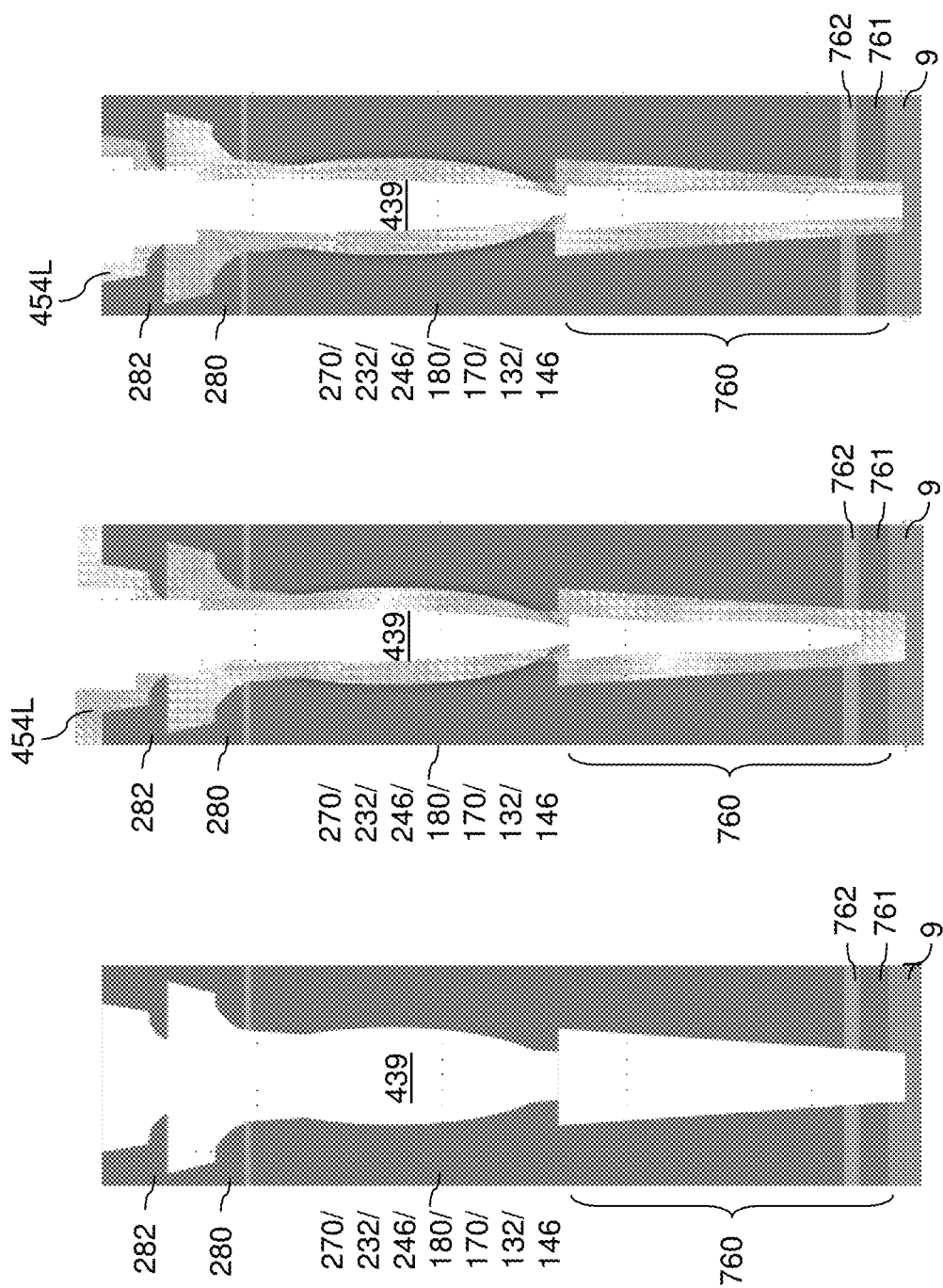

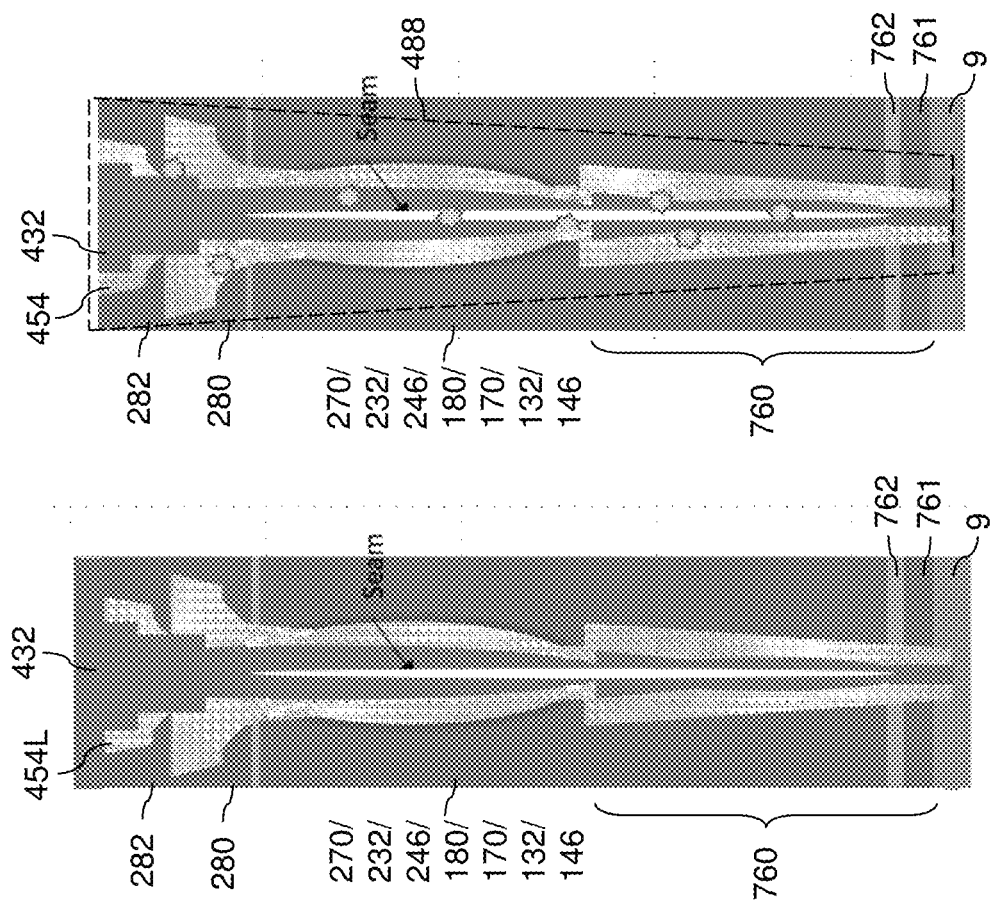

THREE DIMENSIONAL SEMICONDUCTOR DEVICE CONTAINING COMPOSITE CONTACT VIA STRUCTURES AND METHODS OF MAKING THE SAME

FIELD

The present disclosure relates generally to the field of semiconductor devices, and particularly to a three dimensional semiconductor device including composite contact via structures employing multiple conductive layers and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a semiconductor structure is provided, which comprises: at least one first semiconductor device located on a substrate; lower-level dielectric material layers overlying the at least one first semiconductor device and embedding lower-level metal interconnect structures; at least one second semiconductor device and a dielectric material portion that overlie the lower-level dielectric material layers; at least one upper-level dielectric material layer embedding upper-level metal interconnect structures and overlying the at least one second semiconductor device; and an interconnection via structure vertically extending through the at least one upper-level dielectric material layer, the dielectric material portion, and at least an upper portion of the lower-level dielectric material layers and contacting a conductive structure selected from a node of the at least one first semiconductor device or one of the lower-level metal interconnect structures, wherein the interconnection via structure comprises: a transition metal layer composed primarily of a transition metal element and vertically extending from a top surface of the interconnection via structure to the conductive structure; and a fluorine-doped filler material portion in contact with the transition metal layer, and including fluorine atoms at a first average atomic concentration in a range from 0.1 part per million to 100 parts per million.

According to an embodiment of the present disclosure, a semiconductor structure is provided, which comprises: at least one first semiconductor device located on a substrate; lower-level dielectric material layers overlying the at least one first semiconductor device and embedding lower-level metal interconnect structures; at least one second semiconductor device and a dielectric material portion that overlie the lower-level dielectric material layers; at least one upper-level dielectric material layer embedding upper-level metal interconnect structures and overlying the at least one second semiconductor device; and an interconnection via structure vertically extending through the at least one upper-level dielectric material layer, the dielectric material portion, and at least an upper portion of the lower-level dielectric material layers and contacting a conductive structure selected from a node of the at least one first semiconductor device or one of the lower-level metal interconnect structures, wherein the interconnection via structure comprises: a transition metal layer composed primarily of a transition metal element and vertically extending from a top surface of the interconnection via structure to the conductive structure; and a filler material portion in contact with the transition metal layer, wherein the filler material portion is composed primarily of a filler material selected from a silicide of the transition metal element or aluminum oxide.

According to another aspect of the present disclosure, a method of forming a semiconductor structure is provided. The method comprises forming at least one first semiconductor device over a substrate; forming lower-level dielectric material layers embedding lower-level metal interconnect structures over the at least one first semiconductor device; forming at least one second semiconductor device and a dielectric material portion over the dielectric material layers; forming at least one upper-level dielectric material layer embedding upper-level metal interconnect structures over the at least one second semiconductor device; forming an interconnection via cavity through the at least one upper-level dielectric material layer, the dielectric material portion, and at least an upper portion of the lower-level dielectric material layers, wherein a conductive structure selected from a node of the at least one first semiconductor device or one of the lower-level metal interconnect structures is physically exposed at a bottom of the interconnection via cavity; and forming an interconnection via structure in the interconnection via cavity, wherein the interconnection via structure comprises: a transition metal layer composed primarily of a transition metal element and vertically extending from a top surface of the interconnection via structure to the conductive structure; and a fluorine-doped filler material portion in contact with the transition metal layer, composed primarily of a filler material selected from a silicide of the transition metal element or aluminum oxide, and including fluorine atoms at a first average atomic concentration in a range from 0.1 part per million to 100 parts per million.

BRIEF DESCRIPTION OF THE DRAWINGS

FIG. 1A is a vertical cross-sectional view of an exemplary structure after formation of semiconductor devices, lower level dielectric layers, lower metal interconnect structures, and in-process source level material layers on a semiconductor substrate according to an embodiment of the present disclosure.

FIGS. 9A-9D illustrate sequential vertical cross-sectional views of a memory opening during formation of a memory opening fill structure according to an embodiment of the present disclosure.

FIG. 18B is a horizontal cross-sectional view of the exemplary structure along the horizontal plane B-B' of FIG. 18A. The hinged vertical plane A-A' corresponds to the plane of the vertical cross-sectional view of FIG. 18A.

FIG. 20B is a horizontal cross-sectional view of the exemplary structure along the vertical plane B-B' of FIG. 26A. The hinged vertical plane A-A' corresponds to the plane of the vertical cross-sectional view of FIG. 26A.

FIGS. 23A-23E are sequential vertical cross-sectional views of a region around an interconnection via cavity during formation of an interconnection via structure having a first configuration according to an embodiment of the present disclosure.

FIGS. 25A-25C are sequential vertical cross-sectional views of a region around an interconnection via cavity during formation of an interconnection via structure having a second configuration according to an embodiment of the present disclosure.

FIGS. 26A-26I are sequential vertical cross-sectional views of a region around an interconnection via cavity during formation of an interconnection via structure having a third configuration according to an embodiment of the present disclosure.

FIGS. 27A-27E are sequential vertical cross-sectional views of a region around an interconnection via cavity during formation of an interconnection via structure having a fourth configuration according to an embodiment of the present disclosure.

FIGS. 28A-28D are sequential vertical cross-sectional views of a region around an interconnection via cavity during formation of an interconnection via structure having a fifth configuration according to an embodiment of the present disclosure.

FIGS. 29A-29C are sequential vertical cross-sectional views of a region around an interconnection via cavity during formation of an interconnection via structure having a sixth configuration according to an embodiment of the present disclosure.

FIGS. 30A-30E are sequential vertical cross-sectional views of a region around an interconnection via cavity during formation of an interconnection via structure having a seventh configuration according to an embodiment of the present disclosure.

DETAILED DESCRIPTION

Figure 1B:
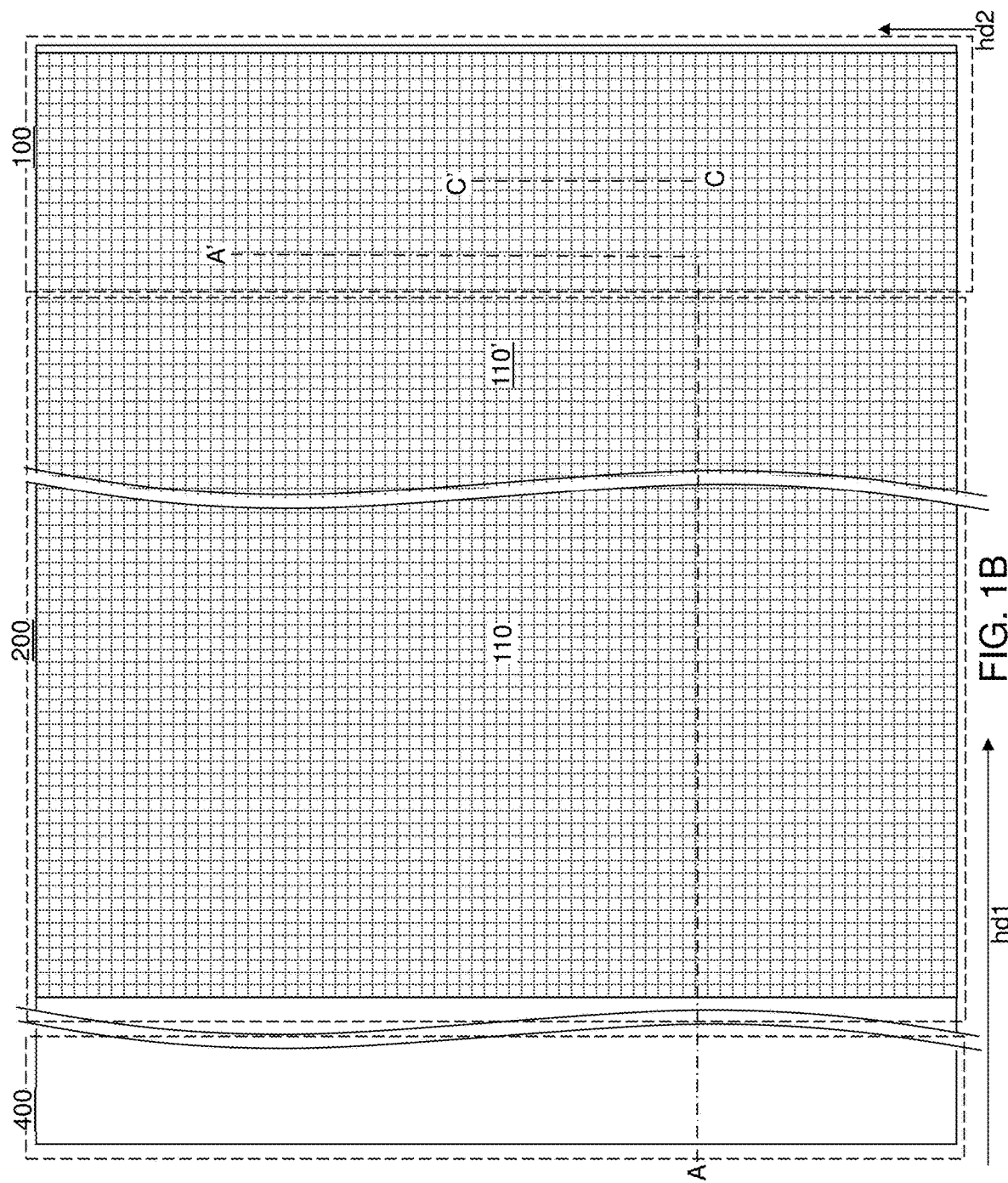
FIG. 1B is a top-down view of the exemplary structure of FIG. 1A. The hinged vertical plane A-A' is the plane of the vertical cross-sectional view of FIG. 1A.

Three-dimensional memory devices have a height that typically exceeds several microns with multiple dielectric material layers having different material compositions. Contact via cavities formed though such a material stack have significant lateral undulation, and large voids can be formed in contact via structures formed in such contact via cavities. The voids decrease the structural integrity of the device. The voids may also trap fluorine used to deposit the contact via structures (e.g., such as fluorine from tungsten hexafluoride used to deposit tungsten contact via structures) which is then outgassed during a subsequent anneal. The fluorine outgassing may damage and/or peel the device layers located in and/or adjacent to the contact via cavities. As discussed above, embodiments of the present disclosure are directed to a semiconductor device including composite contact via structures and methods of manufacturing the same, the various aspects of which are described herein in detail. The composite contact via structures reduce or eliminate the voids and improve the structural integrity of the device. Furthermore, the composite contact via structures may also reduce or prevent fluorine outgassing during subsequent annealing steps, which reduces or eliminates damage and/or peeling to the device layers located in and/or adjacent to the contact via cavities. The embodiments of the present disclosure may be used to form various semiconductor devices, such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1C:
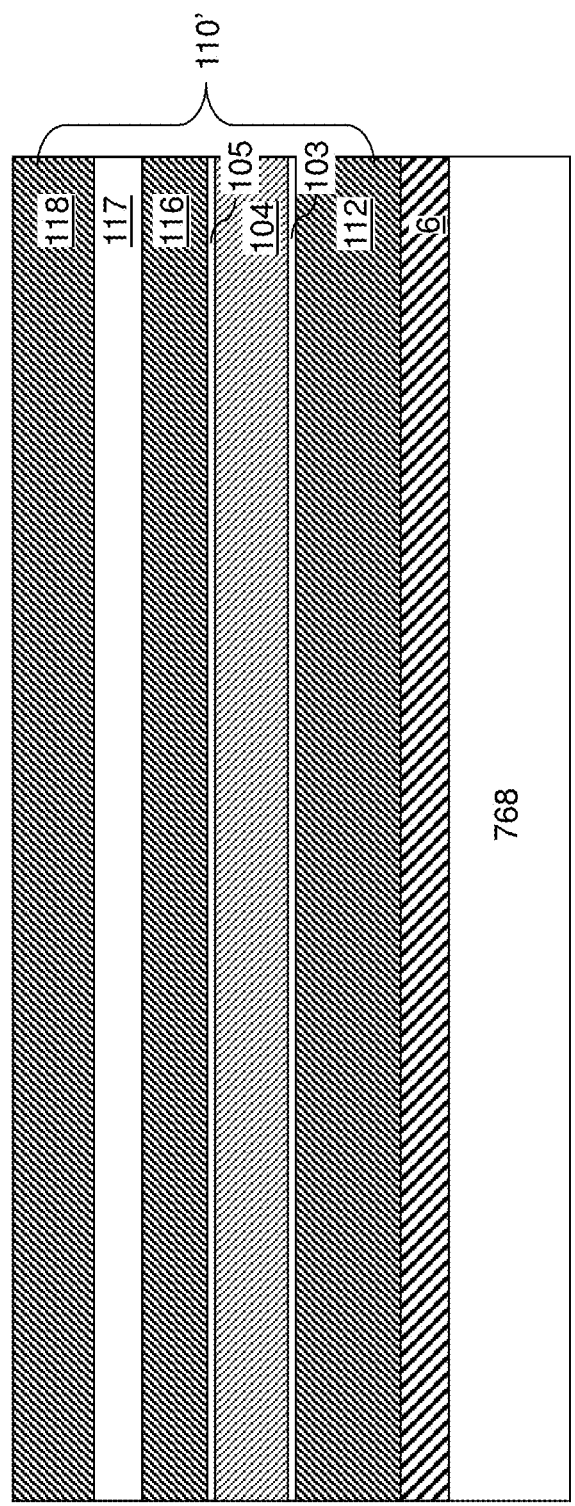
FIG. 1C is a magnified view of the in-process source level material layers along the vertical plane C-C' of FIG. 1B.

Referring to FIGS. 1A-1C, an exemplary structure according to an embodiment of the present disclosure is illustrated. FIG. 1C is a magnified view of an in-process source-level material layers 110' illustrated in FIGS. 1A and 1B. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The first semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the first semiconductor devices may include word line switching devices for electrically biasing word lines of three-dimensional memory structures to be subsequently formed. Generally at least one first semiconductor device 710 can be formed on the substrate 8.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

According to an embodiment of the present disclosure, at least one lower-level sacrificial via structure 38 can be formed through the lower-level dielectric material layers 760 directly on at least one respective electrical node of the at least one first semiconductor device 710. Each electrical node of the at least one first semiconductor device 710 may be a source region, a drain region, or a gate electrode of a field effect transistor. In one embodiment, at least one via cavity vertically extending through the lower-level dielectric material layers 760 can be formed, and can be subsequently filled with a sacrificial fill material to form the at least one lower-level sacrificial via structure 38. The sacrificial fill material may comprise a semiconductor material (such as amorphous or polycrystalline silicon, germanium, or silicon-germanium), a dielectric material (such as borosilicate glass or organosilicate glass), a carbon-based material (such as amorphous carbon or diamond-like carbon), or a polymer material (such as a silicon-based polymer material). Each of the at least one lower-level sacrificial via structure 38 can have a respective top surface within a horizontal plane including one of the dielectric material layers among the lower-level dielectric material layers 760.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110′. The optional conductive plate layer 6, if present, provides a high conductivity conduction path for electrical current that flows into, or out of, the in-process source-level material layers 110′. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110′ may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110′ may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
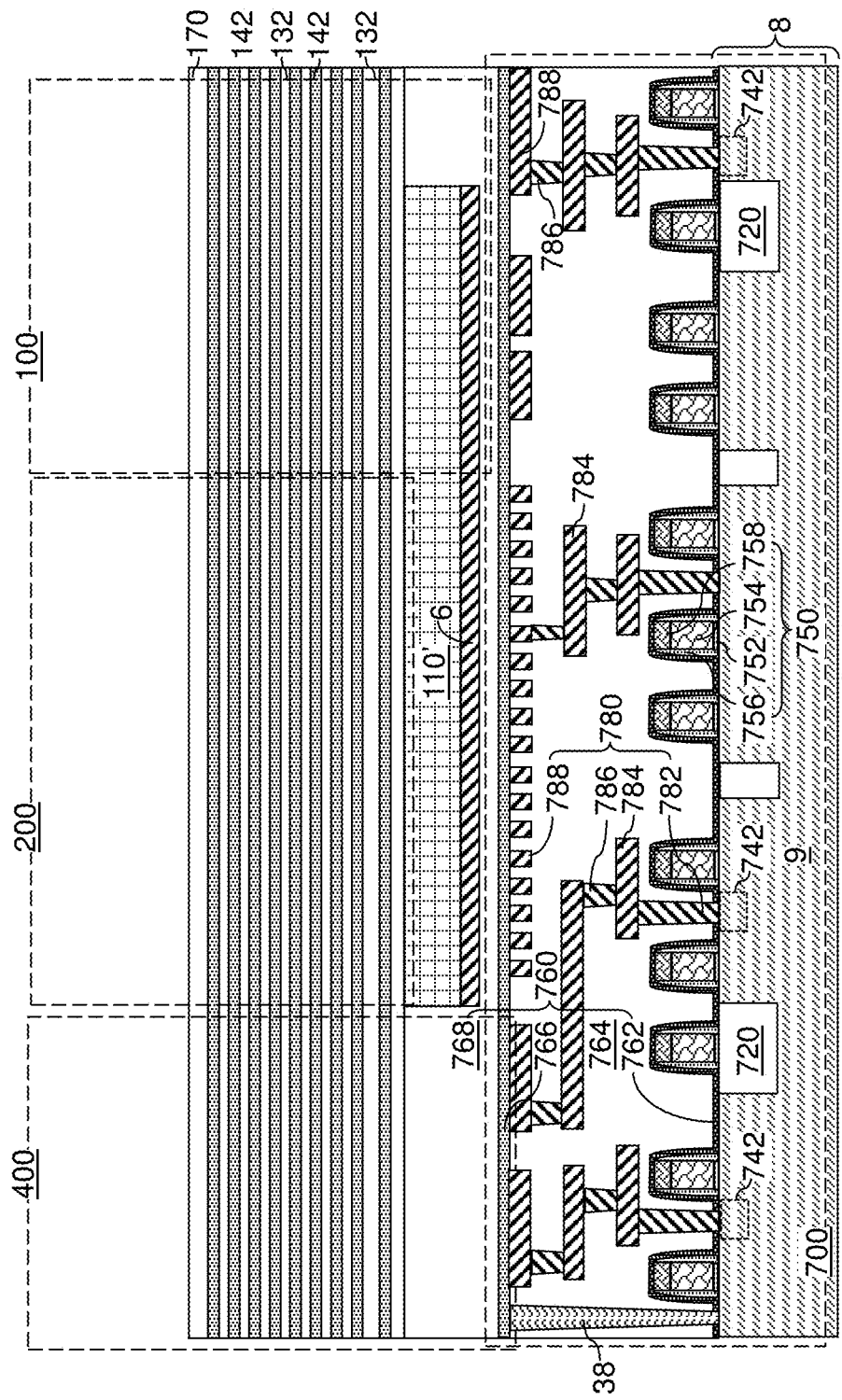
FIG. 2 is a vertical cross-sectional view of the exemplary structure after formation of a first-tier alternating stack of first insulting layers and first spacer material layers according to an embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (highk) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
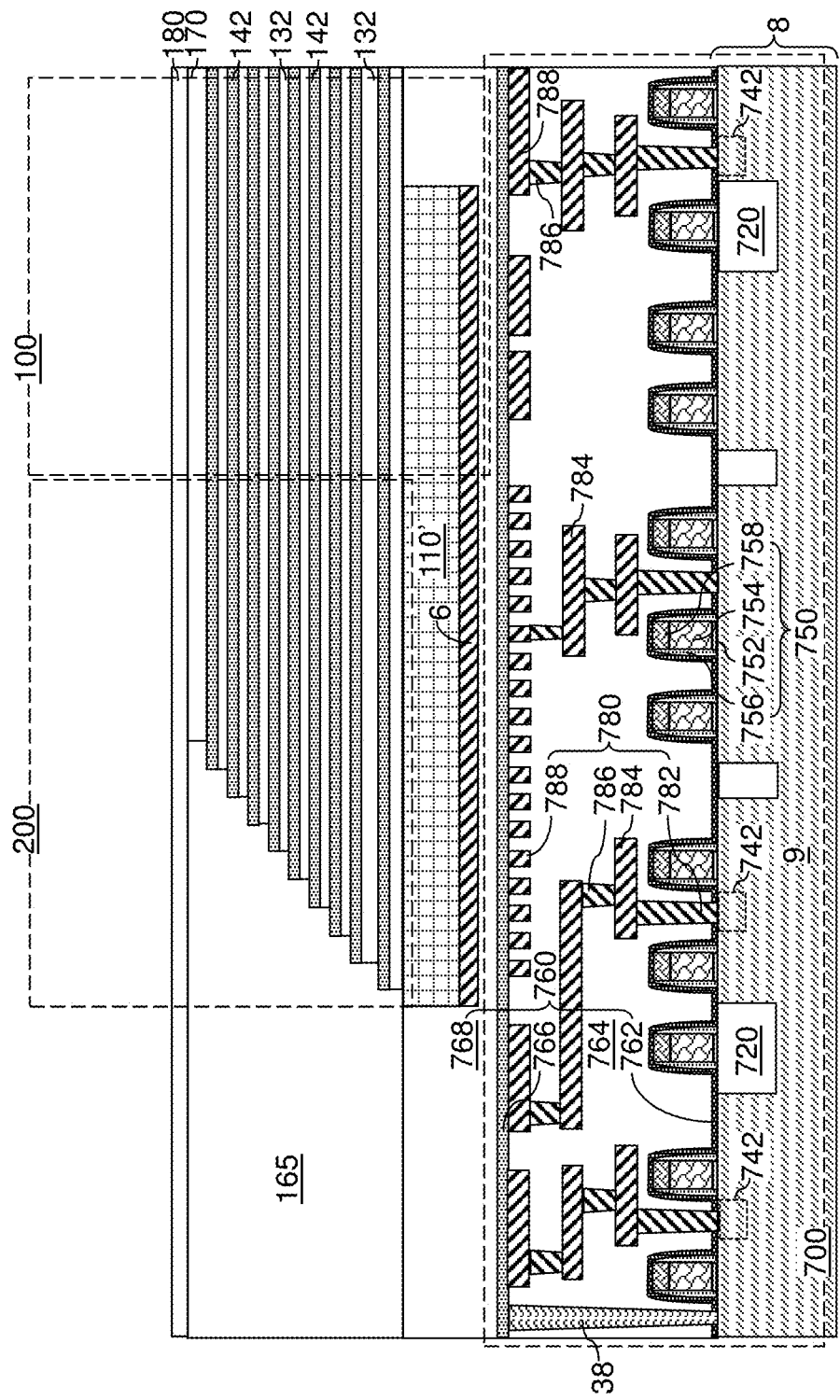
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
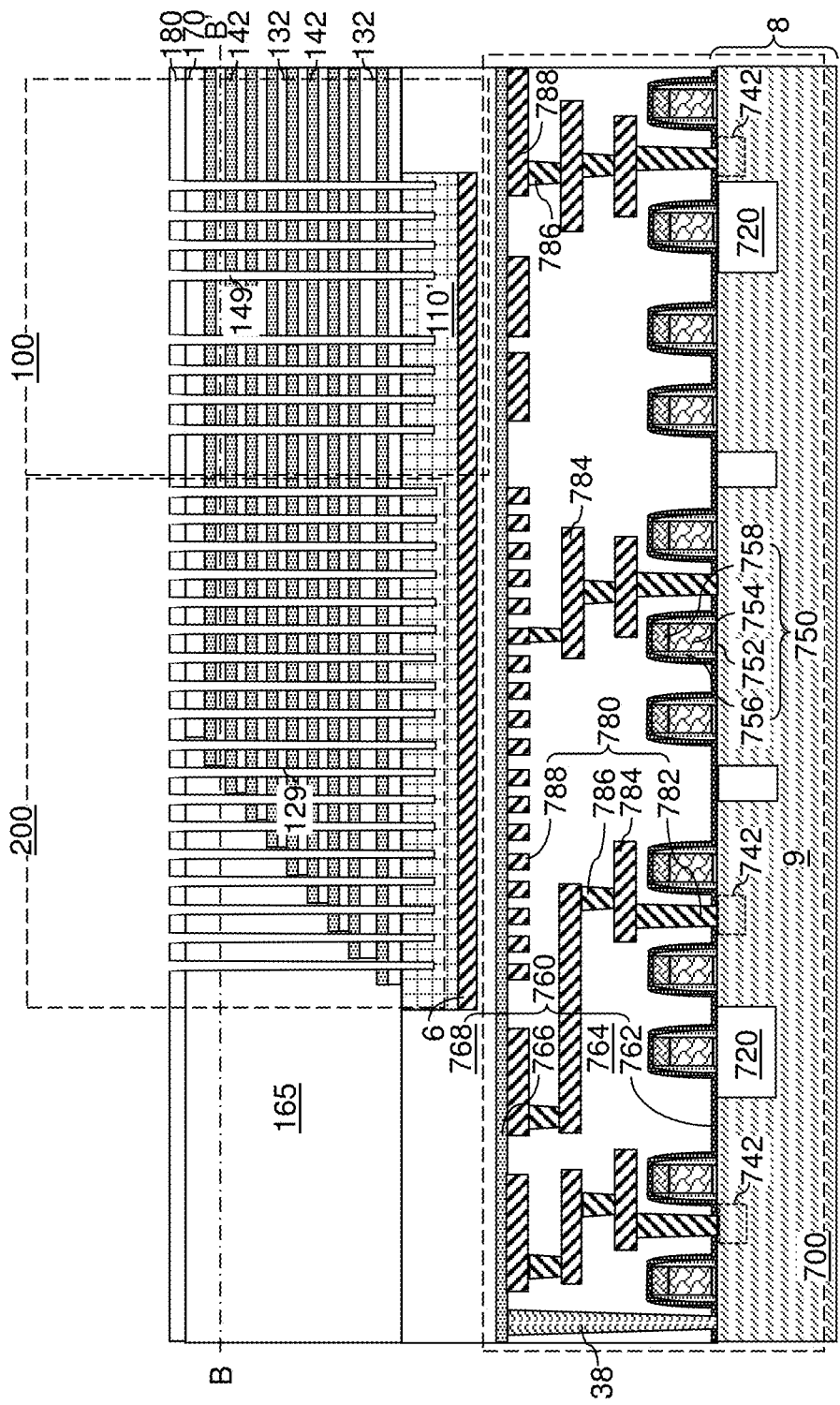
FIG. 4A is a vertical cross-sectional view of the exemplary structure after formation of first-tier memory openings and first-tier support openings according to an embodiment of the present disclosure.
Figure 4B:
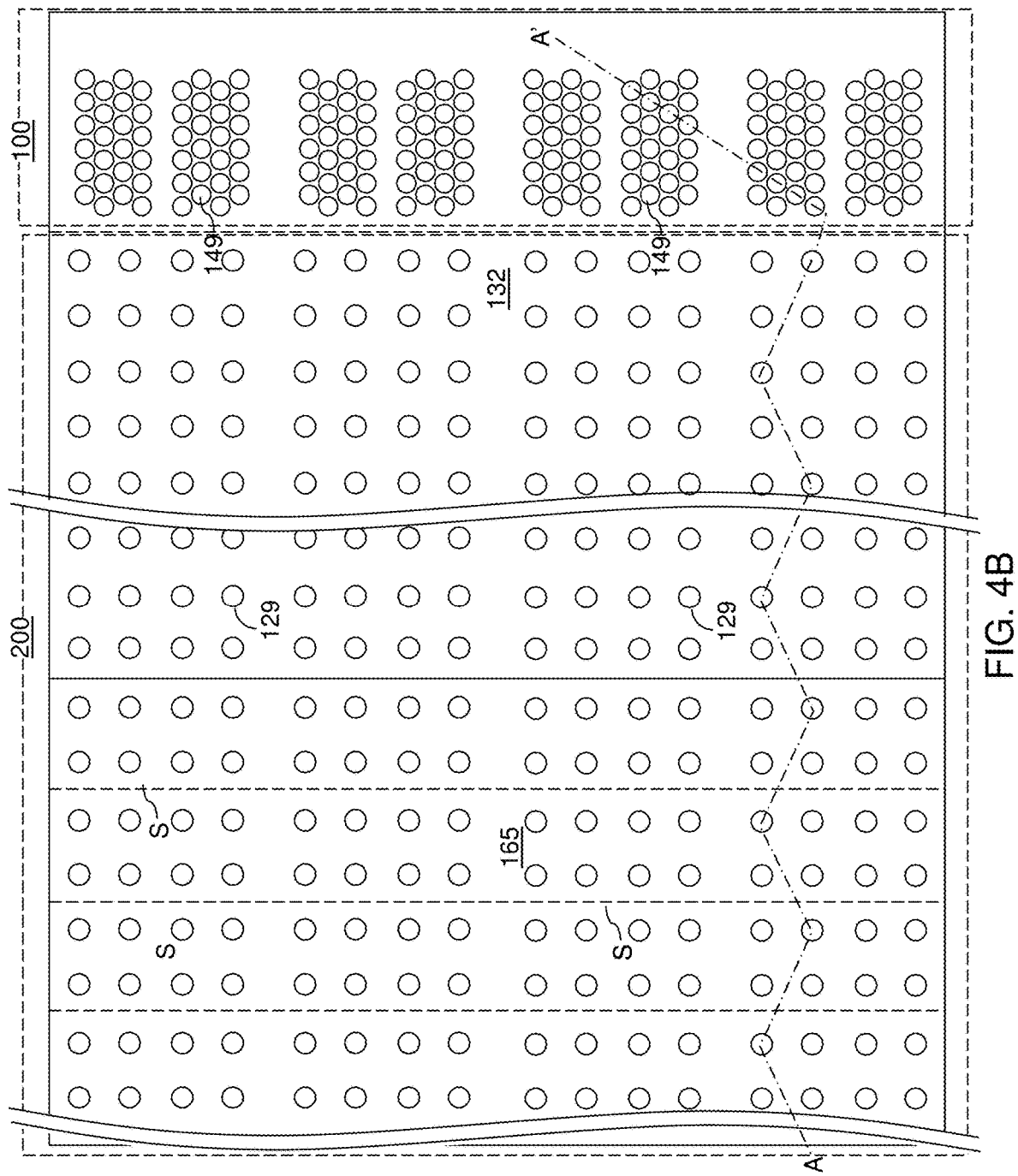
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
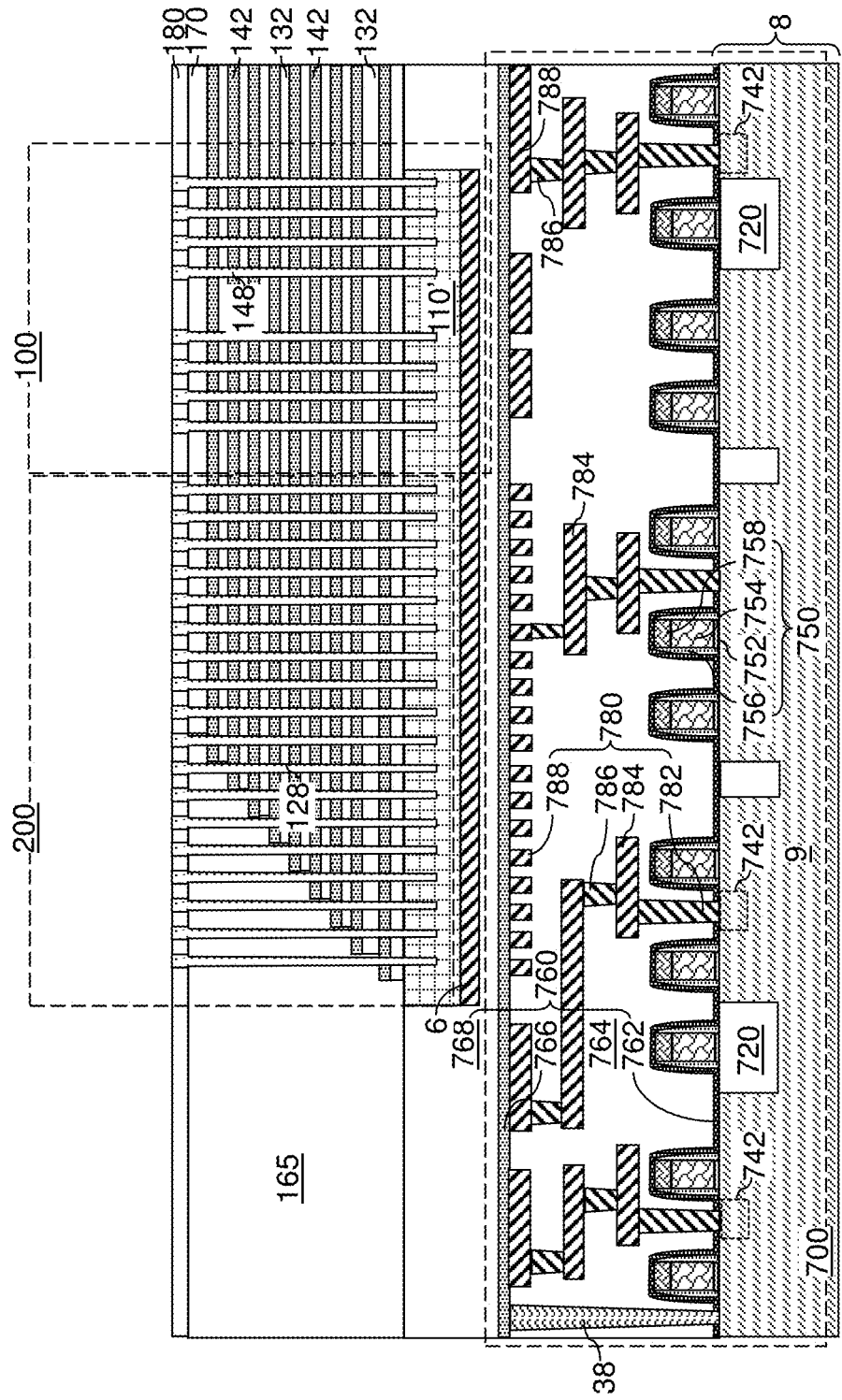
FIG. 5 is a vertical cross-sectional view of the exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
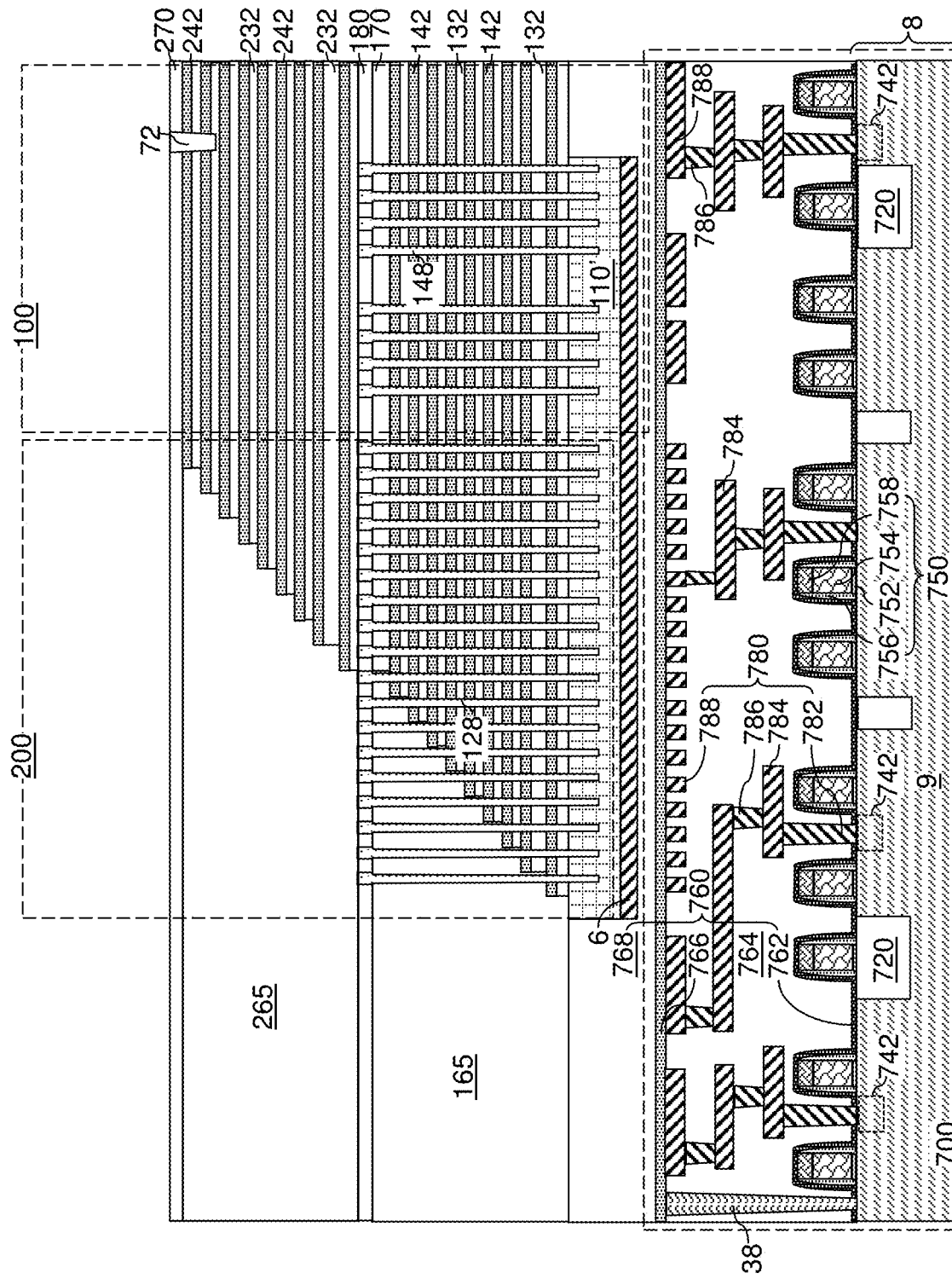
FIG. 6 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
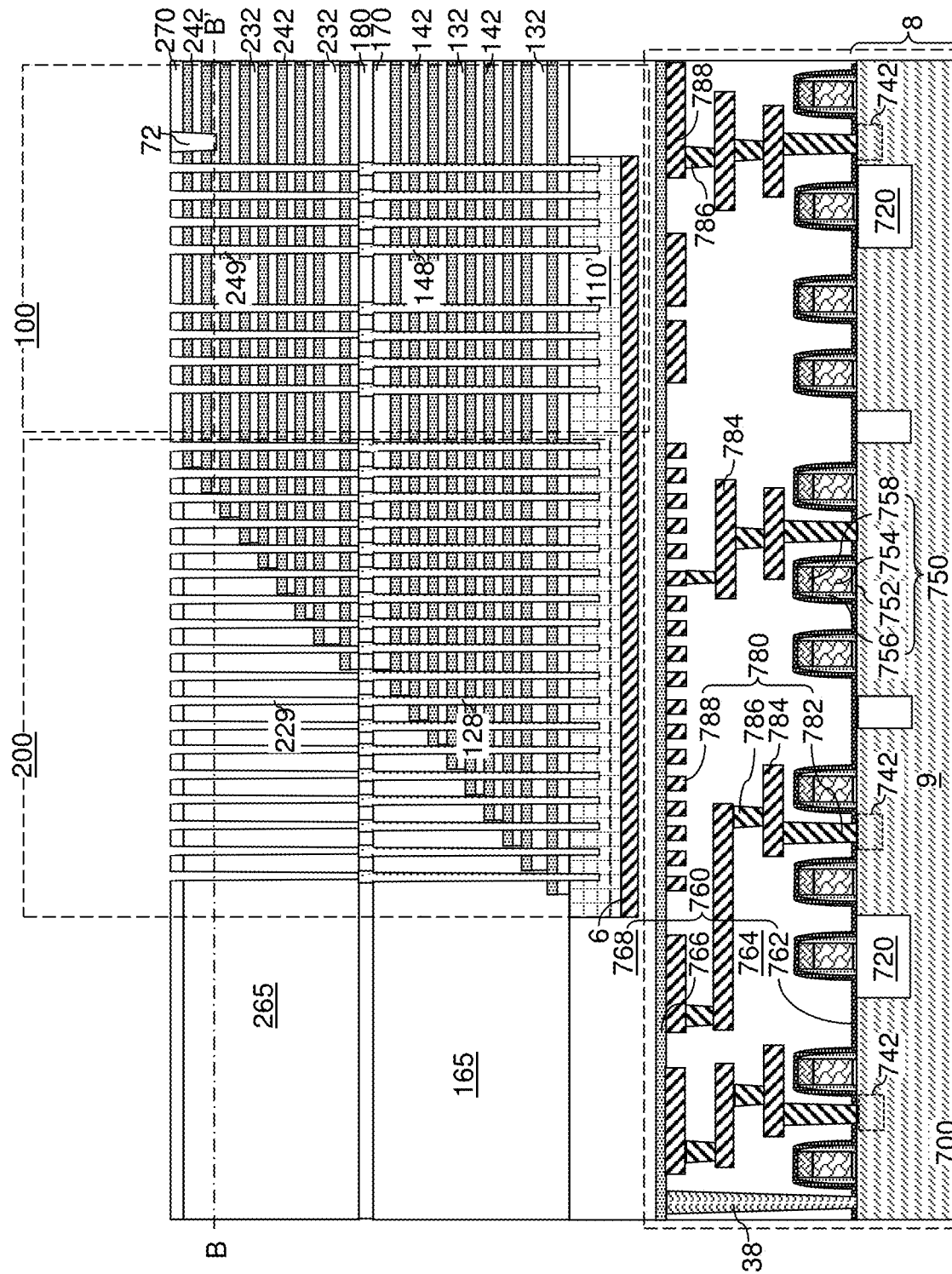
FIG. 7A is a vertical cross-sectional view of the exemplary structure after formation of second-tier memory openings and second-tier support openings according to an embodiment of the present disclosure.
Figure 7B:
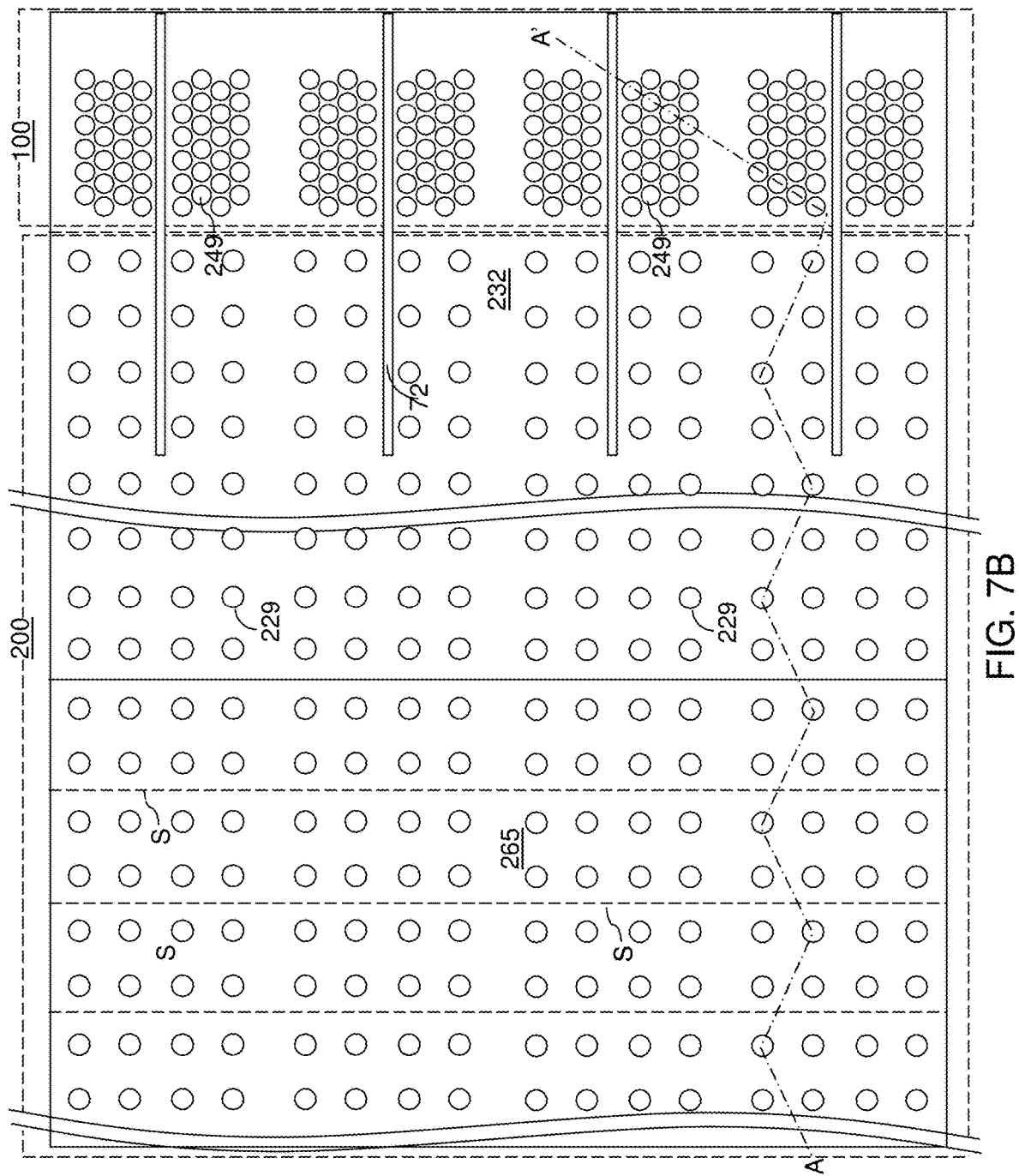
FIG. 7B is a horizontal cross-sectional view of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
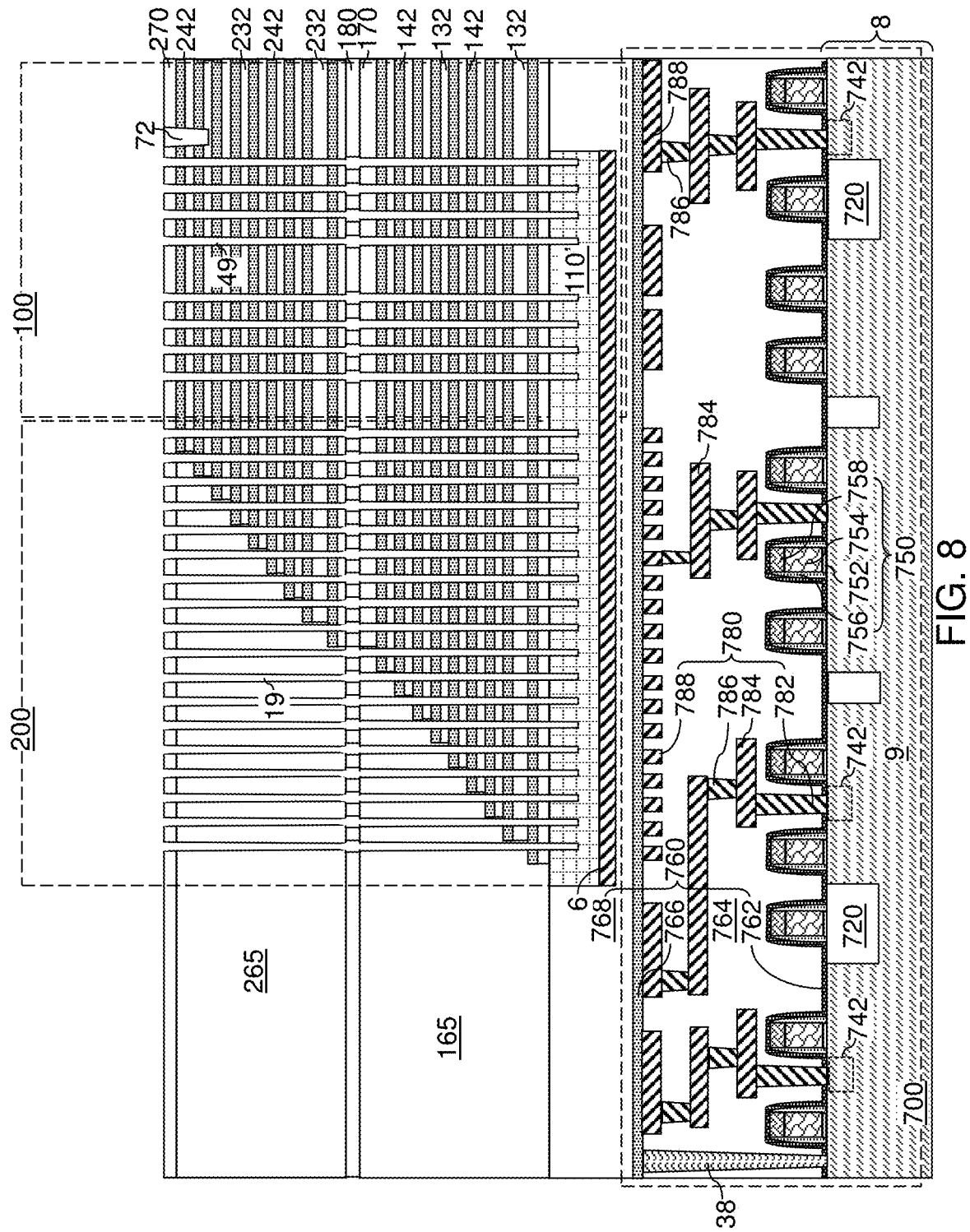
FIG. 8 is a vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a memory opening 49 in the first exemplary device structure of FIG. 8 is illustrated. The memory opening 49 extends through the first-tier structure and the second-tier structure.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
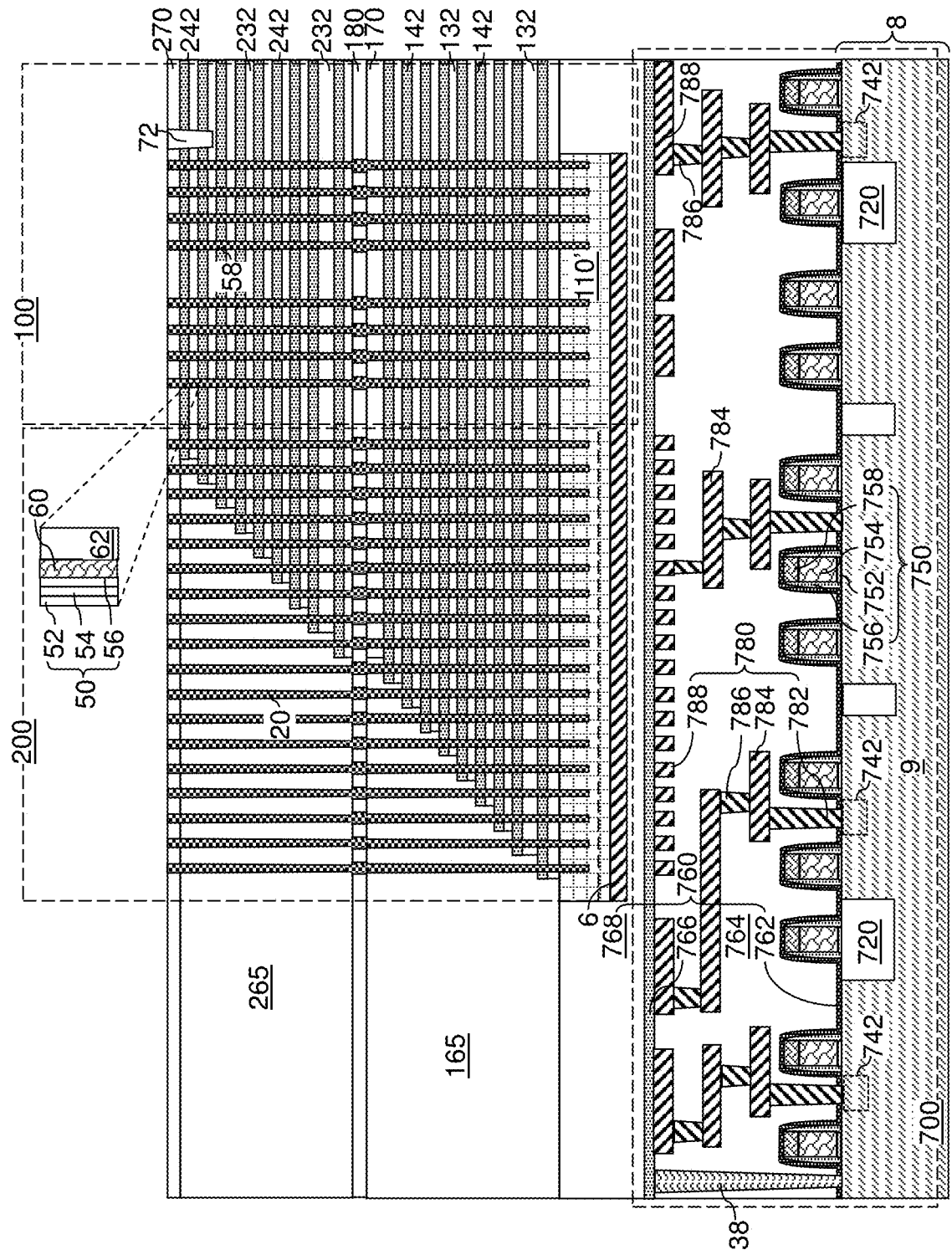
FIG. 10 is a vertical cross-sectional view of the exemplary structure after formation of memory opening fill structures and support pillar structures according to an embodiment of the present disclosure.

Referring to FIG. 10, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 11A:
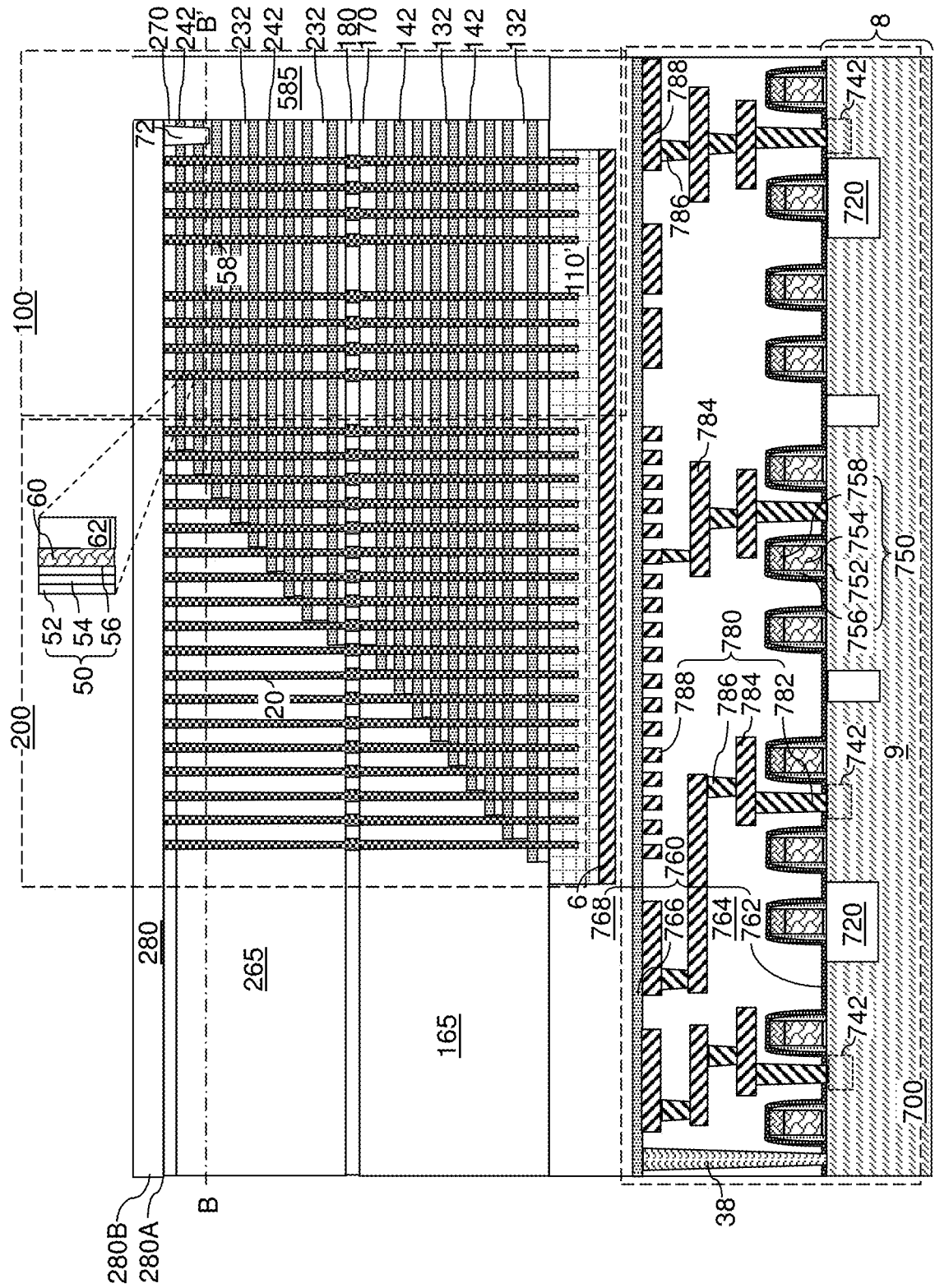
FIG. 11A is a vertical cross-sectional view of the exemplary structure after formation of pillar cavities according to an embodiment of the present disclosure.
Figure 11B:
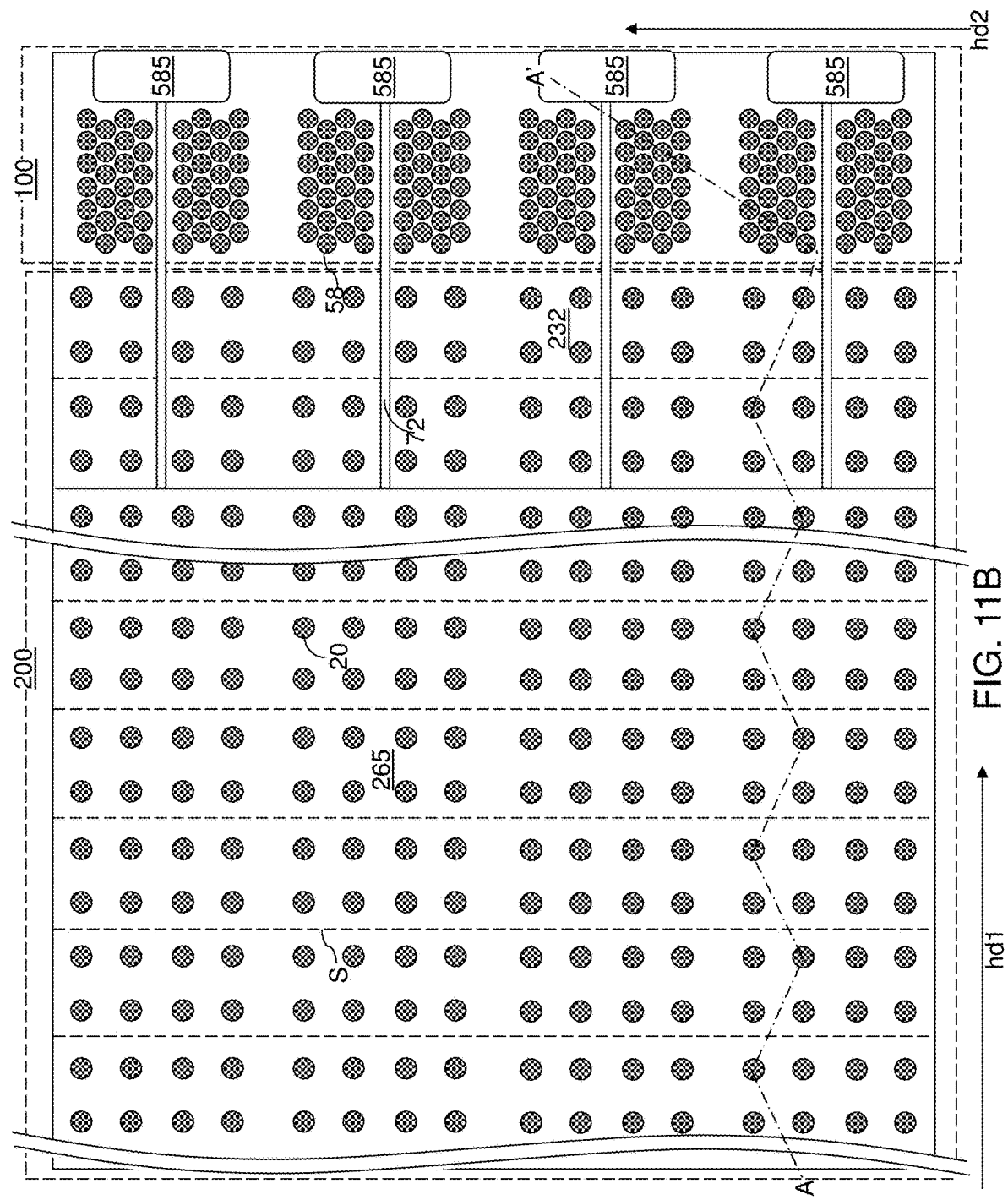
FIG. 11B is a horizontal cross-sectional view of the exemplary structure along the horizontal plane B-B' of FIG. 11A. The hinged vertical plane A-A' corresponds to the plane of the vertical cross-sectional view of FIG. 11A.

Referring to FIGS. 11A and 11B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used. Alternatively, the first contact-level dielectric layer 280 may include a dielectric diffusion barrier sublayer 280A, such as a silicon nitride and/or silicon carbonitride, and undoped silicate glass (i.e., silicon oxide overlayer) 280B.

A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 12:
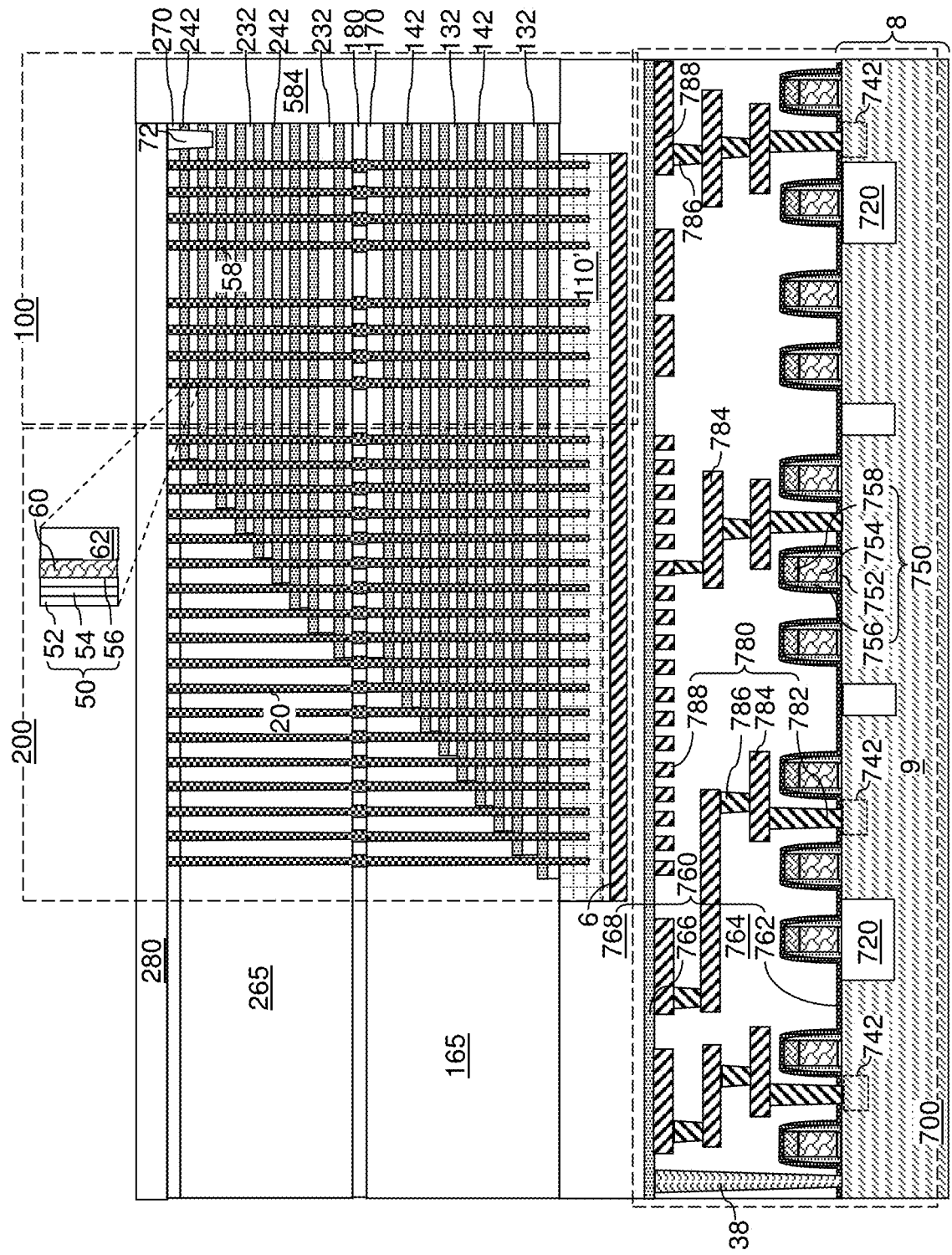
FIG. 12 is a vertical cross-sectional view of the exemplary structure after formation of dielectric pillar structures according to an embodiment of the present disclosure.

Referring to FIG. 12, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Figure 13A:
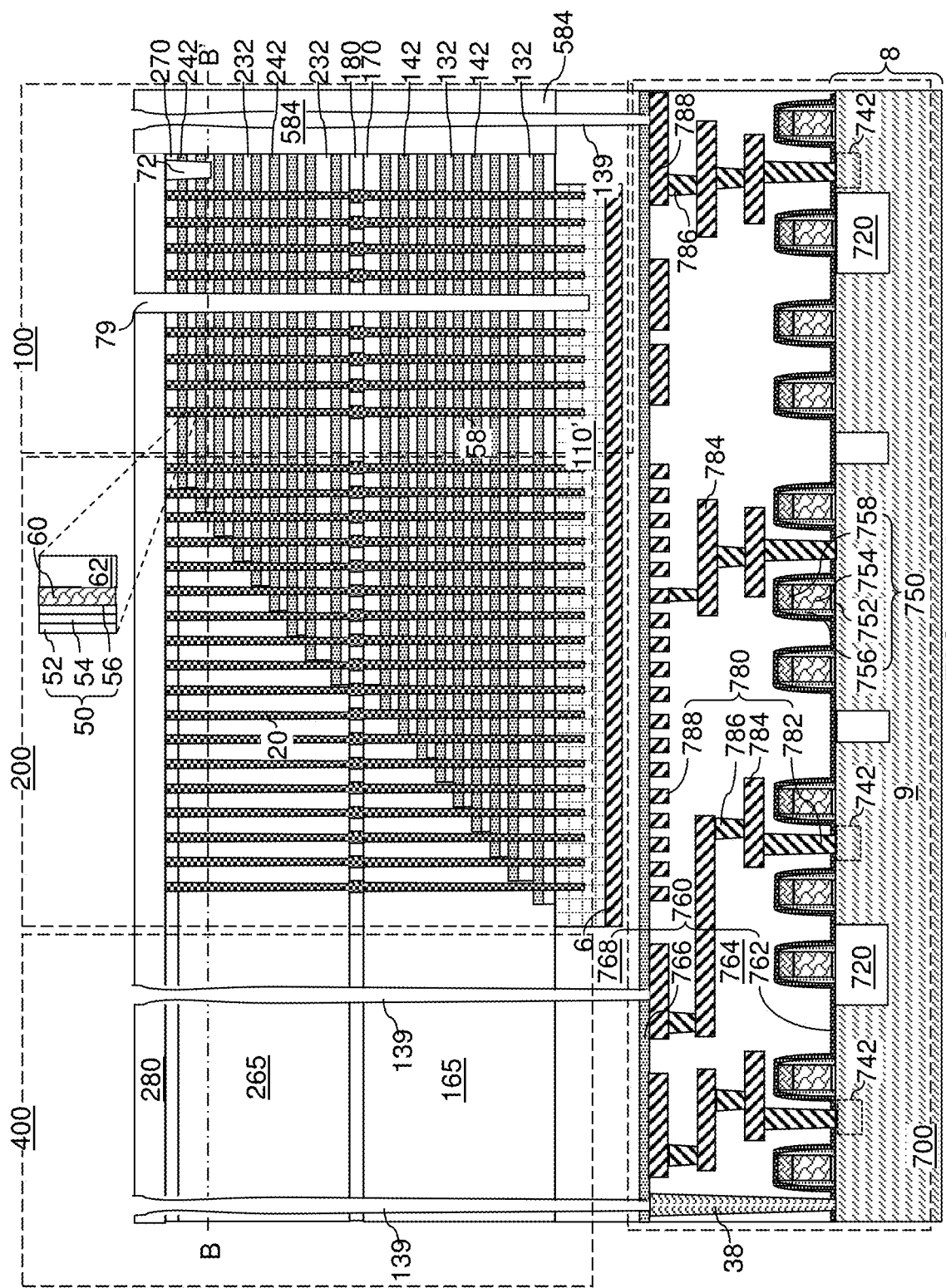
FIG. 13A is a vertical cross-sectional view of the exemplary structure after formation of backside trenches and through-memory-level via cavities according to an embodiment of the present disclosure.
Figure 13B:
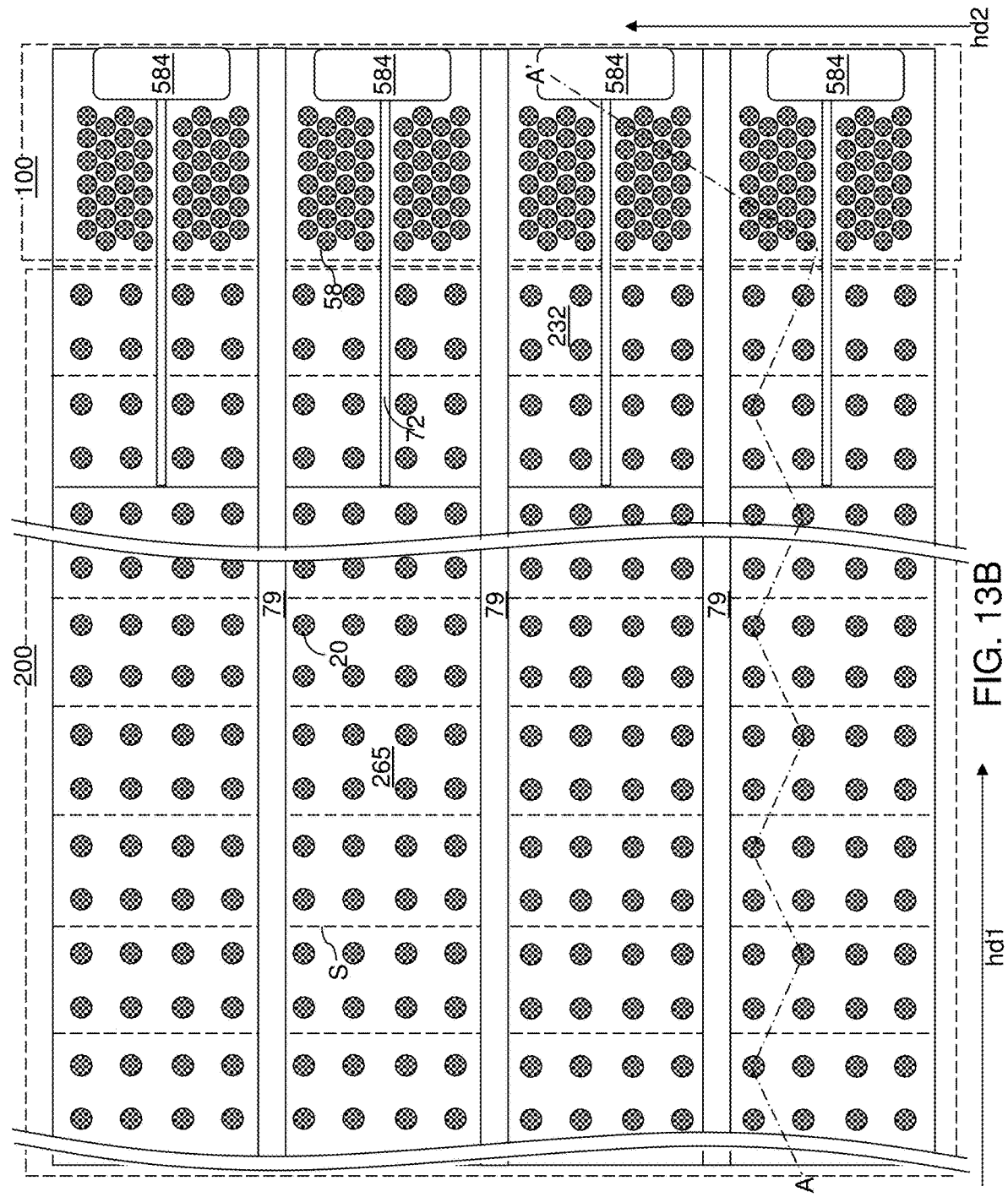
FIG. 13B is a horizontal cross-sectional view of the exemplary structure along the horizontal plane B-B' of FIG. 13A. The hinged vertical plane A-A' corresponds to the plane of the vertical cross-sectional view of FIG. 13A.

Referring to FIGS. 13A and 13B, a photoresist layer (not shown) can be applied over the first contact-level dielectric layer 280, and can be lithographically patterned to form openings therein. The openings in the photoresist layer can include elongated openings that extend along the first horizontal direction hd1 between clusters of memory opening fill structures 58. Further, the openings in the photoresist layer can include first discrete openings that are formed over the lower-level sacrificial via structures 38 and optional second discrete openings that are formed over a respective one of the landing-pad-level metal line structures 788. The first discrete openings and/or the second discrete openings may be formed within the areas of the peripheral region 400 and/or within the areas of the interconnection region dielectric fill material portions 584.

An anisotropic etch process can be performed to transfer the pattern of the openings in the photoresist layer through underlying dielectric material portions down to a respective etch stop structure. The etch stop structures can include the lower-level sacrificial via structures 38, the landing pad-level metal line structures 788, and the in-process source-level material layers 110'. Generally, the etch chemistry of the anisotropic etch process may be selected to etch the dielectric materials of the first contact-level dielectric layer 280, the retro-stepped dielectric material portions (165, 265), the insulating cap layers (270, 170), the inter-tier dielectric layer 180, the at least one second dielectric layer 768, and optionally the interconnection region dielectric fill material portions 584 (in case the anisotropic etch process etches via cavities through the interconnection region dielectric fill material portions 584). The chemistry of the anisotropic etch process can be selected such that a terminal step of the anisotropic etch process etches into the in-process source-level material layers 110' and stops on one of the layers within the in-process source-level material layers 110' (such as the lower source-level semiconductor layer 112).

The anisotropic etch process formed backside trenches 79 by transferring the pattern of the elongated openings in the photoresist layer (not shown) through the first contact-level dielectric layer 280, the second-tier structure (232, 242, 270, 265, 72), and the first-tier structure (132, 142, 170, 165), and into the in-process source-level material layers 110'. Portions of the first contact-level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Further, the anisotropic etch process forms through-memory-level via cavities 139 by transferring the pattern of the discrete openings in the photoresist layer through the first contact-level dielectric layer 280, the second-tier structure (232, 242, 270, 265, 72), the first-tier structure (132, 142, 170, 165), and the at least one second dielectric layer 768. A top surface of a lower-level sacrificial via structure 38 or a top surface of a landing pad-level metal line structure 788 can be physically exposed at the bottom of each of the through-memory-level via cavities 139. The sidewalls of the through-memory-level via cavities 139 may include various types of curvature (such as at least one concave curvature and/or at least one convex curvature) in vertical cross-sectional views due to differences in the material composition of the various dielectric materials in the first contact-level dielectric layer 280, the second-tier structure (232, 242, 270, 265, 72), the first-tier structure (132, 142, 170, 165), and the at least one second dielectric layer 768.

Figure 14:
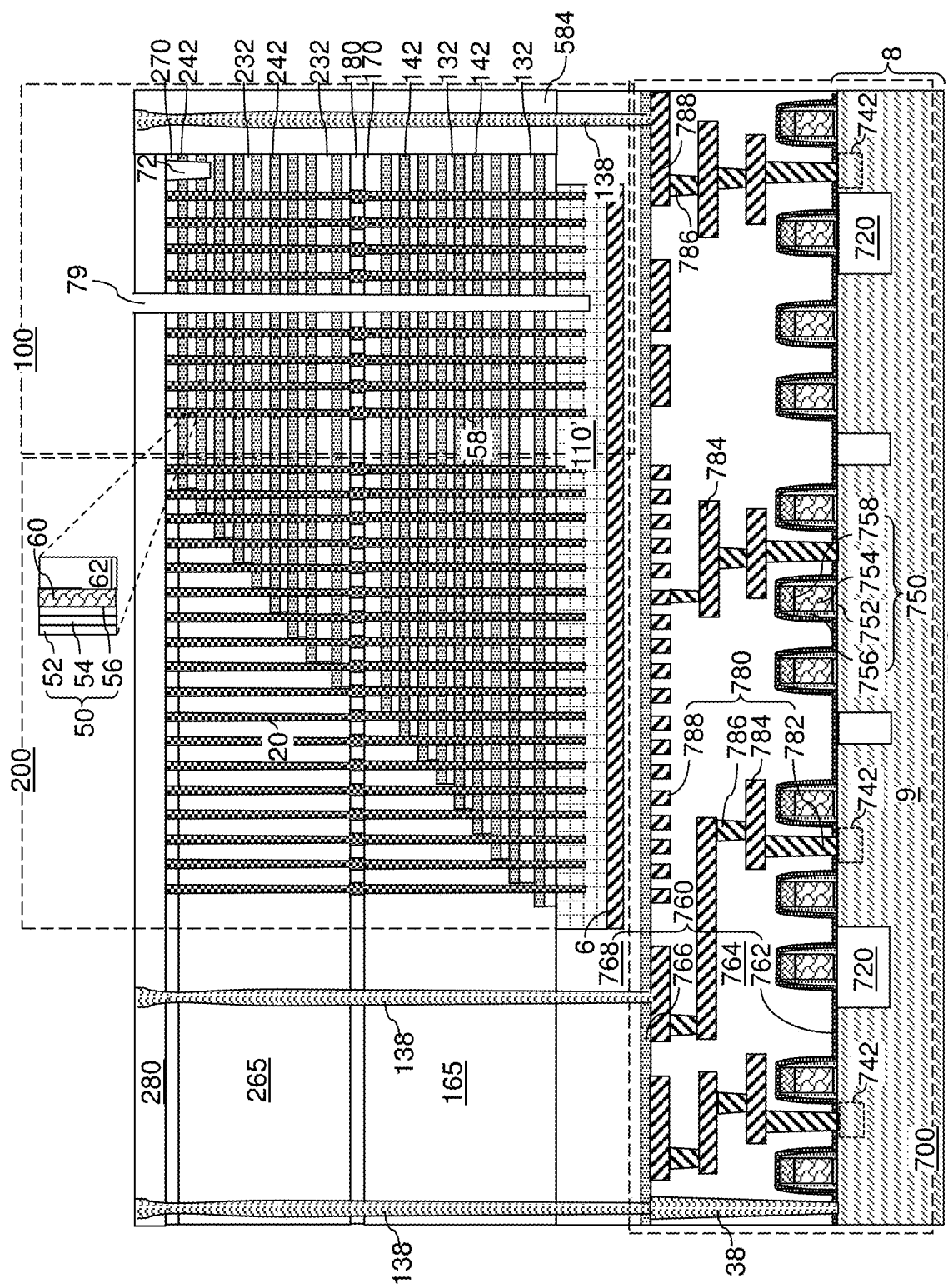
FIG. 14 is a vertical cross-sectional view of the exemplary structure after formation of sacrificial connection via fill structures and backside trenches according to an embodiment of the present disclosure.

Referring to FIG. 14, a sacrificial fill material is deposited in each of the through-memory-level via cavities 139 and the backside trenches 79. The sacrificial fill material comprises a material that may be removed selective to the various dielectric materials in the first contact-level dielectric layer 280, the second-tier structure (232, 242, 270, 265, 72), the first-tier structure (132, 142, 170, 165), and the at least one second dielectric layer 768. For example, the sacrificial fill material may comprise a semiconductor material a semiconductor material (such as amorphous or polycrystalline silicon, germanium, or silicon-germanium, a dielectric material (such as borosilicate glass or organosilicate glass), a carbon-based material (such as amorphous carbon or diamond-like carbon), or a polymer material (such as a silicon-based polymer material). Excess portions of the sacrificial fill material can be removed from above the horizontal plane including the top surface of the first contact-level dielectric layer 280 by a planarization process such as a recess etch process. Each remaining portion of the sacrificial fill material filling a respective one of the through-memory-level via cavities 139 constitutes a sacrificial connection via fill structure 138. Generally, at least one sacrificial connection via fill structure 138 can be formed through at least one dielectric material portion directly on a top surface of a lower-level sacrificial via structure 38. Optionally, additional sacrificial connection via structures 138 may be formed through at least one dielectric material portion directly on a top surface of a respective one of the landing-pad-level metal line structures 788. Remaining portions of the sacrificial fill material filling the backside trenches 79 comprise sacrificial backside trench fill portions.

A photoresist layer (not shown) can be applied over the exemplary structure, and can be lithographically patterned to cover the sacrificial connection via structures 138 without covering the sacrificial backside trench fill portions. A selective etch process can be performed to remove the sacrificial backside trench fill portions from the backside trenches 79 without removing the materials of the dielectric materials in the first contact-level dielectric layer 280, the second-tier structure (232, 242, 270, 265, 72), and the first-tier structure (132, 142, 170, 165). Voids are formed within the volumes of the backside trenches 79. The photoresist layer can be subsequently removed, for example, by ashing.

Figure 15A:
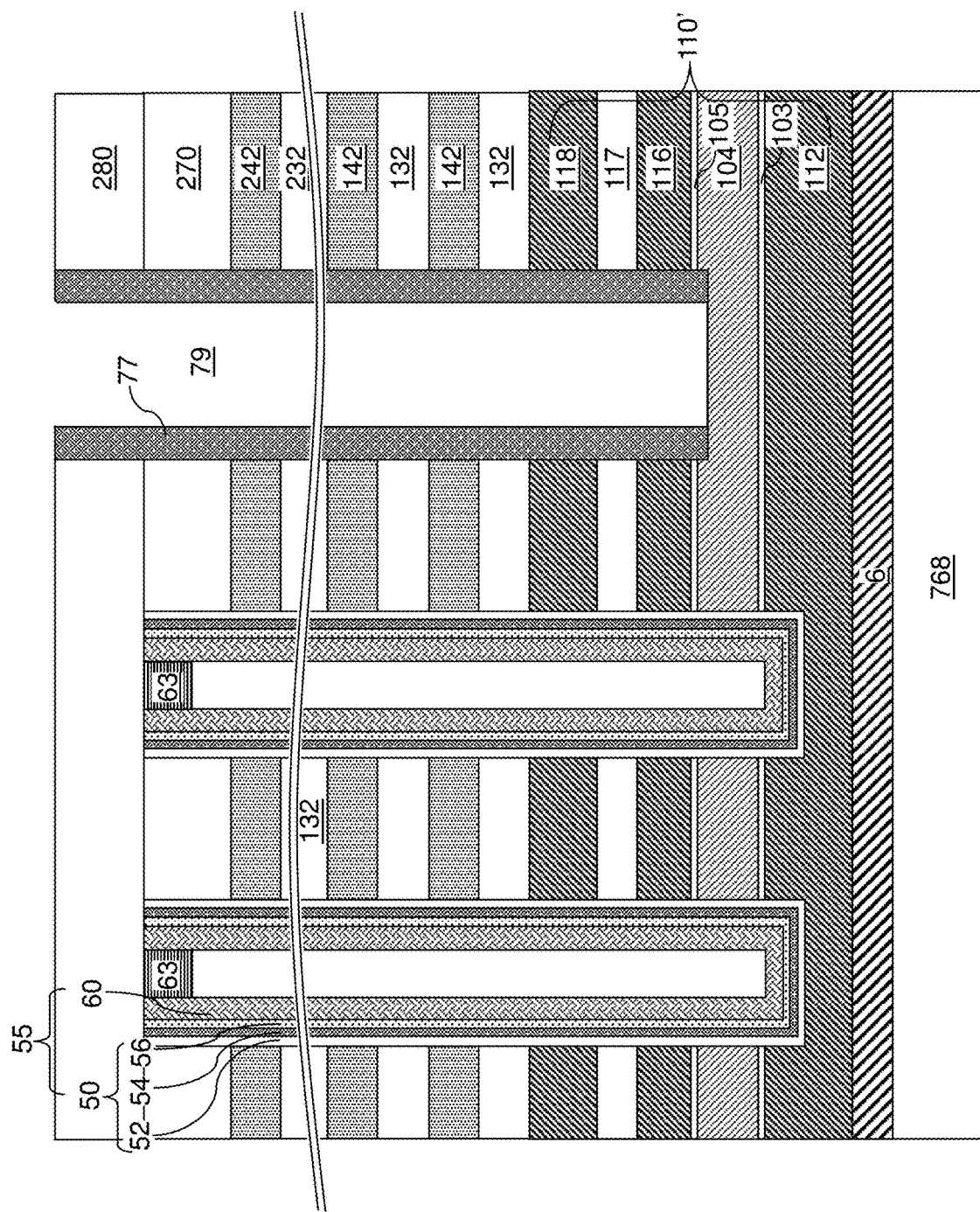
FIGS. 15A-15E illustrate sequential vertical cross-sectional views of memory opening fill structures and a backside trench during formation of source-level material layers according to an embodiment of the present disclosure.

Referring to FIG. 15A, a backside trench spacer 77 may be formed on sidewalls of each backside trench 79. For example, a conformal spacer material layer may be deposited in the backside trenches 79 and over the first contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 15B:
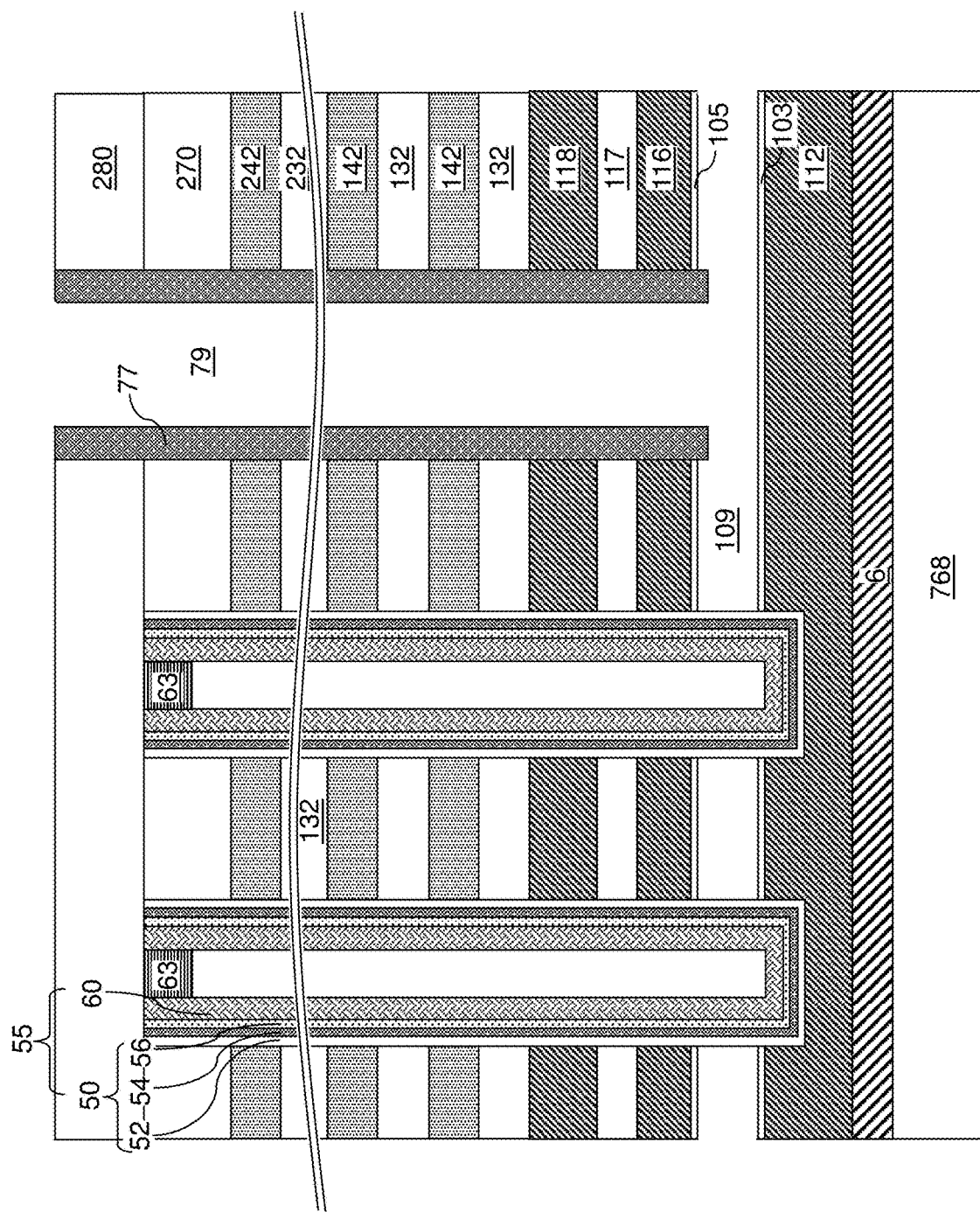

Referring to FIG. 15B, an etchant that etches the material of the source-level sacrificial layer 104 selective to the materials of the first alternating stack (132, 142), the second alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 15C:
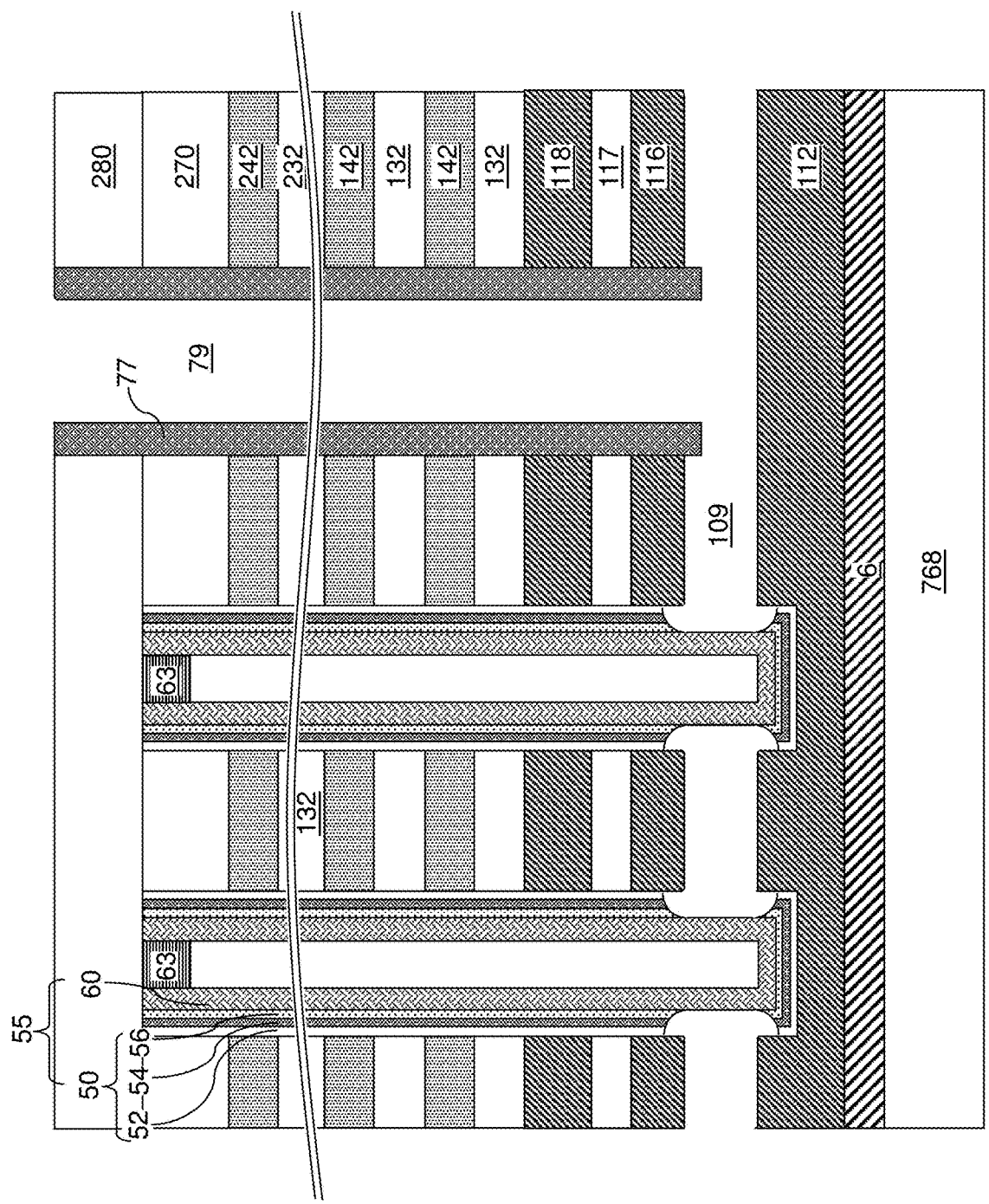

Referring to FIG. 15C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 15D:
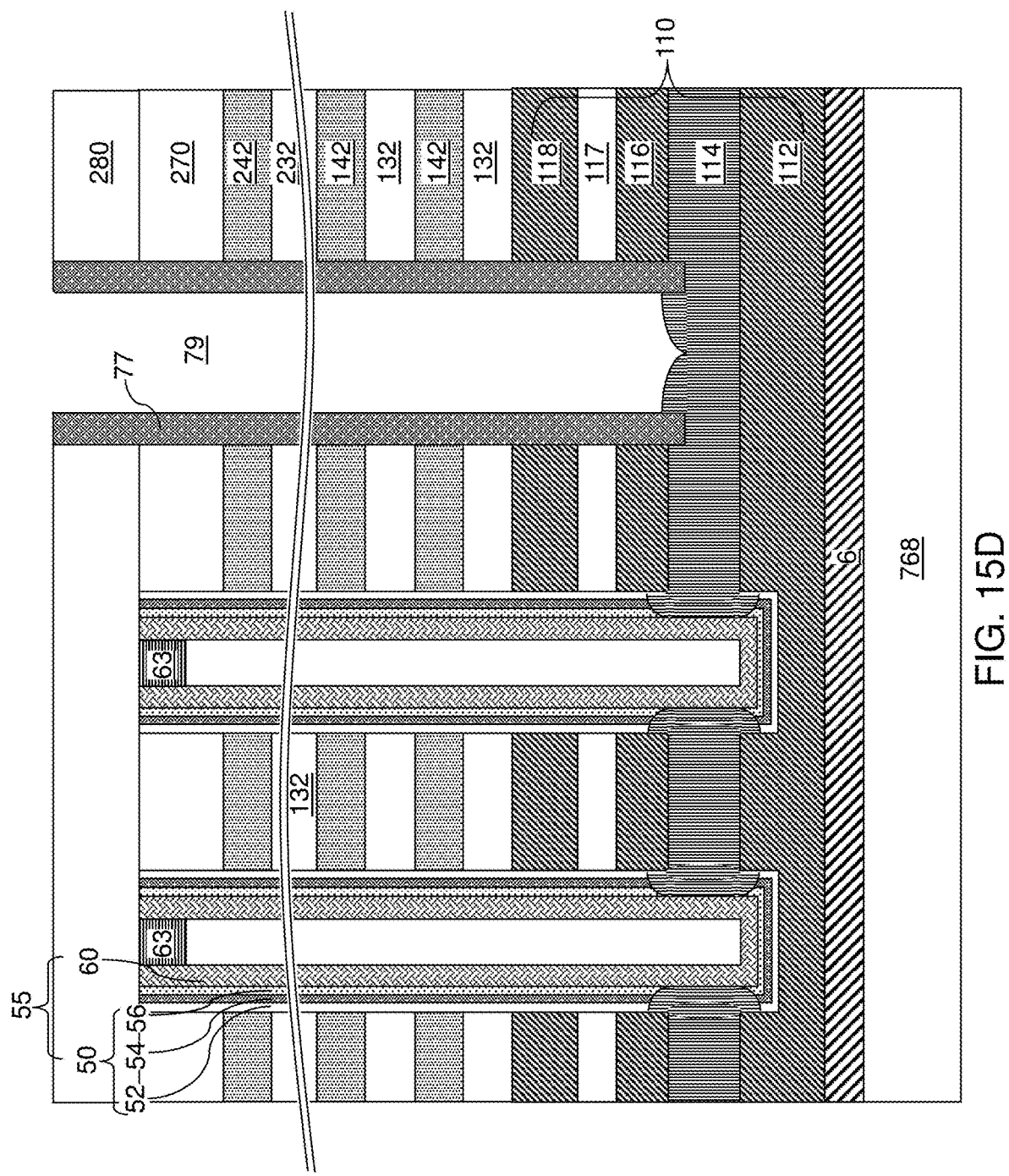

Referring to FIG. 15D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 15E:
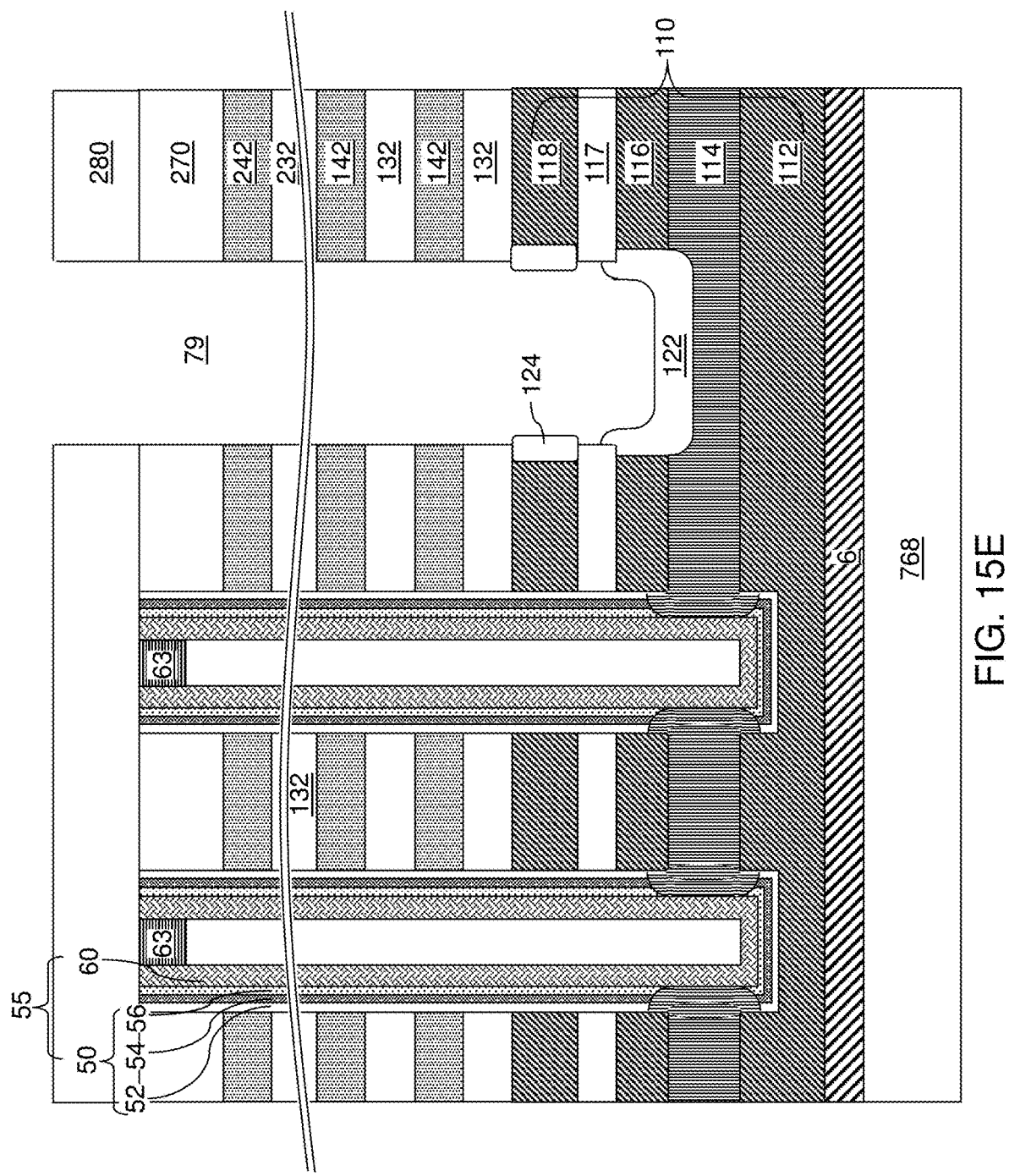
Figure 16:
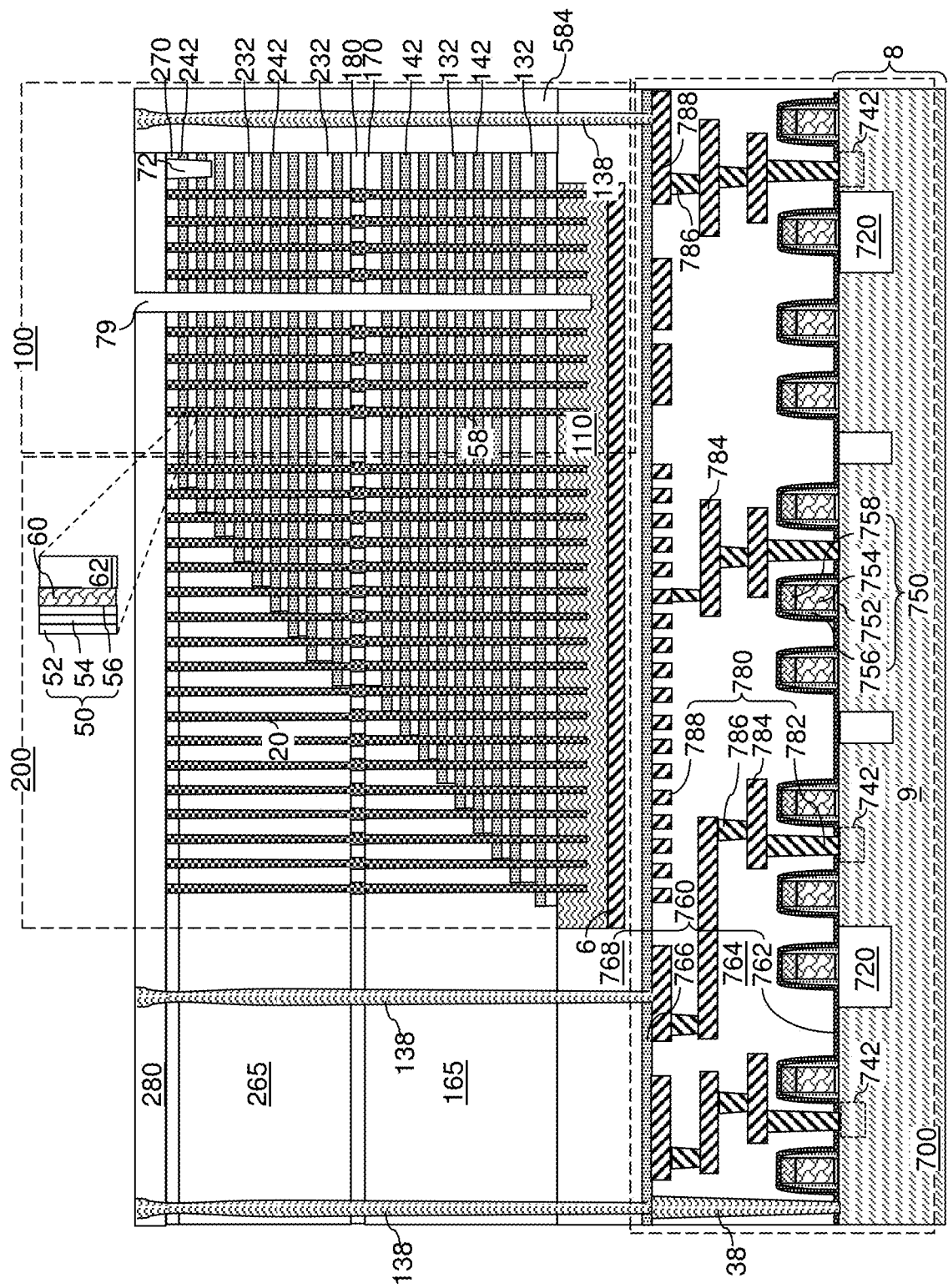
FIG. 16 is a vertical cross-sectional view of the exemplary structure after formation of source-level material layers according to an embodiment of the present disclosure.

Referring to FIGS. 15E and 16, the backside trench spacers 77 may be removed selective to the insulating layers (132, 232), the first and second insulating cap layers (170, 270), the first contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the first contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 17:
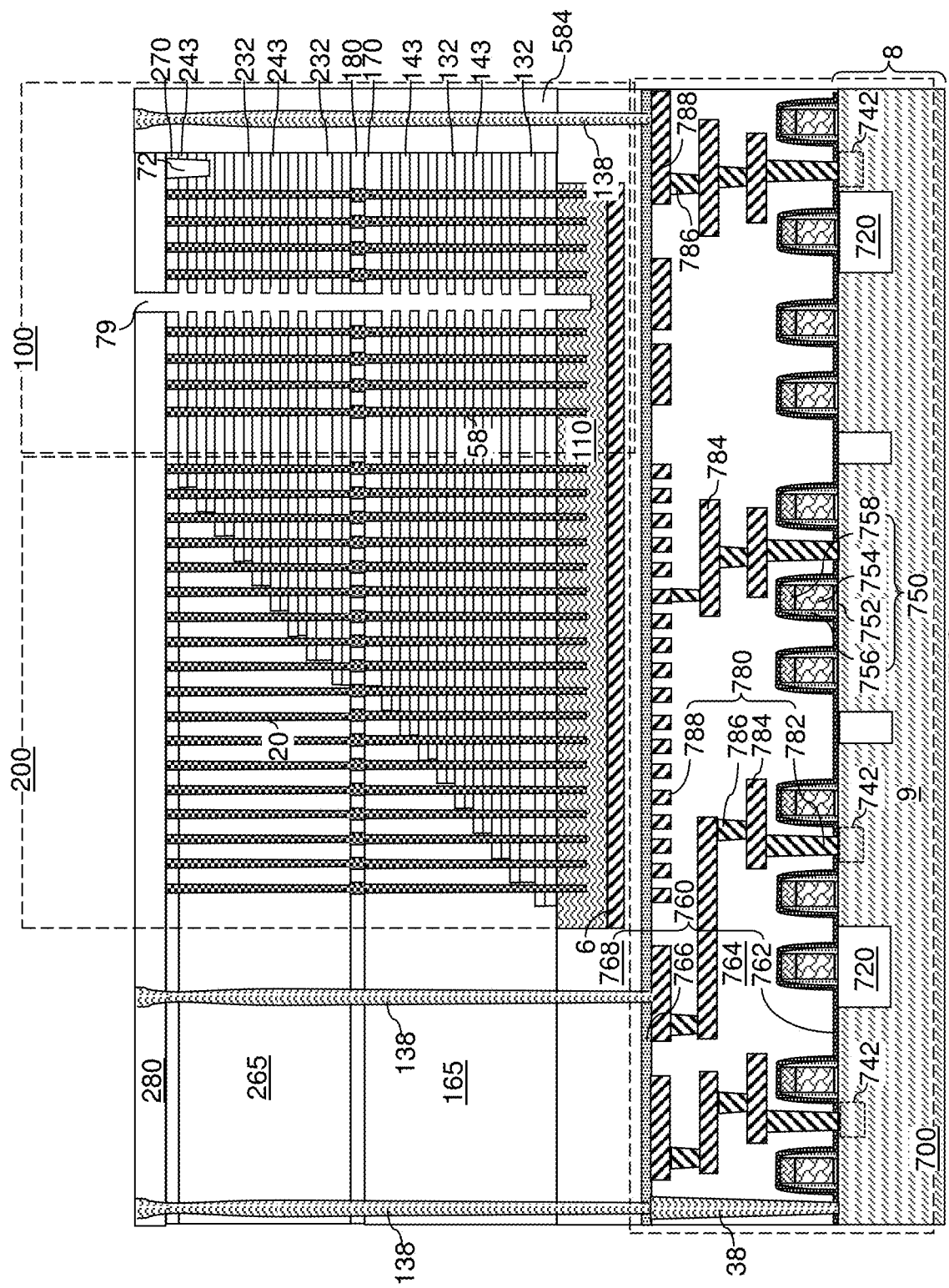
FIG. 17 is a vertical cross-sectional view of the exemplary structure after formation of backside recesses according to an embodiment of the present disclosure.
Figure 18A:
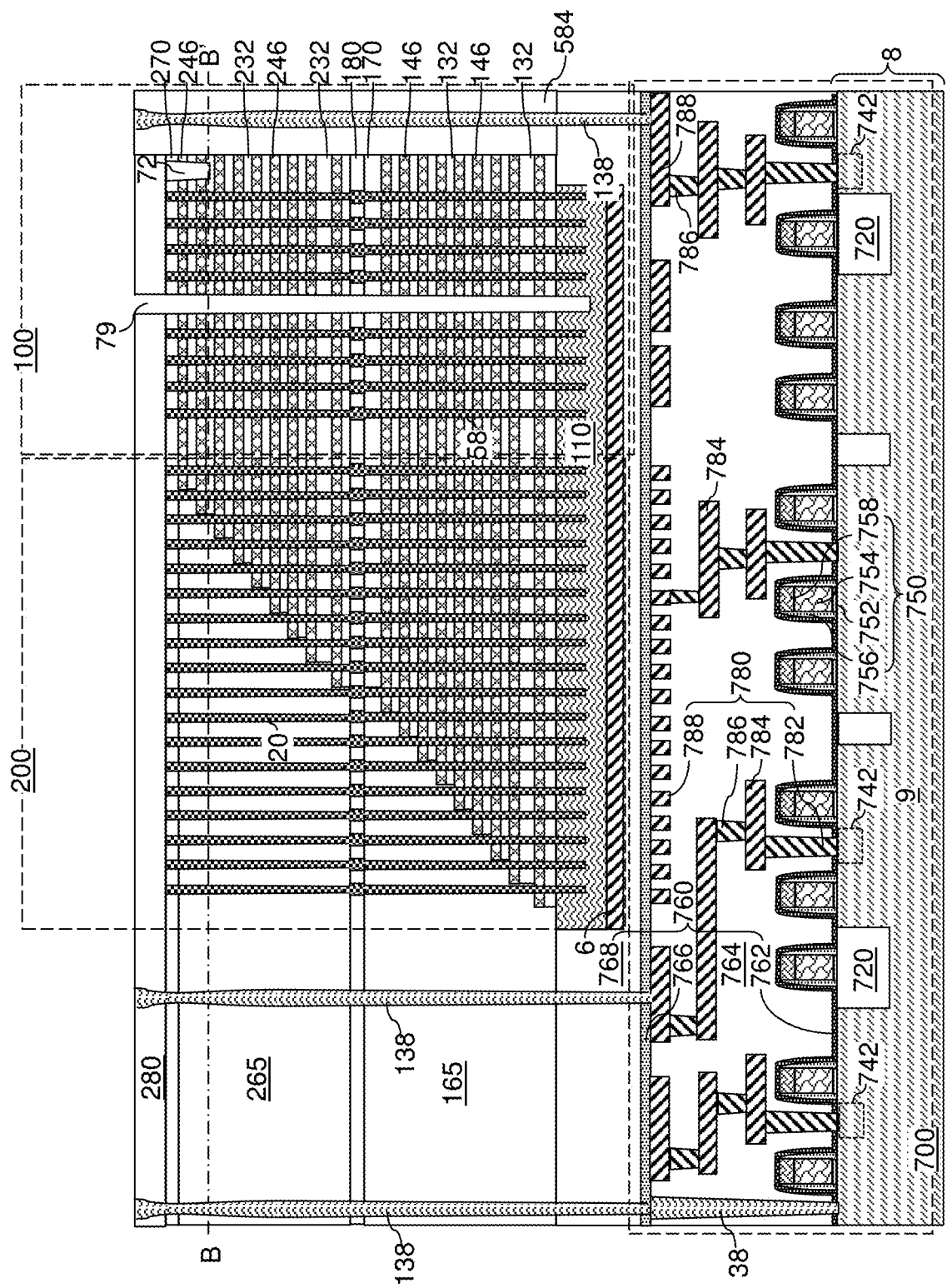
FIG. 18A is a vertical cross-sectional view of the exemplary structure after formation of electrically conductive layers according to an embodiment of the present disclosure.

Referring to FIG. 17, the sacrificial material layers (142, 242) are removed selective to the insulating layers (132, 232), the first and second insulating cap layers (170, 270), the first contact-level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Referring to FIGS. 18A-18E, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Figure 19A:
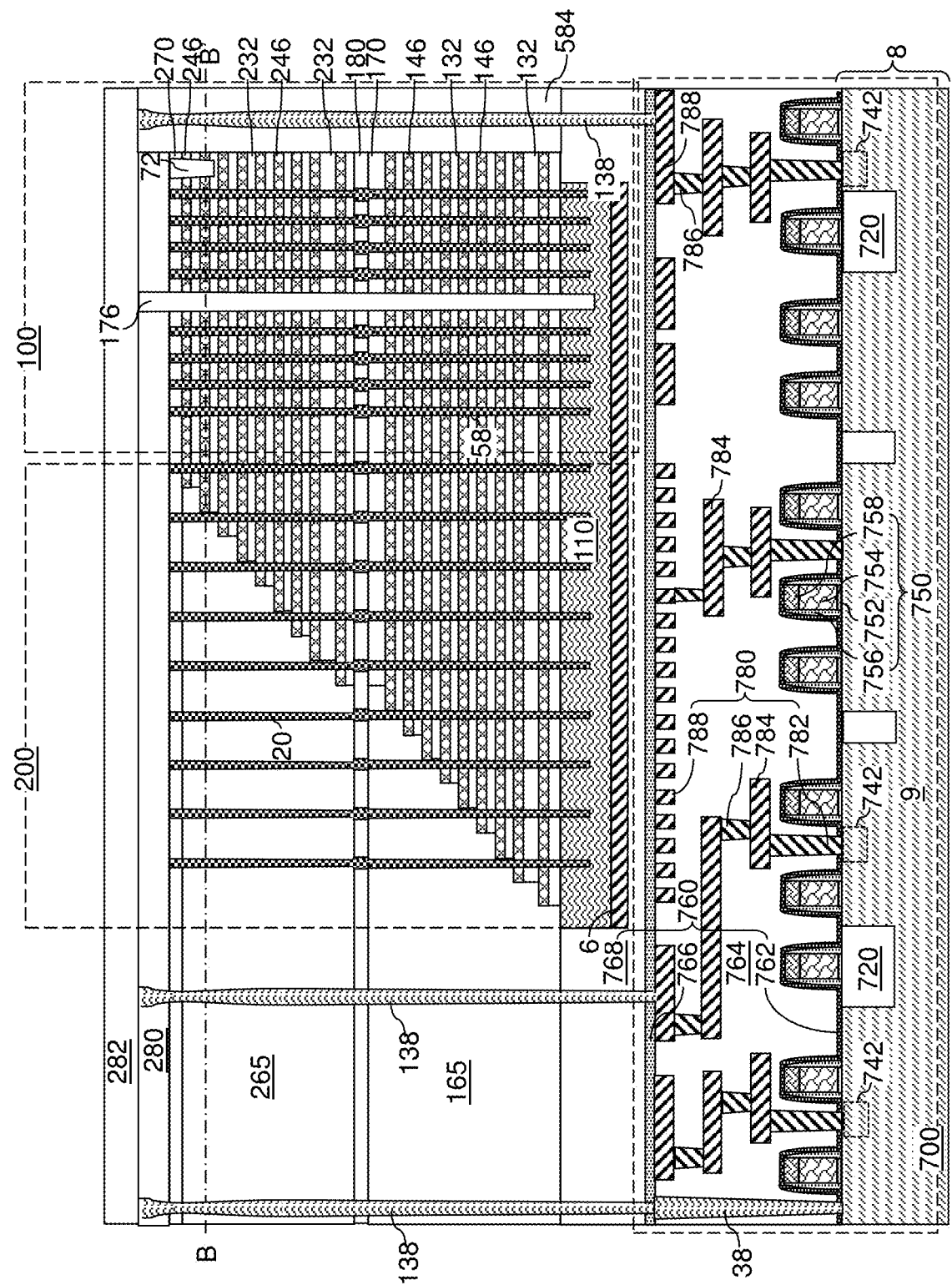
FIG. 19A is a vertical cross-sectional view of the exemplary structure after formation of backside trench fill structures in the backside trenches according to an embodiment of the present disclosure.
Figure 19B:
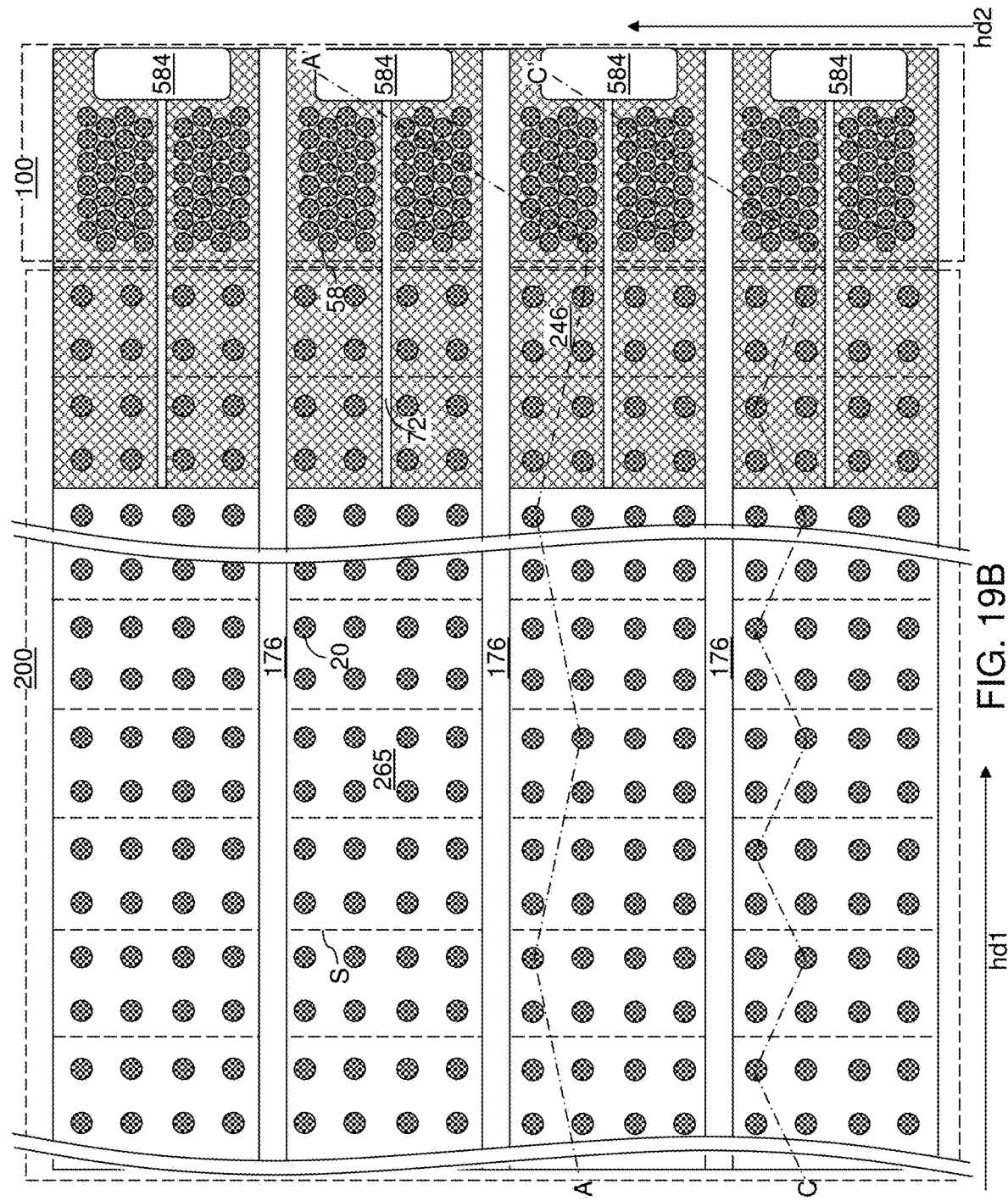
FIG. 19B is a horizontal cross-sectional view of the exemplary structure along the horizontal plane B-B' of FIG. 19A. The hinged vertical plane A-A' corresponds to the plane of the vertical cross-sectional view of FIG. 19A.
Figure 19C:
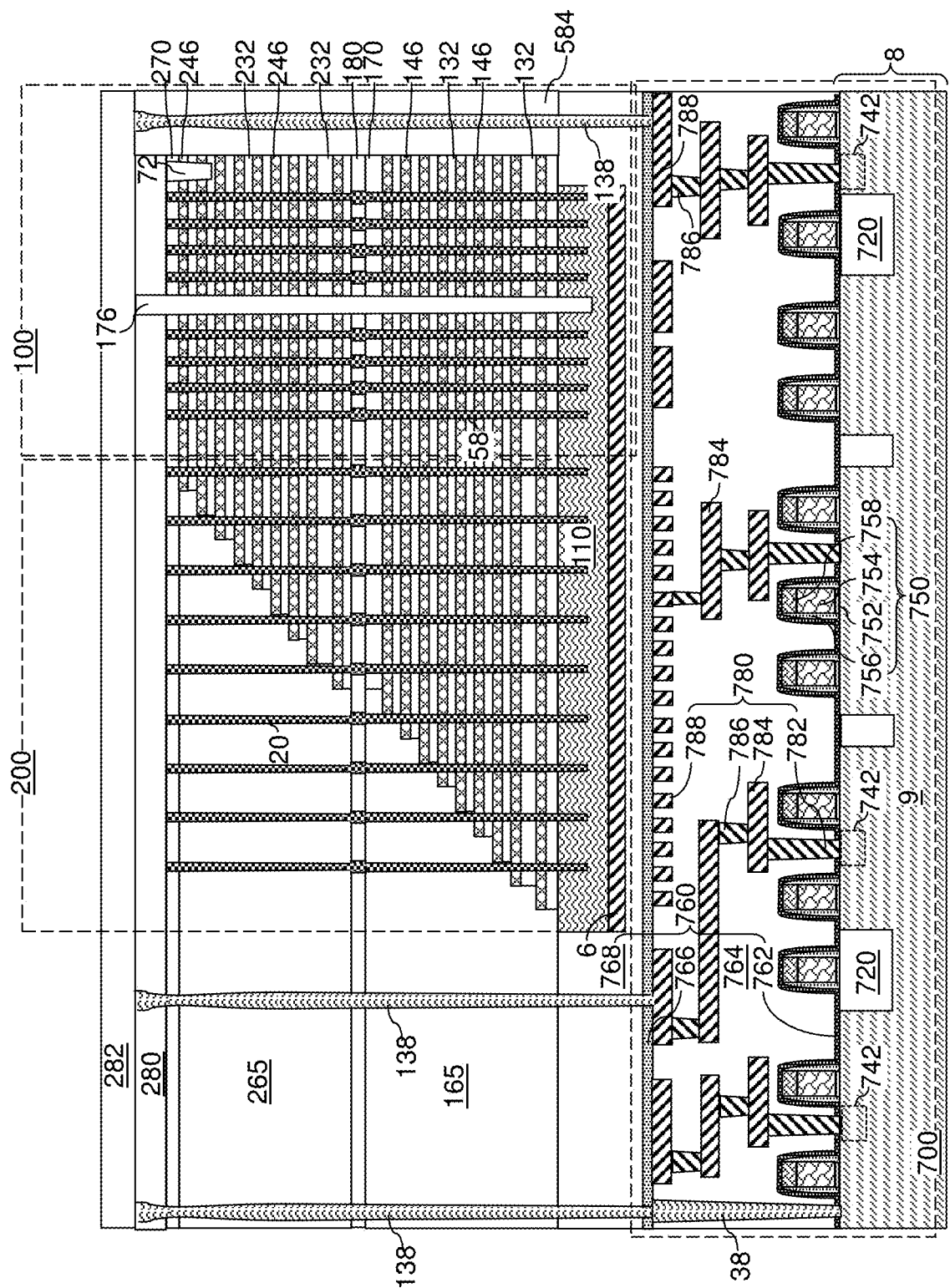
FIG. 19C is a vertical cross-sectional view of the exemplary structure along the vertical plane C-C' of FIG. 19B.

Referring to FIGS. 19A-19C, a dielectric fill material may be conformally deposited in the backside trenches 79 and over the first contact-level dielectric layer 280 by a conformal deposition process. The dielectric fill material may include, for example, silicon oxide. Vertically-extending portions of the deposited dielectric fill material that fill the backside trenches 79 comprise dielectric backside trench fill structures 176, which are dielectric wall structures that laterally extend along the first horizontal direction hd1. Horizontally-extending portions of the deposited dielectric fill material that overlie the first contact-level dielectric layer 280 comprise a second contact-level dielectric layer 282. The second contact-level dielectric layer 282 includes a dielectric material such as silicon oxide, and may have a thickness in a range from 100 nm to 600 nm, although lesser and greater thicknesses may also be used.

Figure 20A:
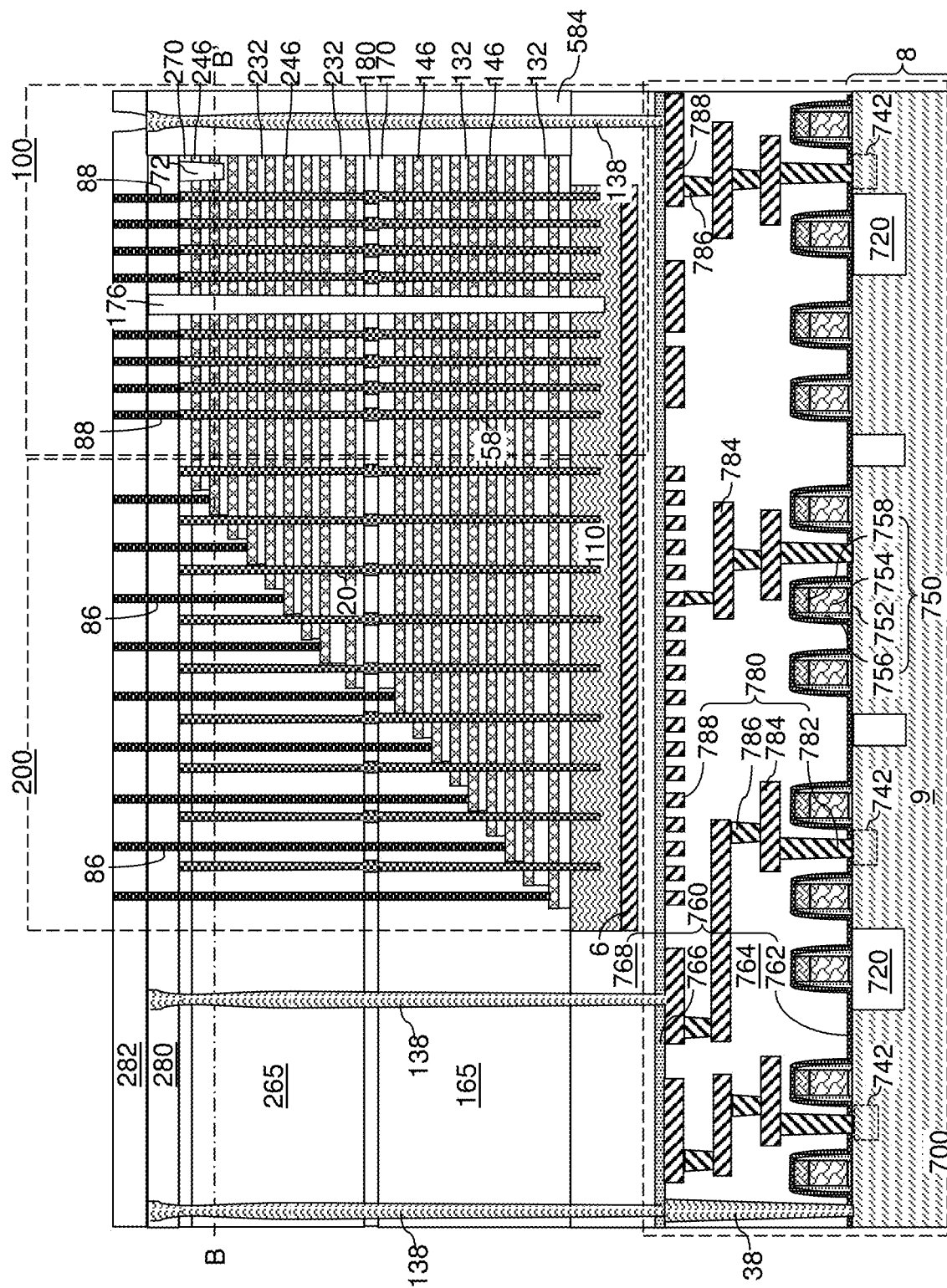
FIG. 20A is a vertical cross-sectional view of the exemplary structure after formation of a second contact-level dielectric layer and various contact via structures according to an embodiment of the present disclosure.

Referring to FIGS. 20A and 20B, a photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 21:
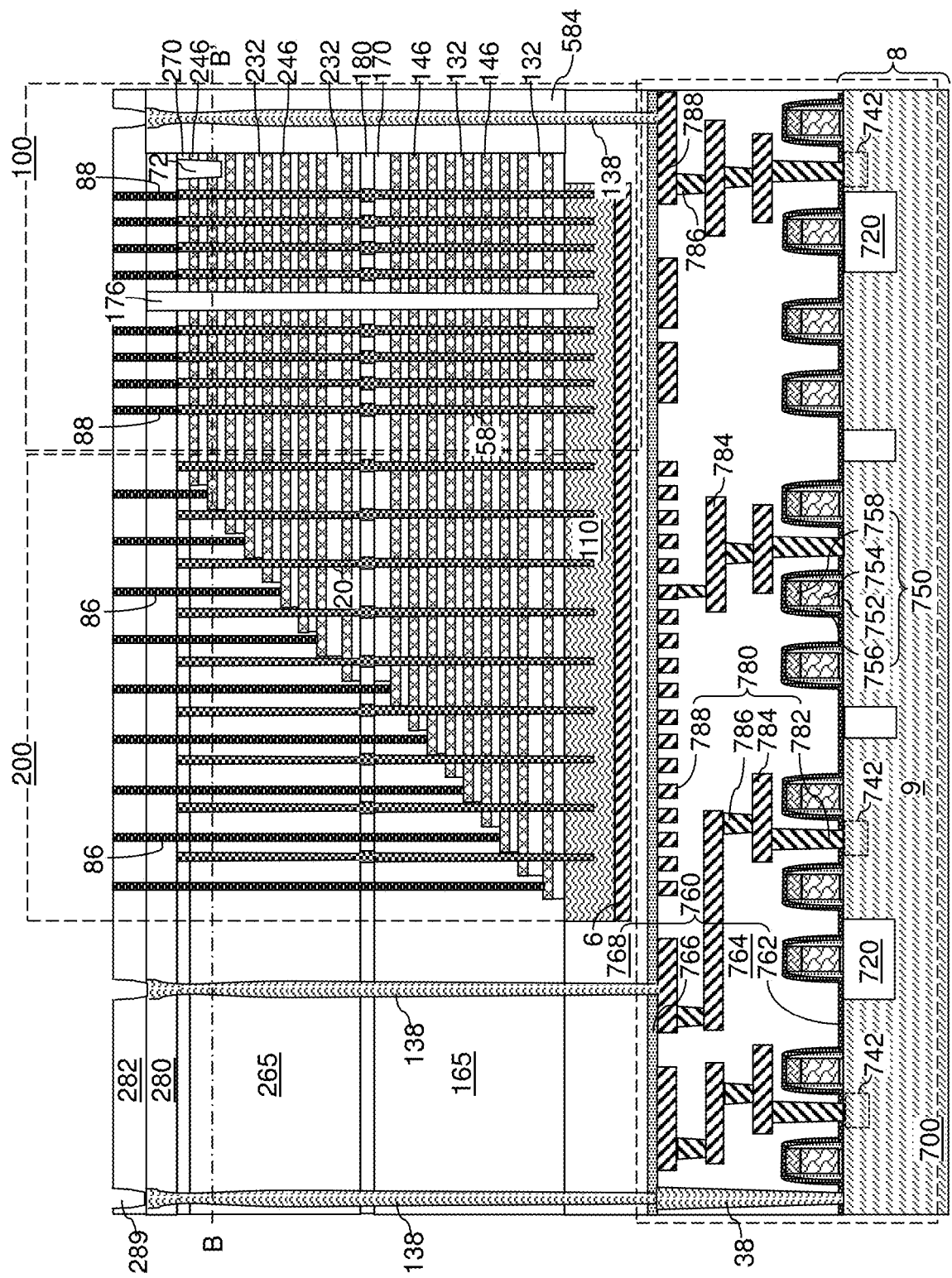
FIG. 21 is a vertical cross-sectional view of the exemplary structure after formation of through-memory-level via structures and upper metal line structures according to an embodiment of the present disclosure.

Referring to FIG. 21, a photoresist layer (not shown) can be applied over the second contact-level dielectric layer 282, and can be lithographically patterned to form openings over areas of the sacrificial connection via fill structures 138. An anisotropic etch process can be formed to transfer the pattern of the openings in the photoresist layer through the second contact-level dielectric layer 282. Upper via cavities 289 can be formed through the second contact-level dielectric layer 282 by the anisotropic etch process.

Generally, at least one upper-level dielectric material layer such as the contact-level dielectric layers (280, 282) and optional additional line-level dielectric material layers and/or optional additional via-level dielectric material layers can be formed over the second insulating cap layer 270 and the second retro-stepped dielectric material portion 265. Various upper-level metal interconnect structures may be formed through the at least one upper-level dielectric material layer and the optional additional line-level dielectric material layers and the optional additional via-level dielectric material layers. Generally, a layer within the at least one upper-level dielectric material layer may be formed directly on a top surface of the at least one sacrificial connection via fill structure 138. The upper via cavities 289 can vertically extend through the at least one upper-level dielectric material layer over a respective one of the at least one sacrificial connection via fill structure 138. A top surface of a sacrificial connection via fill structure 138 can be physically exposed underneath each upper via cavity 289.

Figure 22:
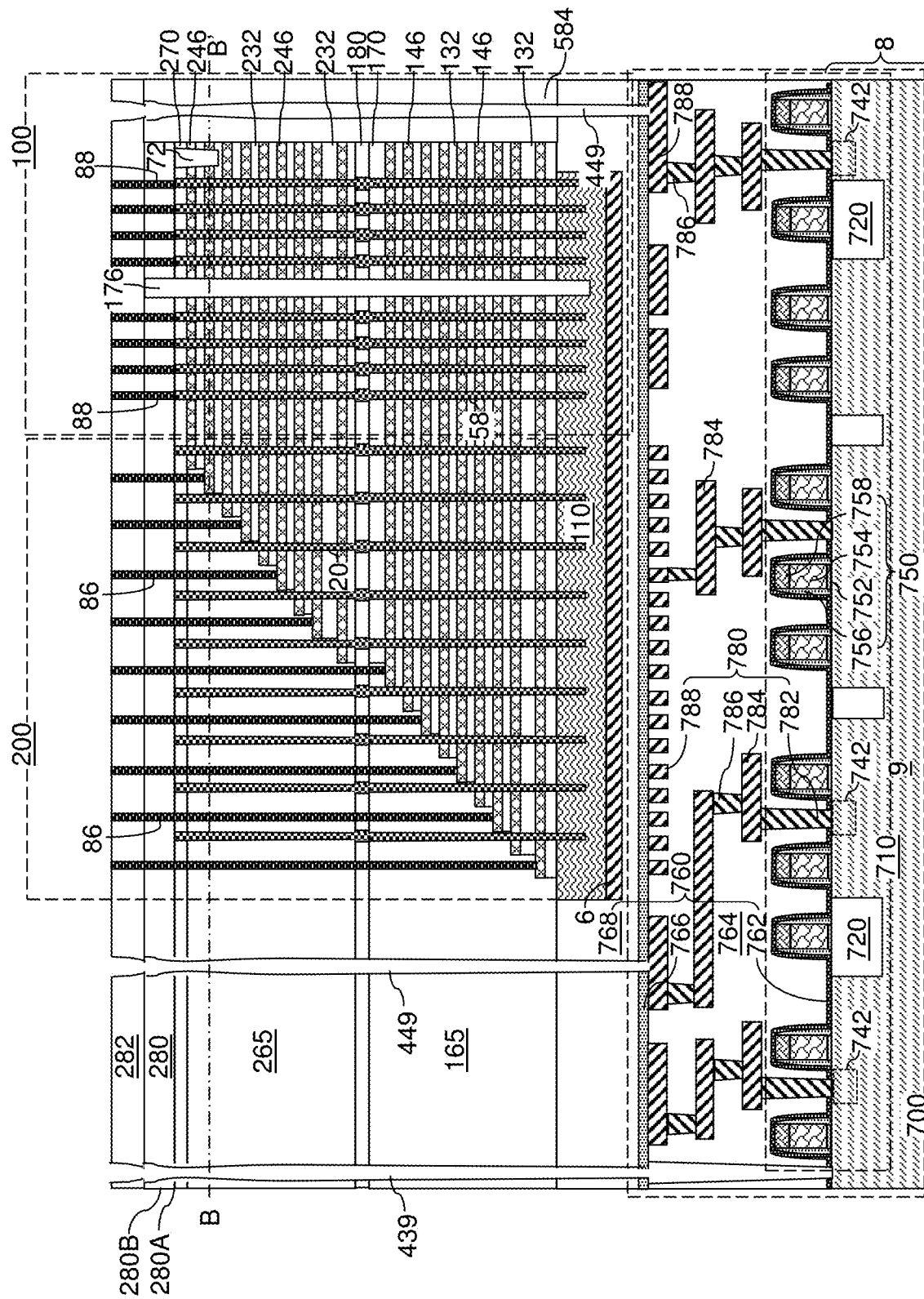
FIG. 22 is a vertical cross-sectional view of the exemplary structure after formation of interconnection via cavities according to an embodiment of the present disclosure.

Referring to FIG. 22, each sacrificial connection via fill structure 138 and each lower-level sacrificial via structure 38 can be removed by performing a selective etch process that etches the sacrificial materials of the sacrificial connection via fill structures 138 and the lower-level sacrificial via structures 38 selective to the dielectric materials around the sacrificial materials of the sacrificial connection via fill structures 138 and the lower-level sacrificial via structures 38. Interconnection via cavities (439, 449) are formed, each of which includes the volume of an upper via cavity 289, a void formed by removal of a sacrificial connection via fill structure 138, and optionally a void formed by removal of a lower-level sacrificial via structure 38.

The interconnection via cavities (439, 449) include first interconnection via cavities 439 that vertically extend to a respective conductive structure that is a node of a first semiconductor device 710, and second interconnection via cavities 449 that vertically extend to a respective conductive structure, such as a landing-pad-level metal line structure 788. Each first interconnection via cavity 439 includes a continuous void comprising volumes of a upper via cavity 289, a sacrificial connection via fill structure 138, and a lower-level sacrificial via structure 38.

FIGS. 23A-23E are sequential vertical cross-sectional views of a region around an interconnection via cavity during formation of an interconnection via structure 488 having a first configuration according to a first embodiment of the present disclosure.

Referring to FIG. 23A, an exemplary structure for forming a first configuration of the interconnection via structure 488 is illustrated. Generally, a conductive structure selected from a node of the at least one first semiconductor device 710 or one of the lower-level metal interconnect structures 780 can be physically exposed at a bottom of each interconnection via cavity (439, 449). The vertical cross-sectional profile of each interconnection via cavity (439, 449) may include at least one concave sidewall, at least one convex sidewall, and/or at least one tapered or vertical sidewall due to the many different anisotropic etch processes employed to form the respective sidewall segments of the interconnection via cavity (439, 449).

Referring to FIG. 23B, a transition metal layer 432 can be deposited by a conformal deposition process. According to an aspect of the present disclosure, the transition metal layer 432 can be deposited by decomposition of a metallic precursor gas including a transition metal element and at least one fluorine atom. Exemplary metallic precursor gas including a transition metal element and at least one fluorine atom include tungsten hexafluoride and molybdenum hexafluoride. In one embodiment, the deposition process that forms the transition metal layer 432 may include a chemical vapor deposition process. In one embodiment, the transition metal layer 432 may be composed primary of tungsten or molybdenum. As used herein, a structure is composed primary of an atomic element if the atomic percentage of the atomic element within the structure is more than 50%. Generally, the transition metal layer 432 can be formed by a conformal deposition process in which a metallic precursor gas including a fluoride of the transition metal element is decomposed to deposit the transition metal layer 432.

In one embodiment the transition metal layer 432 may include the transition metal element at an atomic percentage greater than 99.9% and/or greater than 99.99%. The transition metal layer 432 as deposited may include fluorine atoms at an atomic concentration in a range from 1 part per million to 1,000 parts per million, such as from 10 parts per million to 100 parts per million. A fluorinated surface layer 43F may be present on the physically exposed surface of the transition metal layer 432. In one embodiment, the thickness of the transition metal layer 432 can be selected such that a seam (i.e., void) vertically extends within the interconnection via cavity (439, 449) and that the interconnection via cavity (439, 449) is not pinched-off (i.e., closed off) at a pinch point (e.g., at its narrowest point). For example, the thickness of the transition metal layer 432 can be in a range from 10 nm to 600 nm, such as from 30 nm to 300 nm, although lesser and greater thicknesses may also be employed. It should be noted that FIG. 23B is not necessarily to scale and that the seam may be much narrower than the width (e.g., diameter) of the interconnection via cavity (439, 449).

Referring to FIG. 23C, the exemplary structure can be disposed under vacuum within a vacuum process chamber to perform a defluorination process. A hydride gas can be flowed into the process chamber to remove fluorine atoms from the transition metal layer 432. The hydride gas combines with the fluorine atoms in the fluorinated surface layer 43F on the surfaces of the transition metal layer 432. Exemplary hydride gases that may be employed for the defluorination process include silane, disilane, dichlorosilane, diborane, phosphine, arsine, and stibine. In one embodiment, the hydride gas may be a silicon-containing gas such as silane, disilane, or dichlorosilane. The defluorination process may be performed at an elevated temperature, which may be in a range from 100 degrees Celsius to 600 degrees Celsius. The partial pressure of the hydride gas during the defluorination process may be in a range from 0.1 mTorr to 1 Torr, such as from 1 mTorr to 100 mTorr, although lesser and greater partial pressures may also be employed.

Referring to FIG. 23D, a silicon layer 433 can be deposited within the interconnection via cavity (439, 449) on the transition metal layer 432. The silicon layer 433 can fill the seam within the interconnection via cavity (439, 449). The silicon layer 433 can be deposited by a conformal deposition process such as a chemical vapor deposition process. Without wishing to be bound by a specific theory, it is believed that the silicon-containing gas such as silane, disilane, or dichlorosilane decomposes to form the solid silicon layer 433 on the transition metal layer 432 and hydrogen gas. The hydrogen gas combines with the fluorine in the fluorinated surface layer 43F to form hydrofluoric acid (i.e., HF) vapor, which is removed from the seam by the vacuum system, since the seam is not pinched off at the top. This step removes all or at least part of the fluorinated surface layer 43F, and thus reduces or eliminates the fluorine located in the interconnection via cavity (439, 449).

Referring to FIG. 23E, an anneal is performed to generate a silicidation reaction between the silicon layer 433 and the transition metal layer 432. A metal silicide layer 434 is formed by silicidation of the transition metal layer 432. The metal silicide layer 434 causes partial consumption of the transition metal layer 432. The metal silicide layer 434 may comprise tungsten silicide or molybdenum silicide, for example.

According to an aspect of the present disclosure, the metal silicide layer 434 functions as a getter material portion that attracts the remaining the fluorine atoms from the transition metal layer 432 and/or remaining portion of the fluorinated surface layer 43F. In one embodiment, the metal silicide layer 434 may include fluorine atoms at a first atomic concentration in a range from 0.1 part per million to 100 parts per million. The transition metal layer 432 may include fluorine atoms at a second atomic concentration that is less than the first atomic concentration. The second atomic concentration may be in a range from 0.01 part per million to 10 parts per million. Thus, formation of the metal silicide layer 434 has the effect of reducing the fluorine concentration in the transition metal layer 432 by trapping the fluorine atoms within the metal silicide layer 434.

Regions of the transition metal layer 432 and the metal silicide layer 434 that overlie the horizontal plane including the top surface of the at least one upper-level dielectric material layer (such as the top surface of the second contact-level dielectric layer 282) can be removed by a planarization process such as a chemical mechanical polishing process. A remaining portion of the metal silicide layer 434 comprises a metal silicide portion, which is referred to as a fluorine-doped filler material portion 434. The fluorine-doped filler material portion 434 fills the entire seam (i.e., void) in the interconnection via cavity (439, 449).

Generally, an interconnection via structure 488 can be formed in each interconnection via cavity (439, 449). The interconnection via structure 488 comprises a transition metal layer 432 composed primarily of a transition metal element, such as tungsten, and vertically extending from a top surface of the interconnection via structure 488 to a conductive structure (which may be a node of a first semiconductor device 720 or one of the lower-level metal interconnect structures 780), and a fluorine-doped filler material portion 434 in contact with the transition metal layer 432, composed primarily of a filler material including a silicide of the transition metal element, and including fluorine atoms at a first average atomic concentration in a range from 0.1 part per million to 100 parts per million.

Figure 24:
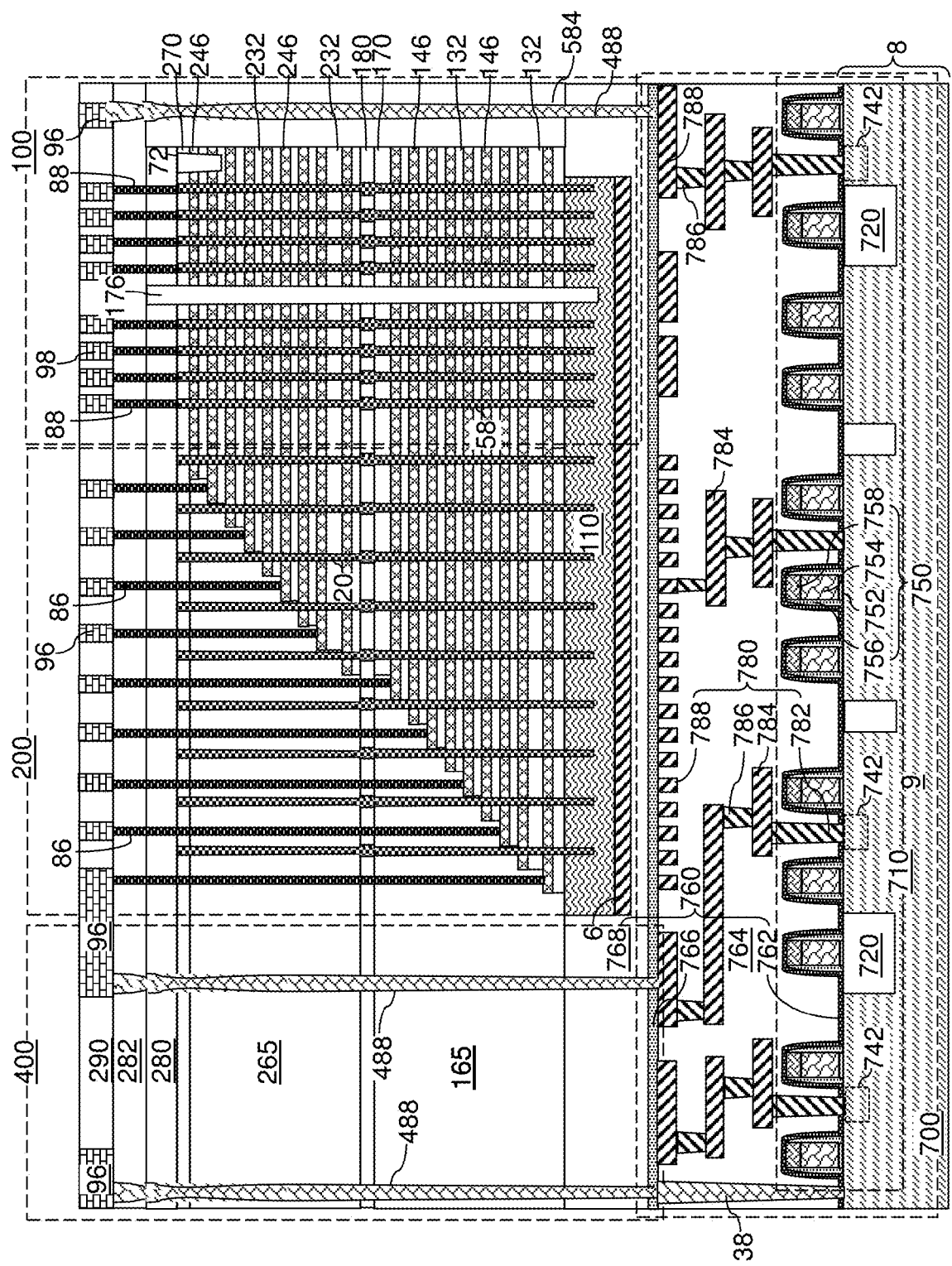
FIG. 24 is a vertical cross-sectional view of the exemplary structure after formation of upper-level metal line structures according to an embodiment of the present disclosure.

Referring to FIG. 24, at least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line and via structures 96 contacting, and/or electrically connected to, at least one of the staircase-region contact via structures 86 and/or the interconnection via structures 488. The word line contact via structures (which are provided as a subset of the staircase-region contact via structures 86) may be electrically connected to the word line driver circuit through a subset of the lower-level metal interconnect structures 780 and through a subset of the interconnection via structures 488.

In one embodiment, the metal lines and/or metal vias which form the interconnection line and via structures 96 may have a similar configuration to the interconnection via structures 488. In other words, the interconnection line and via structures 96 may include a fluorine-doped filler material portion 434 (or 454 as described below) in addition to a transition metal layer which is the same or different from the metal of the transition metal layer 432 described above.

In one embodiment, the three-dimensional memory device comprises a three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

FIGS. 25A-25C are sequential vertical cross-sectional views of a region around an interconnection via cavity during formation of an interconnection via structure 488 having a second configuration according to a second embodiment of the present disclosure.

Referring to FIG. 25A, an exemplary structure for forming the second configuration of the interconnection via structure 488 can be derived from the exemplary structure illustrated in FIG. 23D by reducing the thickness of the silicon layer 433 so that a seam (i.e., void) is present above the pinch point within the interconnection via cavity (439, 449).

Referring to FIG. 25B, silicidation reaction can be induced between the silicon layer 433 and the transition metal layer 432, for example, by performing a thermal anneal process. A metal silicide layer 434L can be formed. The metal silicide layer 434L can getter the fluorine atoms from the transition metal layer 432 as described above. The metal silicide layer 434L may optionally be etched back or planarized by CMP after formation.

Referring to FIG. 25C, a metallic material can be deposited within the void in the interconnection via cavity (439, 449). The metallic material may include, for example, W, Mo, Co, Ru, Ti, Ta, Cu, or alloys thereof. Regions of the metallic material, the metal silicide layer 434L, and the transition metal layer 432 can be removed from above the horizontal plane including the top surface of the at least one upper-level dielectric material layer (such as the top surface of the second contact-level dielectric layer 282). A remaining portion of the metal silicide layer 434L comprises a metal silicide portion, which functions as a fluorine-doped filler material portion 434. A remaining portion of the metallic material comprises a metallic material portion (i.e., a metal plug) 436. An interconnection via structure 488 can comprise a transition metal layer 432, a fluorine-doped filler material portion 434, and a metallic material portion 436. The fluorine-doped filler material portion 434 can be in contact with the transition metal layer 432, can be composed primarily of a filler material including a silicide of the transition metal element, and can include fluorine atoms at a first average atomic concentration in a range from 0.1 part per million to 100 parts per million.

FIGS. 26A-26I are sequential vertical cross-sectional views of a region around an interconnection via cavity during formation of an interconnection via structure having a third configuration according to a third embodiment of the present disclosure.

Referring to FIGS. 26A-26E, the processing steps of FIGS. 23A-23E can be performed with reduction in the thickness of at least one material layer to form a layer stack including a transition metal layer 432 (which is referred to as an outer transition metal layer 432 or as a first transition metal layer in this embodiment) and a metal silicide layer 434L (which is referred to as an outer metal silicide layer 434L or as a first metal silicide layer in this embodiment).

Referring to FIG. 26F, an inner transition metal layer 446 can be formed by conformal decomposition of a metallic precursor gas including a transition metal element and at least one fluorine atom. The metallic precursor gas employed to deposit the inner transition metal layer 446 may be the same as, or may be different from, the metallic precursor gas employed to deposit the outer transition metal layer 432. In one embodiment, the inner transition metal layer 446 may be composed primary of tungsten or molybdenum. Generally, the inner transition metal layer 446 can be formed by a conformal deposition process in which a metallic precursor gas including a fluoride of the transition metal element is decomposed to deposit the inner transition metal layer 446.

In one embodiment the inner transition metal layer 446 may include the transition metal element at an atomic percentage greater than 99.9% and/or greater than 99.99%. The inner transition metal layer 446 as deposited may include fluorine atoms at an atomic concentration in a range from 1 part per million to 1,000 parts per million, such as from 10 parts per million to 100 parts per million. A fluorinated surface layer 43F may be present on the physically exposed surface of the inner transition metal layer 446. The thickness of the inner transition metal layer 446 can be selected such that a seam vertically extends within the interconnection via cavity (439, 449) after formation of the inner transition metal layer 446 and that the seam is not pinched off at the pinch point. For example, the thickness of the transition metal layer 432 can be in a range from 10 nm to 300 nm, such as from 30 nm to 150 nm, although lesser and greater thicknesses may also be employed.

Referring to FIG. 26G, the processing steps of FIG. 23C may be repeated to defluorinate the surface of the inner transition metal layer 446.

Referring to FIG. 26H, an inner silicon layer 437 (also referred to as a second silicon layer) can be deposited within the interconnection via cavity (439, 449) on the inner transition metal layer 446. The inner silicon layer 437 can fill the seam within the interconnection via cavity (439, 449). The inner silicon layer 437 can be deposited by a conformal deposition process such as a chemical vapor deposition process.

Referring to FIG. 26I, a silicidation reaction can be induced between the inner silicon layer 437 and the inner transition metal layer 446. An inner metal silicide layer can be formed by silicidation of the inner silicon layer 437. According to an aspect of the present disclosure, the inner metal silicide layer functions as a getter material portion that attracts the fluorine atoms from the inner transition metal layer 446. In one embodiment, the inner metal silicide layer may include fluorine atoms at an atomic concentration in a range from 0.1 part per million to 100 parts per million. The inner transition metal layer 446 may include fluorine atoms at an atomic concentration that is less than the atomic concentration of fluorine in the inner transition metal layer 446. The atomic concentration of fluorine in the inner transition metal layer 446 may be in a range from 0.01 part per million to 10 parts per million. Thus, formation of the inner metal silicide layer has the effect of reducing the fluorine concentration in the inner transition metal layer 446 by trapping the fluorine atoms within the metal silicide layer.

Regions of the inner metal silicide layer, the inner transition metal layer 446, the outer metal silicide layer 434L, and the outer transition metal layer 432 that overlie the horizontal plane including the top surface of the at least one upper-level dielectric material layer (such as the top surface of the second contact-level dielectric layer 282) can be removed by a planarization process such as a chemical mechanical polishing process. A remaining portion of the outer metal silicide layer 434L comprises an outer metal silicide portion, which functions as a first fluorine-doped filler material portion 434. A remaining portion of the inner metal silicide layer comprises an inner metal silicide portion, which functions as a second fluorine-doped filler material portion 438.

An interconnection via structure 488 can be formed in each interconnection via cavity (439, 449). In one embodiment, the interconnection via structure 488 comprises an outer transition metal layer 432 composed primarily of a first transition metal element and vertically extending from a top surface of the interconnection via structure 488 to a conductive structure (which may be a node of a first semiconductor device 720 or one of the lower-level metal interconnect structures 780), and a first fluorine-doped filler material portion 434 in contact with the outer transition metal layer 432, composed primarily of a filler material including a silicide of the first transition metal element, and including fluorine atoms at a first average atomic concentration in a range from 0.1 part per million to 100 parts per million. The interconnection via structure 488 may further comprise an inner transition metal layer 446 composed primarily of a second transition metal element (which may be the same as, or may be different from, the first transition metal element), and a second fluorine-doped filler material portion 438 in contact with the inner transition metal layer 446, composed primarily of a filler material including a silicide of the second transition metal element, and including fluorine atoms at an average atomic concentration (which may be in a range from 0.1 part per million to 100 parts per million) that is greater than the average atomic concentration of fluorine in the inner transition metal layer 446 (which may be in a range from 0.01 part per million to 10 parts per million).

FIGS. 27A-27E are sequential vertical cross-sectional views of a region around an interconnection via cavity during formation of an interconnection via structure having a fourth configuration according to a fourth embodiment of the present disclosure.

Referring to FIGS. 27A and 27B, the processing steps of FIGS. 26A-26G can be performed to provide the exemplary structure illustrated in FIG. 27B.

Referring to FIG. 27C, the processing steps of FIG. 26H can be performed. The thickness of the inner silicon layer 437 may be reduced, or an etch back process that partially etches the material of the inner silicon layer 437 may be performed after deposition of the inner silicon layer 437 so that a void 447 is formed in an upper portion of the connection via cavity (439, 449) that overlies the top surface of the second retro-stepped dielectric material portion 265.

Referring to FIG. 27D, a second fluorine-doped filler material portion 438 including a metal silicide of the metal within the inner transition metal layer 446 can be formed by inducing silicidation of a surface portion of the inner transition metal layer 446. Thus, formation of the second fluorine-doped filler material portion 438 has the effect of reducing the fluorine concentration in the inner transition metal layer 446 by trapping the fluorine atoms within the second fluorine-doped filler material portion 438.

Referring to FIG. 27E, a metallic material can be deposited within the void 447 in the interconnection via cavity (439, 449). The metallic material may include, for example, W, Mo, Co, Ru, Ti, Ta, Cu, or alloys thereof.

Regions of the metallic material, the second fluorine-doped filler material portion 438, the inner transition metal layer 446, the outer metal silicide layer 434L, and the outer transition metal layer 432 that overlie the horizontal plane including the top surface of the at least one upper-level dielectric material layer (such as the top surface of the second contact-level dielectric layer 282) can be removed by a planarization process such as a chemical mechanical polishing process. A remaining portion of the outer metal silicide layer 434L comprises an outer metal silicide portion, which functions as a first fluorine-doped filler material portion 434. A remaining portion of the metallic material comprises a metallic material portion (e.g., metal plug) 436.

In other embodiments, an insulating material having a non-zero porosity, such as an aluminum oxide may be employed instead of a metal silicide to getter fluorine atoms from transition metal layers, thereby improving the reliability of the transition metal layers.

FIGS. 28A-28D are sequential vertical cross-sectional views of a region around an interconnection via cavity during formation of an interconnection via structure 488 having a fifth configuration according to a fifth embodiment of the present disclosure.

Referring to FIG. 28A, an exemplary structure for forming the fifth configuration of the interconnection via structure 488 can be the same as the exemplary structure of FIG. 23A.

Referring to FIG. 28B, the processing steps of FIG. 23B can be performed to form a transition metal layer 432.

Referring to FIG. 28C, aluminum oxide can be deposited in the void within the connection via cavity (439, 449) by a conformal deposition process to form an aluminum oxide layer 454L. The aluminum oxide layer 454L can be formed as a continuous structure including vertically extending portions that fill the voids of each connection via cavity (439, 449). The conformal deposition process may include a chemical vapor deposition process or an atomic layer deposition process. The aluminum oxide layer 454L may comprise a porous layer containing pores which trap fluorine.

A thermal anneal can be performed to diffuse residual fluorine atoms within the transition metal layer 432 and/or in the fluorinated surface layer 43F into the aluminum oxide layer 454L. The aluminum oxide layer 454L includes fluorine-doped filler material portions that comprise aluminum oxide portions as doped with fluorine atoms (which diffuse into the pores in aluminum oxide portion from the transition metal layer 432). The aluminum oxide layer 454L traps the fluorine and prevents or reduces fluorine outgassing during a subsequent anneal.

Referring to FIG. 28D, portions of the aluminum oxide layer 454L and the transition metal layer 432 that overlie the horizontal plane including the top surface of the at least one upper-level dielectric material layer (such as the top surface of the second contact-level dielectric layer 282) can be removed by a planarization process, such as an etch back or a chemical mechanical polishing process. Each remaining portion of the aluminum oxide layer 454L comprises a fluorine-doped filler material portion 454 that comprises aluminum oxide as doped with fluorine atoms from the transition metal layer 432.

Generally, an interconnection via structure 488 can be formed in each interconnection via cavity (439, 449). The interconnection via structure 488 comprises a transition metal layer 432 composed primarily of a transition metal element and vertically extending from a top surface of the interconnection via structure 488 to a conductive structure (which may be a node of a first semiconductor device 720 or one of the lower-level metal interconnect structures 780), and a fluorine-doped filler material portion 454 in contact with the transition metal layer 432, composed primarily of a filler material including aluminum oxide, and including fluorine atoms at a first average atomic concentration in a range from 0.1 part per million to 100 parts per million. The transition metal layer 432 may include fluorine atoms at a second atomic concentration that is less than the first atomic concentration. The second atomic concentration may be in a range from 0.01 part per million to 10 parts per million.

FIGS. 29A-29C are sequential vertical cross-sectional views of a region around an interconnection via cavity during formation of an interconnection via structure 488 having a sixth configuration according to a sixth embodiment of the present disclosure.

Referring to FIG. 29A, an exemplary structure for forming the sixth configuration of the interconnection via structure 488 can be derived from the exemplary structure illustrated in FIG. 28C by reducing the thickness of the aluminum oxide layer 454L. Specifically, the thickness of the aluminum oxide layer 454L can be reduced such that a void 447 is present in an upper portion of the interconnection via cavity (439, 449).

Referring to FIG. 29B, at least one planarization (e.g., etch back or CMP) process may be performed to remove portions of the aluminum oxide layer 454L and the transition metal layer 432 from above the horizontal plane including the top surface of the at least one upper-level dielectric layer (such as the top surface of the second contact-level dielectric layer 282). The remaining portion of the aluminum oxide layer 454L can comprise a fluorine-doped filler material portion 454. Optionally, an anneal process may be performed to increase the gettering effect of the fluorine-doped filler material portion 454 for the fluorine atoms from the transition metal layer 432.

Referring to FIG. 29C, a metallic material can be deposited within the void in the interconnection via cavity (439, 449). The metallic material may include, for example, W, Mo, Co, Ru, Ti, Ta, Cu, or alloys thereof. Portions of the metallic material overlying the horizontal plane including the top surface of the at least one upper-level dielectric material layer (such as the top surface of the second contact-level dielectric layer 282) can be removed by a planarization process, which may employ a recess etch process and/or a chemical mechanical polishing process. A remaining portion of the metallic material comprises a metallic material portion (e.g., metal plug) 436. An interconnection via structure 488 can comprise a transition metal layer 432, a fluorine-doped filler material portion 454, and a metallic material portion 436. The fluorine-doped filler material portion 454 can be in contact with the transition metal layer 432, can be composed primarily of a filler material including aluminum oxide, and can include fluorine atoms at a first average atomic concentration in a range from 0.1 part per million to 100 parts per million.

FIGS. 30A-30E are sequential vertical cross-sectional views of a region around an interconnection via cavity during formation of an interconnection via structure having a seventh configuration according to a seventh embodiment of the present disclosure.

Referring to FIG. 30A, an exemplary structure for forming the seventh configuration of the exemplary structure can be the same as the exemplary structure illustrated in FIG. 23A.

Referring to FIG. 30B, an aluminum oxide layer 454L can be formed by conformal deposition of an aluminum oxide material. For example, an atomic layer deposition process or a chemical vapor deposition process may be employed to deposit the aluminum oxide layer 454L. The thickness of the aluminum oxide layer 454L may be less than one half of the width of the connection via cavity (439, 449) at the bottommost portion of the connection via cavity (439, 449). The aluminum oxide layer 454L may comprise a porous layer containing pores which trap fluorine.

Referring to FIG. 30C, an anisotropic etch process can be performed to remove the horizontal bottom portion of the aluminum oxide layer 454L at the bottom of each of the connection via cavities (439, 449). A top surface of an underlying conductive structure can be physically exposed at the bottom of each connection via cavity (439, 449). The underlying conductive structure may be a node of a first semiconductor device 710, or may be one of the lower-level metal interconnect structures 780. Generally, an aluminum oxide portion can be formed within each interconnection via cavity prior to formation of the transition metal layer 432 (e.g., as in the fifth and sixth embodiments), or after formation of the transition metal layer 432 (e.g., as in the seventh embodiment).

Referring to FIG. 30D, the processing steps of FIG. 23B can be performed to form a transition metal layer 432. In this case, the thickness of the transition metal layer 432 can be selected such that at least an upper portion of the connection via cavity (439, 449) is filled with the combination of the aluminum oxide layer 454 and the transition metal layer 432, thus pinching off the connection via cavity (439, 449) at the pinch point. In some embodiments, a seam (i.e., a vertically-extending encapsulated cavity that is free of any solid phase material) can be formed within a connection via cavity (439, 449) upon deposition of the transition metal layer 432. Fluorine atoms in the transition metal layer 432 may diffuse outward into the aluminum oxide layer 454L. An anneal process can increase the diffusion rate of the fluorine atoms from the transition metal layer 432 into the aluminum oxide layer 454L.

Referring to FIG. 30E, portions of the aluminum oxide layer 454L and the transition metal layer 432 that overlie the horizontal plane including the top surface of the at least one upper-level dielectric material layer (such as the top surface of the second contact-level dielectric layer 282) can be removed by a planarization process, such as a chemical mechanical polishing process. Each remaining portion of the aluminum oxide layer 454L comprises a fluorine-doped filler material portion 454 that comprises aluminum oxide as doped with fluorine atoms from the transition metal layer 432.

Generally, an interconnection via structure 488 can be formed in each interconnection via cavity (439, 449). The interconnection via structure 488 comprises a transition metal layer 432 composed primarily of a transition metal element and vertically extending from a top surface of the interconnection via structure 488 to a conductive structure (which may be a node of a first semiconductor device 720 or one of the lower-level metal interconnect structures 780), and a fluorine-doped filler material portion 454 in contact with the transition metal layer 432, composed primarily of a filler material including aluminum oxide, and including fluorine atoms at a first average atomic concentration in a range from 0.1 part per million to 100 parts per million. The transition metal layer 432 may include fluorine atoms at a second atomic concentration that is less than the first atomic concentration. The second atomic concentration may be in a range from 0.01 part per million to 10 parts per million.

While the present disclosure has been described employing embodiments in which an interconnection via structure 488 includes either a fluorine-doped filler material portion (434, 438) composed of a metal silicide material or a fluorine-doped filler material portion 454 composed of aluminum oxide, other embodiments are expressly contemplated herein in which other conductive or porous insulating materials are used, and/or where one or more of the fluorine-doped filler material portions (434, 438) are replaced with a respective fluorine-doped filler material portions 454, or vice versa. Generally, an interconnection via structure 488 may include at least one fluorine-doped filler material portion (434, 438) containing at least one metal silicide material, may include at least one fluorine-doped filler material portion 454 containing at least one aluminum oxide portion, or may include a combination of at least one fluorine-doped filler material portion (434, 438) containing at least one metal silicide material and at least one fluorine-doped filler material portion 454 containing at least one aluminum oxide portion.

Referring to all drawings and according to various embodiments of the present disclosure, a semiconductor structure comprises at least one first semiconductor device 710 located over a substrate 8; lower-level dielectric material layers 760 overlying the at least one first semiconductor device 710 and embedding lower-level metal interconnect structures 760; at least one second semiconductor device (such as a three-dimensional memory device containing an array of memory elements) and a dielectric material portion (such as retro-stepped dielectric material portions (165, 265) and/or an interconnection region dielectric fill material portion 584) that overlie the lower-level dielectric material layers 760; at least one upper-level dielectric material layer (280, 282) embedding upper-level metal interconnect structures (88, 86) and overlying the at least one second semiconductor device; and an interconnection via structure 488 vertically extending through the at least one upper-level dielectric material layer (280, 282), the dielectric material portion (165, 265), and at least an upper portion of the lower-level dielectric material layers 760 and contacting a conductive structure selected from a node of the at least one first semiconductor device 710 or one of the lower-level metal interconnect structures 760. The interconnection via structure 488 comprises a transition metal layer 432 composed primarily of a transition metal element and vertically extending from a top surface of the interconnection via structure 488 to the conductive structure; and a fluorine-doped filler material portion (434, 454) in contact with the transition metal layer 432, and including fluorine atoms at a first average atomic concentration in a range from 0.1 part per million to 100 parts per million.

In one embodiment, the transition metal layer 432 includes the transition metal element at an atomic percentage greater than 99.9%. In one embodiment, transition metal element is selected from W and Mo.

In one embodiment, the transition metal layer 432 includes fluorine atoms at a second average atomic concentration that is less than the first average atomic concentration and is in a range from 0.01 part per million to 10 parts per million.

In one embodiment, the transition metal layer 432 is in direct contact with sidewalls of the lower-level dielectric material layers 760, a sidewall of the dielectric material portion (165, 265), and at least one sidewall of the at least one upper-level dielectric material layer (280, 282). In one embodiment, the fluorine-doped filler material portion (434, 454) contacts an inner sidewall of the transition metal layer 432 and is vertically spaced from the conductive structure by a bottom portion of the transition metal layer 432.

In one embodiment, the interconnection via structure 488 comprises a metal portion (e.g., plug) 436 laterally surrounded by the fluorine-doped filler material portion (434, 454), having a top surface located within a same horizontal plane as the transition metal layer 432, and have a bottommost surface above a horizontal plane including a topmost surface of the lower-level dielectric material layers 760.

In one embodiment, the interconnection via structure 488 comprises: an inner transition metal layer 446 contacting an inner sidewall of, and laterally surrounded by, the fluorine-doped filler material portion (434, 454); and an inner fluorine-doped filler material portion 438 contacting an inner sidewall of, and laterally surrounded by, the inner transition metal layer 446. In one embodiment, an average atomic concentration of fluorine within the inner transition metal layer 446 is lower than an average atomic concentration of fluorine within the inner fluorine-doped filler material portion 438.

In some embodiments, the fluorine-doped filler material portion is composed primarily (i.e., more than 50 atomic percent) of a filler material selected from a silicide of the transition metal element or aluminum oxide.

In the fifth through seventh embodiments, the fluorine-doped filler material portion 454 comprises the aluminum oxide at a molecular percentage greater than 99%. In other words, the sum of the atomic percentage of aluminum atoms and the atomic percentage of oxygen atoms may be greater than 99%.

In the seventh embodiment, the fluorine-doped filler material portion 454 is in direct contact with sidewalls of the lower-level dielectric material layers 760, a sidewall of the dielectric material portion (265, 265), and at least one sidewall of the at least one upper-level dielectric material layer (280, 282).

In the first through fourth embodiments, the fluorine-doped filler material portion 434 comprises the silicide of the transition metal element of the transition metal layer (e.g., W or Mo).

In one embodiment, outer surfaces of the interconnection via structure 488 are in direct contact with each of the lower-level dielectric material layers 760, the dielectric material portion (165, 265), and the at least one upper-level dielectric material layer (280, 282): and the outer surfaces of the interconnection via structure 488 comprise: a convex surface that laterally protrudes outward from the interconnection via structure 488 in a vertical cross-sectional view; a concave surface that is laterally recessed inward in the vertical cross-sectional view; and a horizontal surface that adjoins an overlying sidewall of the interconnection via structure 488 in the vertical cross-sectional view (such as a horizontal surface containing a topmost surface of a sacrificial connection via fill structure 138 or a topmost surface of lower-level sacrificial via structure 38).

In one embodiment, the at least one first semiconductor device 710 comprises field effect transistors; the at least one second semiconductor device comprises a three-dimensional array of memory elements electrically connected to nodes of the field effect transistors; and the interconnection via structure 488 contacts a source region, a drain region, or a gate electrode of one of the field effect transistors.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
   at least one first semiconductor device located over a substrate;
   lower-level dielectric material layers overlying the at least one first semiconductor device and embedding lower-level metal interconnect structures;
   at least one second semiconductor device and a dielectric material portion that overlie the lower-level dielectric material layers;
   at least one upper-level dielectric material layer embedding upper-level metal interconnect structures and overlying the at least one second semiconductor device; and
   an interconnection via structure vertically extending through the at least one upper-level dielectric material layer, the dielectric material portion, and at least an upper portion of the lower-level dielectric material layers and contacting a conductive structure selected from a node of the at least one first semiconductor device or one of the lower-level metal interconnect structures, wherein the interconnection via structure comprises:
   a transition metal layer composed primarily of a transition metal element and vertically extending from a top surface of the interconnection via structure to the conductive structure; and
   a fluorine-doped filler material portion in contact with the transition metal layer, and including fluorine atoms at a first average atomic concentration in a range from 0.1 part per million to 100 parts per million.

2. The semiconductor structure of claim 1, wherein the transition metal layer includes the transition metal element at an atomic percentage greater than 99.9%, and wherein the transition metal element is selected from W or Mo.

3. The semiconductor structure of claim 1, wherein the transition metal layer includes fluorine atoms at a second average atomic concentration that is less than the first average atomic concentration and is in a range from 0.01 part per million to 10 parts per million.

4. The semiconductor structure of claim 1, wherein the transition metal layer is in direct contact with sidewalls of the lower-level dielectric material layers, a sidewall of the dielectric material portion, and at least one sidewall of the at least one upper-level dielectric material layer.

5. The semiconductor structure of claim 4, wherein the fluorine-doped filler material portion contacts an inner sidewall of the transition metal layer and is vertically spaced from the conductive structure by a bottom portion of the transition metal layer.

6. The semiconductor structure of claim 1, wherein the interconnection via structure comprises a metal plug laterally surrounded by the fluorine-doped filler material portion, having a top surface located within a same horizontal plane as the transition metal layer, and have a bottommost surface above a horizontal plane including a topmost surface of the lower-level dielectric material layers.

7. The semiconductor structure of claim 1, wherein the interconnection via structure further comprises:
an inner transition metal layer contacting an inner sidewall of and laterally surrounded by the fluorine-doped filler material portion; and
an inner fluorine-doped filler material portion contacting an inner sidewall of and laterally surrounded by, the inner transition metal layer.

8. The semiconductor structure of claim 7, wherein an average atomic concentration of fluorine within the inner transition metal layer is lower than an average atomic concentration of fluorine within the inner fluorine-doped filler material portion.

9. The semiconductor structure of claim 1, wherein the fluorine-doped filler material portion is composed primarily of a filler material selected from a silicide of the transition metal element or aluminum oxide.

10. The semiconductor structure of claim 9, wherein the fluorine-doped filler material portion comprises the aluminum oxide at a molecular percentage greater than 99%.

11. The semiconductor structure of claim 9, wherein the fluorine-doped filler material portion comprises the silicide of the transition metal element of the transition metal layer, and wherein the transition metal element is selected from W or Mo.

12. The semiconductor structure of claim 1, wherein:
outer surfaces of the interconnection via structure are in direct contact with each of the lower-level dielectric material layers, the dielectric material portion, and the at least one upper-level dielectric material layer: and
the outer surfaces of the interconnection via structure comprise:
a convex surface that laterally protrudes outward from the interconnection via structure in a vertical cross-sectional view;
a concave surface that is laterally recessed inward in the vertical cross-sectional view; and
a horizontal surface that adjoins an overlying sidewall of the interconnection via structure in the vertical cross-sectional view.

13. The semiconductor structure of claim 1, wherein:
the at least one first semiconductor device comprises field effect transistors;
the at least one second semiconductor device comprises a three-dimensional array of memory elements electrically connected to nodes of the field effect transistors; and
the interconnection via structure contacts a source region, a drain region, or a gate electrode of one of the field effect transistors.

14. A semiconductor structure, comprising:
at least one first semiconductor device located over a substrate;
lower-level dielectric material layers overlying the at least one first semiconductor device and embedding lower-level metal interconnect structures;
at least one second semiconductor device and a dielectric material portion that overlie the lower-level dielectric material layers;
at least one upper-level dielectric material layer embedding upper-level metal interconnect structures and overlying the at least one second semiconductor device; and
an interconnection via structure vertically extending through the at least one upper-level dielectric material layer, the dielectric material portion, and at least an upper portion of the lower-level dielectric material layers and contacting a conductive structure selected from a node of the at least one first semiconductor device or one of the lower-level metal interconnect structures, wherein the interconnection via structure comprises:
a transition metal layer composed primarily of a transition metal element and vertically extending from a top surface of the interconnection via structure to the conductive structure; and a filler material portion in contact with the transition metal layer, wherein the filler material portion is composed primarily of a filler material selected from a silicide of the transition metal element or aluminum oxide.

15. The semiconductor structure of claim 14, wherein the filler material portion comprises the aluminum oxide at a molecular percentage greater than 99%.

16. The semiconductor structure of claim 15, wherein the filler material portion comprises the silicide of the transition metal element of the transition metal layer.

17. A method of forming a semiconductor structure, comprising:
forming at least one first semiconductor device over a substrate;
forming lower-level dielectric material layers embedding lower-level metal interconnect structures over the at least one first semiconductor device;
forming at least one second semiconductor device and a dielectric material portion over the dielectric material layers;
forming at least one upper-level dielectric material layer embedding upper-level metal interconnect structures over the at least one second semiconductor device;
forming an interconnection via cavity through the at least one upper-level dielectric material layer, the dielectric material portion, and at least an upper portion of the lower-level dielectric material layers, wherein a conductive structure selected from a node of the at least one first semiconductor device or one of the lower-level metal interconnect structures is physically exposed at a bottom of the interconnection via cavity; and
forming an interconnection via structure in the interconnection via cavity, wherein the interconnection via structure comprises:
a transition metal layer composed primarily of a transition metal element and vertically extending from a top surface of the interconnection via structure to the conductive structure; and a fluorine-doped filler material portion in contact with the transition metal layer, composed primarily of a filler material selected from a silicide of the transition metal element or aluminum oxide, and including fluorine atoms at a first average atomic concentration in a range from 0.1 part per million to 100 parts per million.

18. The method of claim 17, further comprising:

forming a lower-level sacrificial via structure through the lower-level dielectric material layers directly on the conductive structure;

forming a sacrificial connection via fill structure through the dielectric material portion directly on a top surface of the at least one lower-level sacrificial via structure;

forming an upper via cavity through a layer within the at least one upper-level dielectric material layer directly on a top surface of the at least one sacrificial connection via fill structure; and removing the at least one sacrificial connection via fill structure and the at least one lower-level sacrificial via structure from underneath the upper via cavity, wherein a continuous void comprising volumes of the upper via cavity, the sacrificial connection via fill structure, and the lower-level sacrificial via structure comprises the interconnection via cavity.

19. The method of claim 17, further comprising:

depositing a silicon layer within the interconnection via cavity on the transition metal layer; and inducing a silicidation reaction between the silicon layer and the transition metal layer, wherein a metal silicide layer formed by silicidation of the silicon layer comprises the fluorine-doped filler material portion, wherein:

the transition metal layer includes the transition metal element at an atomic percentage greater than 99.9%; and the transition metal layer is formed by a conformal deposition process in which a metallic precursor gas including a fluoride of the transition metal element is decomposed to deposit the transition metal layer.

20. The method of claim 17, further comprising:

forming an aluminum oxide portion within the interconnection via cavity prior to, or after, formation of the transition metal layer; and diffusing residual fluorine atoms within the transition metal layer into the aluminum oxide portion, wherein the fluorine-doped filler material portion comprises the aluminum oxide portion doped with fluorine atoms that diffuse into the aluminum oxide portion.

* * * * *